United States Patent
Kawai et al.

(10) Patent No.: US 8,902,629 B2
(45) Date of Patent: Dec. 2, 2014

(54) FORMING METHOD OF PERFORMING FORMING ON VARIABLE RESISTANCE NONVOLATILE MEMORY ELEMENT, AND VARIABLE RESISTANCE NONVOLATILE MEMORY DEVCE

(75) Inventors: Ken Kawai, Osaka (JP); Kazuhiko Shimakawa, Osaka (JP); Koji Katayama, Nara (JP); Shunsaku Muraoka, Osaka (JP)

(73) Assignee: Panasonic Corporation, Osaka (JP)

( * ) Notice: Subject to any disclaimer, the term of this patent is extended or adjusted under 35 U.S.C. 154(b) by 389 days.

(21) Appl. No.: 13/511,275

(22) PCT Filed: Sep. 28, 2011

(86) PCT No.: PCT/JP2011/005462
§ 371 (c)(1),
(2), (4) Date: May 22, 2012

(87) PCT Pub. No.: WO2012/042866
PCT Pub. Date: Apr. 5, 2012

(65) Prior Publication Data
US 2012/0230085 A1    Sep. 13, 2012

(30) Foreign Application Priority Data

Sep. 28, 2010   (JP) .................................. 2010-216353

(51) Int. Cl.
*G11C 11/00*   (2006.01)
*H01L 45/00*   (2006.01)
(Continued)

(52) U.S. Cl.
CPC .......... *H01L 27/101* (2013.01); *G11C 2213/72* (2013.01); *H01L 45/1233* (2013.01); *G11C*
(Continued)

(58) Field of Classification Search
USPC ........ 365/46, 94, 100, 129, 148; 257/E21.35; 438/135
See application file for complete search history.

(56) References Cited

U.S. PATENT DOCUMENTS

| 7,369,431 B2 | 5/2008 | Muraoka et al. |
| 7,558,099 B2 | 7/2009 | Morimoto |

(Continued)

FOREIGN PATENT DOCUMENTS

| JP | 2006-351780 | 12/2006 |
| JP | 2007-004873 | 1/2007 |

(Continued)

OTHER PUBLICATIONS

International Search Report issued Dec. 20, 2011 in International (PCT) Application No. PCT/JP2011/005462.

(Continued)

*Primary Examiner* — Harry W Byrne
(74) *Attorney, Agent, or Firm* — Wenderoth, Lind & Ponack, L.L.P.

(57) ABSTRACT

In forming, an automatic forming circuit (210) included in a nonvolatile memory device (200) causes a constant current IL to flow in a selected memory cell having a considerably high initial resistance. When the forming generates a filament path in the memory cell and thereby a resistance value is decreased, a potential of a node NBL and a potential of a node Nin are also decreased. If the potentials become lower than that of a reference voltage Vref, an output NO of a difference amplifier (303) for detecting forming success is activated, and a forming success signal Vfp is activated after a delay time depending on the number n of flip flops FF1 to FFn and a clock signal CLK. Thereby, a switch transistor (301) is in a non-conducting state and the forming on a variable resistance element is automatically terminated.

21 Claims, 38 Drawing Sheets

(51) Int. Cl.
*H01L 27/10* (2006.01)
*H01L 27/24* (2006.01)
*G11C 13/00* (2006.01)

(52) U.S. Cl.
CPC .............. *2013/0073* (2013.01); *G11C 2213/32* (2013.01); *H01L 45/146* (2013.01); *G11C 13/0064* (2013.01); *G11C 2213/79* (2013.01); *H01L 45/08* (2013.01); *G11C 13/0007* (2013.01); *G11C 2013/0083* (2013.01); *G11C 13/0069* (2013.01); *H01L 27/2409* (2013.01)
USPC ........................................................ 365/148

(56) References Cited

U.S. PATENT DOCUMENTS

| 7,826,247 | B2 | 11/2010 | Muraoka et al. | |
|---|---|---|---|---|
| 8,022,502 | B2 | 9/2011 | Kanzawa et al. | |
| 2007/0115714 | A1 | 5/2007 | Muraoka et al. | |
| 2007/0195581 | A1 | 8/2007 | Morimoto | |
| 2008/0259678 | A1 | 10/2008 | Muraoka et al. | |
| 2009/0283736 | A1 | 11/2009 | Kanzawa et al. | |
| 2010/0207094 | A1 | 8/2010 | Kanzawa et al. | |
| 2011/0031465 | A1* | 2/2011 | Mitani et al. ....................... 257/4 | |
| 2011/0044088 | A1 | 2/2011 | Muraoka et al. | |
| 2011/0110143 | A1* | 5/2011 | Kanzawa et al. ............. 365/148 | |
| 2011/0110144 | A1* | 5/2011 | Kawai et al. .................. 365/148 | |
| 2011/0216577 | A1* | 9/2011 | Tomotani et al. ............. 365/148 | |
| 2011/0233510 | A1* | 9/2011 | Kanzawa et al. .................. 257/4 | |
| 2011/0294259 | A1 | 12/2011 | Kanzawa et al. | |
| 2012/0091425 | A1* | 4/2012 | Kawashima et al. ............. 257/4 | |
| 2012/0120712 | A1* | 5/2012 | Kawai et al. .................... 365/148 | |
| 2012/0199805 | A1* | 8/2012 | Sorada et al. ...................... 257/2 | |

FOREIGN PATENT DOCUMENTS

| JP | 2007-188559 | 7/2007 |
|---|---|---|
| JP | 2007-226883 | 9/2007 |
| JP | 2008-210441 | 9/2008 |
| WO | 2005/059921 | 6/2005 |
| WO | 2008/149484 | 12/2008 |
| WO | 2009/050833 | 4/2009 |
| WO | 2010/021134 | 2/2010 |

OTHER PUBLICATIONS

I. G. Baek et al., "Highly Scalable Non-Volatile Resistive Memory Using Simple Binary Oxide Driven by Asymmetric Unipolar Voltage Pulses", Electron Devices Meeting (2004), IEDM Technical Digest, IEEE International, p. 587 (Fig. 5(b)).

* cited by examiner

FIG. 29

| Operation Mode \ Node | Forming | | | Normal Operation | | |
|---|---|---|---|---|---|---|
| | Positive Pulse Application | Negative Pulse Application | Determination (Reading) | "0" Writing Positive Pulse Application | "1" Writing Negative Pulse Application | Reading |
| WL | Vfl | Vfl | VDD | VL | VL | VDD |
| SL | 0 V | Vfl | 0 V | 0 V | VL | 0 V |
| BL | Vfh 0 V Variable Pulse Width | Vfh 0 V | Vread | VH 0 V | VH 0 V | Vread |

M11 Access Reading

FORMING METHOD OF PERFORMING FORMING ON VARIABLE RESISTANCE NONVOLATILE MEMORY ELEMENT, AND VARIABLE RESISTANCE NONVOLATILE MEMORY DEVICE

TECHNICAL FIELD

The present invention relates to a forming (initializing) method for providing stable resistance change to a variable resistance nonvolatile memory element having a resistance value reversibly changed based on electrical signals, and to a variable resistance nonvolatile memory device having a function of such a forming method.

BACKGROUND ART

In recent years, variable resistance nonvolatile memory devices (hereinafter, referred to also simply as "nonvolatile memory devices") having memory cells including variable resistance nonvolatile memory elements (hereinafter, referred to also simply as "variable resistance elements") have been researched and developed. The variable resistance elements are elements having characteristics in which a resistance value reversibly changes based on electrical signals, and capable of holding data corresponding to the resistance value in a nonvolatile manner.

Commonly known is a nonvolatile memory device including a matrix of so-called 1T1R memory cells in each of which a Metal Oxide Semiconductor (MOS) transistor and a variable resistance element are connected in series with each other at a location close to a cross-point between a bit line and a word line that are arranged perpendicular to each other. In each of the 1T1R memory cells, one of two terminals of the variable resistance element is connected to the bit line or a source line, while the other terminal is connected to a drain or source of the MOS transistor. A gate of the MOS transistor is connected to the word line. The other terminal of the MOS transistor is connected to the source line or the bit line which is not connected to the terminal of the variable resistance element. The source line is arranged parallel to the bit line or the word line.

Another memory cell structure is also generally known as a nonvolatile memory device including a matrix of cross point memory cells called 1D1R memory cells in each of which a diode and a variable resistance element are connected in series with each other at a cross-point between a bit line and a word line that are arranged perpendicular to each other.

(Definition of Forming)

The following describes typical examples of conventional variable resistance elements (Non-Patent Literature 1, and Patent Literatures 1 and 2).

First, Non-Patent Literature 1 discloses the following nonvolatile memory including 1T1R memory cells each using a transition metal oxide as a variable resistance element. A transition metal oxide thin film is generally a super high resistance that is almost an insulator before forming, and its resistance is not changed even by applying a voltage having a pulse voltage (hereinafter, expressed also as "applying a pulse voltage"). A resistance value of the transition metal oxide film can therefore be changed by application of a voltage pulse, by performing a forming to form a conducting path for switching the resistance value between a high resistance state and a low resistance state. Here, the forming (or forming processing) refers to initialization processing of a variable resistance element. The forming is an operation for changing a variable resistance element from a state having an extremely high resistance value after manufacture of the variable resistance element (in other words, an initial state where a voltage has not yet been applied after manufacturing) to an operable state where a resistance value of the variable resistance element is in a range lower than the initial state and can be changed between a high resistance state and a low resistance state according to application of a pulse voltage. In other words, the forming is used to change the variable resistance element from a state after the manufacture where the variable resistance element has not yet operated as a variable resistance element to a state where the variable resistance element is capable of serving as a variable resistance element. In general, the forming is performed only once after the manufacture.

(Disclosures Regarding Forming of Variable Resistance Element in Patent Literature 1 and Non-Patent Literature 1)

FIG. 35 is a graph plotting a dependency of a forming voltage (V_form) on a transition metal oxide film thickness (TMO) which is disclosed in Non-Patent Literature 1. The "forming voltage" refers to a voltage applied to perform a forming for a variable resistance element. The graph indicates four kinds of properties, NiO, $TiO_2$, $HfO_2$, and $ZrO_2$, as transition metal oxides. The forming voltage depends on the kinds of the transition metal oxides. Furthermore, when a thickness of a transition metal oxide is greater, the forming start voltage is higher. It is disclosed that, in order to decrease the forming voltage, it is therefore preferable to select a transition metal oxide such as NiO to form a transition metal oxide film having a small thickness.

Moreover, Patent Literature 1 discloses a metal ion conductive nonvolatile memory element in which rare earth oxide thin films are used as variable resistance elements.

FIG. 36 is a cross-sectional view of a memory cell disclosed in Patent Literature 1.

This memory cell has the following structure. A lower electrode 2 is formed on a substrate 1 having a high electrical conductivity (a silicon substrate 1 doped with a P-type high-concentration impurity, for example). An ion source layer 3 including a metallic element as an ion source is formed on the lower electrode 2. A memory layer 4 having a relatively high resistance value is formed on the ion source layer 3. An upper electrode 6 is formed to contact the memory layer 4 through an opening in an insulation layer 5 on the memory layer 4.

Patent Literature 1 discloses CuTe, GeSbTe, AgGeTe, and the like as a material of the ion source layer 3, and discloses a rear earth element oxide such as a gadolinium oxide as a material of the memory layer 4. A material of the lower electrode 2 and the upper electrode 6 is described as a common semiconductor line material such as TiW and TaN. Furthermore, a gadolinium oxide for the memory layer 4 is added with metallic particles such as Cu having an amount not enough to form a layer, namely, an amount enough to keep insulation properties or semi-insulation properties.

A method of writing data into the memory cell shown in FIG. 36 is as follows. When a negative voltage causing a potential of the upper electrode 6 to be lower than a potential of the lower electrode 2, a conducting path including a large amount of metallic elements is formed in the memory layer 4, or a large number of defects resulting from the metallic elements are formed in the memory layer 4. As a result, a resistance value of the memory layer 4 is decreased. On the other hand, when a positive voltage causing the potential of the upper electrode 6 to be higher than the potential of the lower electrode 2 is applied, the conducting path or the defects formed in the memory layer 4 due to the metallic elements disappear. As a result, the resistance value of the memory layer 4 is increased.

FIG. 37 is a graph plotting I-V properties changed from an initial state regarding the memory cell shown in FIG. 36. In the first loop, a relatively high negative voltage is applied to the memory cell to change a high resistance state of the initial state to a low resistance state. The voltage is assumed to be an initialization voltage Vo. Then, when a positive potential is increased, an erasing voltage Ve is applied to the memory cell to change the low resistance state to a high resistance state. Furthermore, after the first loop, a writing voltage Vr having an absolute value smaller than that of the initialization voltage Vo is applied to the memory cell to change the high resistance state to a low resistance state.

As described above, according to Patent Literature 1, once initialization is first performed by the high voltage Vo, the resistance state can be afterwards changed by the low erasing voltage Ve and writing voltage Vr. Patent Literature 1 also discloses that the initialization voltage Vo can be controlled by adding metal particles to the memory layer 4 to form defection caused by the metal element in the memory layer 4.

(Disclosure Regarding Forming of Variable Resistance Element in Patent Literature 2)

Furthermore, Patent Literature 2 disclose an initialization (forming) method for ion conductive nonvolatile variable resistance elements, by which data writing and erasing after initialization can be performed at a high speed.

FIG. 38 shows an initial pulse waveform for performing the initialization which is disclosed in Patent Literature 2. As shown in FIG. 38, without performing initialization by a pair of a writing voltage pulse and an erasing voltage pulse, writing and erasing are repeated alternately so that a pulse width is gradually decreased from a long pulse of approximately a few hundred ms which is a required minimum pulse for initialization to a desired pulse width for data writing and erasing.

More specifically, the first pair of a writing voltage pulse PW1 and an erasing voltage pulse PE1 is set to be a long pulse having a width o approximately a few hundred ms. The second pair of a writing voltage pulse PW2 and an erasing voltage pulse PE2 is set to have a pulse width slightly shorter than the pulse width of the first pair of the pulse PW1 and the PE1. The third pair of a writing voltage pulse PW3 and an erasing voltage pulse PE3 is set to have a further shorter pulse width. Then, the fourth pair of a writing voltage pulse PW4 and an erasing voltage pulse PE4 is set to have the same pulse width as a pulse width of voltage pulses for subsequent data writing and erasing.

Therefore, Patent Literature 2 discloses that, by performing initialization (forming) to change a pulse width from a long pulse width to a short pulse width after application of voltage having the long pulse width, it is possible to perform data writing and erasing at a high speed with the short pulse width.

CITATION LIST

Patent Literatures

[PTL 1] Japanese Unexamined Patent Application Publication No. 2006-351780 (FIG. 1)
[PTL 2] Japanese Unexamined Patent Application Publication No. 2007-4873 (FIG. 6)
[PTL 3] International Publication No. WO 2008/149484
[PTL 4] International Publication No. WO 2009/050833

Non Patent Literature

[NPL 1] I. G. Baek et al., IEDM 2004, p. 587 (FIG. 5 (b))

SUMMARY OF INVENTION

Technical Problem

Here, the conventional technologies disclosed in Background Art are summarized. Non-Patent Literature 1 discloses the following. Some kinds of transition metal oxides show nonvolatile variable change phenomenon due to application of electrical pulse. Non-Patent Literature 1 also discloses that the transition metal oxides are in a considerably high resistance state after manufacturing, and their resistance can be changed by initialization (forming) where a relatively high voltage which is considered to form a conducting path is applied.

Patent Literature 1 discloses that even a metal ion conductive variable resistance element made of a material that is not a transition metal oxide also needs application of a relatively high voltage, and that the initialization (forming) processing enables the same resistance change caused by electrical pulse.

Patent Literature 2 discloses that, prior to the first data writing to a variable resistance element, as initialization (forming) processing, not only the first voltage application having a long pulse width but also continuous voltage application with gradually shortening pulse width are performed on the variable resistance element in initialization so as to perform forming, so that resistance change can be performed even by a short pulse.

Thus, the prior arts disclose that a variable resistance nonvolatile memory element is capable of having a simple structure in which some materials such as transition metal oxides are sandwiched between two electrodes. The prior arts also disclose that a forming using a high voltage is initially (immediately after manufacturing) performed for the nonvolatile memory element so as to form a conducting path, so that stable control of a change between a low resistance state (LR) and a high resistance state (HR) can be achieved afterwards only by applying electrical signals having a short pulse, and these resulting states are nonvolatile. If these variable resistance nonvolatile memory elements are used as memory cells, it would be possible to offer memories capable of being operated at a higher speed and manufactured at a lower cost more than commonly-known nonvolatile memories such as Flash memory.

(Structure and Problem of Variable Resistance Element which Inventors of this Application have been Examined)

In consideration of the above disclosers, the inventors of the present application use tantalum (Ta) that is one of transition metals for an example of a material of variable resistance nonvolatile memory devices, in order to provide a variable resistance nonvolatile memory device including memory cells each having a variable resistance layer comprising the oxygen-deficient oxide (tantalum oxide) and a switch element.

Here, the oxygen-deficient oxide refers to an oxide having an oxygen content amount (atom ratio: a ratio of the number of oxygen atoms to a total number of atoms) that is less than that of an oxide having a stoichiometric composition.

Preparing for explaining problems of the conventional technologies, the following describes some properties obtained by experiments regarding a variable resistance element having a variable resistance layer comprising an oxygen-deficient Ta oxide ($TaO_x$, where $0<x<2.5$). It should be noted that the explanation is disclosed in detail in the relevant patents, Patent Literatures 3 and 4.

FIG. 39 is a pattern view of a structure (structure for one bit) of a 1T1R memory cell using a conventional variable resistance element. As shown in FIG. 39, the 1T1R memory cell generally includes an NMOS transistor and a variable resistance element 100.

As shown in FIG. 39, the variable resistance element 100 includes a lower electrode 100a, a variable resistance layer 100b, and an upper electrode 100c which are stacked on one by one. The variable resistance layer 100b includes a first variable resistance layer 100b-1 and a second variable resistance layer 100b-2 stacked on the layer 100b-1. The first variable resistance layer 100b-1 comprises the above-described oxygen-deficient tantalum oxide ($TaO_x$, where $0<x<2.5$) and has low resistance. The second variable resistance layer 100b-2 is formed as a tantalum oxide layer ($TaO_y$, where $x<y$) in a high resistance, having an oxide deficient degree smaller than that of the first variable resistance layer 100b-1 (in other words, a higher oxygen content percentage).

Here, the oxygen deficient degree is defined as a ratio of a deficient oxygen to an amount of oxygen included in the stoichiometric composition oxygen, in each transition metal. For example, in the case where a transition metal is tantalum (Ta), since the composition of the stoichiometric oxide is $Ta_2O_5$, it can be expressed as $TaO_{2.5}$. An oxygen deficient degree of $TaO_{2.5}$ is 0%. For example, for an oxygen deficient degree of an oxygen-deficient tantalum oxide having a $TaO_{1.5}$ composition, the oxygen deficient degree=$(2.5-1.5)/2.5=40\%$. Furthermore, an oxygen content percentage of $Ta_2O_5$, which is a ratio of oxygen to a total atom number ($O/(Ta+O)$), is 71.4 atm %. Therefore, the oxygen content percentage of an oxygen-deficient tantalum oxide is greater than 0 and less than 71.4 atm %.

In a variable resistance element 100, a lower electrode terminal B extends from the lower electrode 100a, and an upper electrode terminal A extends form the upper electrode 100c. An NMOS transistor 104 serving as a selection transistor (namely, an example of a switch element) has a gate terminal G. The lower electrode terminal B of the variable resistance element 100 is connected in series with a source or drain ($N^+$ diffusion) region of the NMOS transistor 104. Another drain or source ($N^+$ diffusion) region not connected to the variable resistance element 100 extends from the NMOS transistor 104 as the lower electrode side terminal C. The substrate terminal is connected to a ground potential. Here, the second tantalum oxide layer 100b-2 having a high resistance is arranged close to the upper electrode terminal A arranged opposite to the NMOS transistor 104.

Here, as disclosed in Patent Literature 4 that is a relevant patent of the present disclosure, the upper electrode 100c is made of, for example, platinum (Pt), iridium (Ir), palladium (Pd), silver (Ag), nickel (Ni), tungsten (W), copper (Cu), or the like. It is disclosed that resistance change is likely to occur near an interface between (a) an electrode material having a standard electrode potential higher than that of Ta that is a constituent element of the variable resistance layer 100b and (b) the variable resistance layer, while resistance change is unlikely to occur at an interface between (c) an electrode material having a standard electrode potential lower than that of Ta and (b) the variable resistance layer. It is also disclosed that resistance change is more likely to occur as a difference between a standard electrode potential of the electrode material and a standard electrode potential of the metal included in the variable resistance layer is greater, while resistance change is less likely to occur as the difference is smaller. Here, in general, the standard electrode potential is one of indexes for indicating a likeliness of being oxidized. A greater value of the standard electrode potential indicates a less likeliness of being oxidized, while a smaller value indicates a more likeliness of being oxidized. In particular, it is desirable to use Pt or Ir, which has a high standard electrode potential, for electrodes so as to obtain good resistance changing.

However, in the above-described conventional variable resistance semiconductor memory device, there are problems that a forming voltage is varied depending on each of variable resistance elements included in a memory cell array, or that a forming voltage, which is initially applied to variable resistance elements to be in a state from which variable change starts, is high. Moreover, as described in detail later, according to the forming method disclosed in the relevant invention to address the above problems, there is another problem that a cell current in a low resistance state is reduced (more specifically, a resistance value in the low resistance state of the variable resistance element is not adequately lowered).

In order to solve the above problems, one non-limiting and exemplary embodiment of the present disclosure provides (a) a forming method of performing forming on a variable resistance nonvolatile memory element, by which a forming voltage can be set to lower than a conventional one, variations of the forming voltage depending on each of variable resistance elements can be prevented, and a cell current in a low resistance state can be increased, and (b) a variable resistance nonvolatile memory device that performs the forming method.

Solution to Problem

In one general aspect, the techniques disclosed here feature; a forming method of performing forming on a variable resistance nonvolatile memory element, by applying a forming voltage pulse to memory cells in each of which a variable resistance nonvolatile memory element is connected in series with a switch element, so as to change a resistance state of the variable resistance nonvolatile memory element from an initial state to an operable state, the initial state being a state where no voltage has yet been applied after manufacturing, and the operable state being a state where a resistance value of the variable resistance nonvolatile memory element is smaller than a resistance value of the variable resistance nonvolatile memory element in the initial state and the resistance state is changeable between a high resistance state and a low resistance state according to a polarity of a voltage pulse which is applied in a normal operation, the variable resistance nonvolatile memory element including: a first electrode a second electrode; and a transition metal oxide layer provided between the first electrode and the second electrode, the transition metal oxide layer including: a first oxygen-deficient transition metal oxide layer connected to the first electrode; and a second oxygen-deficient transition metal oxide layer in contact with the second electrode, the second oxygen-deficient transition metal oxide layer having an oxygen deficient degree smaller than an oxygen deficient degree of the first oxygen-deficient transition metal oxide layer, the variable resistance nonvolatile memory element having: in the normal operation, characteristics by which the resistance state is changed to the low resistance state when a positive voltage having a first writing voltage pulse which is equal to or higher than a first threshold voltage is applied to the first electrode with reference to the second electrode, and the resistance state is changed to the high resistance state when a positive voltage having a second writing voltage pulse which is equal to or higher than a second threshold voltage is applied to the second electrode with reference to the first electrode; in the initial state, characteristics by which when a first forming voltage having an amplitude equal to or greater than a first absolute value is applied between the first electrode and the second electrode so that a cumulative time period during which the first forming voltage is applied exceeds a first predetermined time period, first forming occurs to change the resistance state of the variable resistance nonvolatile memory element from the initial state to a first operable state where the resistance state is changeable between the high resistance state and the low resistance state according to application of a normal operation voltage, and the first predetermined time period decreases as a current flowing in the variable resistance nonvolatile memory element increases in the application of the first forming voltage; and in the first operable state after the first forming, characteristics by which when a second forming voltage is applied between the first electrode and the second electrode so that a cumulative time period during which the second forming voltage is applied exceeds a second predetermined time period, second forming occurs to change the resistance state of the variable resistance nonvolatile memory element from the first operable state to a second operable state where the resistance state is changeable to a low resistance state having a resistance value lower than a resistance value of the low resistance state in the first operable state, and the forming method including: applying the first forming voltage between the first electrode and the second electrode in the initial state, until the first forming occurs; and applying the second forming voltage between the first electrode and the second electrode in the first operable state after the first forming, until the second forming occurs.

Here, it is possible that the applying of the first forming voltage includes: applying a first voltage having a first voltage pulse as the first forming voltage between the first electrode and the second electrode so as to change the resistance state of the variable resistance nonvolatile memory element from the initial state to the first operable state, the first voltage pulse having an amplitude equal to or greater than the first absolute value and having a first pulse width; and determining whether or not the first forming successfully occurs by the applying of the first voltage having the first voltage pulse, wherein the applying of the first voltage is further performed, when it is determined in the determining that the first forming does not successfully occur, and in the further applying of the first voltage, the first voltage applied between the first electrode and the second electrode has a new first voltage pulse, the new first voltage pulse having an amplitude equal to or greater than the first absolute value, and the new first voltage pulse having a pulse width longer than a pulse width of the first voltage pulse in the applying of the first voltage which is performed immediately prior to the further applying of the first voltage, and the applying of the second forming voltage includes: applying a second voltage having a second voltage pulse as the second forming voltage between the first electrode and the second electrode so as to change the resistance state of the variable resistance nonvolatile memory element from the first operable state achieved by the first forming to the second operable state; and determining whether or not the second forming successfully occurs by the applying of the second voltage having the second voltage pulse, wherein the applying of the second voltage is further performed, when it is determined in the determining that the second forming does not successfully occur.

By the above method, in the forming, the first voltage having the first voltage pulse for the forming is applied, and if the forming does not successfully occur, the second voltage having the second voltage pulse for the forming is further applied. Therefore, the cumulative pulse application time period is increased to increase a probability of success of the forming. In addition, a pulse width of the second voltage pulse is set to be longer than a pulse width of the first voltage pulse. Therefore, the cumulative pulse application time period is increased at an accelerated rate, so that the forming can be successfully completed in a shorter time in comparison to the case where application of a voltage pulse with the same pulse width is repeated.

Here, it is possible that in the determining whether or not the first forming successfully occurs, it is determined whether or not the first forming successfully occurs, by (i) applying a positive voltage having a third writing voltage pulse which is equal to or higher than the first threshold voltage to the first electrode with reference to the second electrode, and (ii) determining, after the applying of the positive voltage having the third writing voltage pulse, whether or not the variable resistance nonvolatile memory element is in the low resistance state having the resistance value lower than the resistance value in the initial state.

By the above method, a negative voltage pulse is applied to change the resistance state of the variable resistance nonvolatile memory element to a low resistance state, and then its resistance value is detected. Therefore, the detected resistance value of the variable resistance nonvolatile memory element after the forming success is smaller than a resistance value in the case without application of the negative voltage pulse. As a result, it is possible to easily and correctly determine forming success.

Furthermore, it is possible that the determining whether or not the first forming successfully occurs and the applying of the first voltage having the first voltage pulse are repeated, until it is determined in the determining that the first forming successfully occurs. In addition, a pulse width of the negative voltage pulse may be equal to an application time period of a normal operation for the low resistance writing.

By the above method, the positive voltage pulse is applied again, or a pulse width of the negative voltage pulse is as small as the pulse width of the voltage pulse in the normal writing. Therefore, application of the negative voltage pulse can prevent troubles that the resistance state of the variable resistance nonvolatile memory element is not changed back to the high resistance state even by application of a positive voltage pulse. In another general aspect, the techniques disclosed here feature; a variable resistance nonvolatile memory device including memory cells in each of which a variable resistance nonvolatile memory element is connected in series to a switch element, the variable resistance nonvolatile memory element including: a first electrode; a second electrode; and a transition metal oxide layer provided between the first electrode and the second electrode, the transition metal oxide layer including: a first oxygen-deficient transition metal oxide layer connected to the first electrode; and a second oxygen-deficient transition metal oxide layer in contact with the second electrode, the second oxygen-deficient transition metal oxide layer having a oxygen deficient degree smaller than an oxygen deficient degree of the first oxygen-deficient transition metal oxide layer, the variable resistance nonvolatile memory element having: characteristics by which the resistance state is changed to a low resistance state when a positive voltage having a first writing voltage pulse which is equal to or higher than a first threshold voltage is applied to the first electrode with reference to the second electrode, and the resistance state is changed to a high resistance state when a positive voltage having a second writing voltage pulse which is equal to or higher than a second threshold voltage is applied to the second electrode with reference to the first electrode; in the initial state, characteristics by which when a first forming voltage having an amplitude equal to or greater than a first absolute value is applied between the first electrode and the second electrode so that a cumulative time period during which the first forming voltage is applied exceeds a first predetermined time period, first forming occurs to change the resistance state of the variable resistance nonvolatile memory element from the initial state to a first operable state where the resistance state is changeable between the high resistance state and the low resistance state according to application of a normal operation voltage, and the first predetermined time period decreases as a current flowing in the variable resistance nonvolatile memory element increases in the application of the first forming voltage; and in the first operable state after the first forming, characteristics by which when a second forming voltage is applied between the first electrode and the second electrode so that a cumulative time period during which the second forming voltage is applied exceeds a second predetermined time period, second forming occurs to change the resistance state of the variable resistance nonvolatile memory element from the first operable state to a second operable state where the resistance state is changeable to a low resistance state having a resistance value lower than a resistance value of the low resistance state in the first operable state, the variable resistance nonvolatile memory device including: a memory cell array including the memory cells in each of which the variable resistance nonvolatile memory element is connected in series to the switch element; a selection unit configured to select at least one memory cell from the memory cell array; a sense amplifier which determines whether the variable resistance nonvolatile memory element included in the at least one memory cell selected by the selection unit is in the high resistance state or in the low resistance state; an automatic forming unit including: a forming voltage pulse generation unit configured to generate a forming voltage having a forming voltage pulse so as to be applied to the variable resistance nonvolatile memory element included in the at least one memory cell selected by the selection unit, the forming voltage pulse having an amplitude equal to or higher than the first absolute value; a forming success detection unit configured to detect whether or not the variable resistance nonvolatile memory element is in a resistance state that is a state achieved by success of the first forming to have a resistance value lower than a resistance value in the initial state; and a forming success signal generation unit configured to eventually generate a forming success signal when a predetermined time period has passed since the detection of the success of the first forming by the forming success detection unit; and an automatic forming control unit configured to (i) automatically and sequentially generate address signals, and (ii) control, according to the address signals, the automatic forming unit to cause the first forming and the second forming in the variable resistance nonvolatile memory element included in the at least one memory cell selected by the selection unit; wherein the automatic forming unit is configured to (i) apply the forming voltage of the forming voltage pulse as the first forming pulse between the first electrode and the second electrode to cause one pulse application to occur the first forming and the second forming in the variable resistance nonvolatile memory element included in the at least one memory cell selected by the selection unit, the forming voltage pulse having an amplitude greater than an amplitude of a predetermined voltage, (ii) when the forming success detection unit detects that the variable resistance nonvolatile memory element is changed to the resistance state achieved by the success of the first forming, (ii-1) generate the forming success signal after the predetermined time period has passed since the detection, while applying the forming voltage having the forming voltage pulse as the second forming pulse, (ii-2) stop the application of the forming voltage having the forming voltage pulse, and (ii-3) terminate the forming on the at least one memory cell selected by the selection unit.

In still another general aspect, the techniques disclosed here feature; a variable resistance nonvolatile memory device including memory cells in each of which a variable resistance nonvolatile memory element is connected in series to a switch element, the variable resistance nonvolatile memory element including: a first electrode; a second electrode; and a transition metal oxide layer provided between the first electrode and the second electrode, the transition metal oxide layer including: a first oxygen-deficient transition metal oxide layer connected to the first electrode; and a second oxygen-deficient transition metal oxide layer in contact with the second electrode, the second oxygen-deficient transition metal oxide layer having a oxygen deficient degree smaller than an oxygen deficient degree of the first oxygen-deficient transition metal oxide layer, the variable resistance nonvolatile memory element having: characteristics by which the resistance state is changed to a low resistance state when a positive voltage having a first writing voltage pulse which is equal to or higher than a first threshold voltage is applied to the first electrode with reference to the second electrode, and the resistance state is changed to a high resistance state when a positive voltage having a second writing voltage pulse which is equal to or higher than a second threshold voltage is applied to the second electrode with reference to the first electrode; in the initial state, characteristics by which when a first forming voltage having an amplitude equal to or greater than a first absolute value is applied between the first electrode and the second electrode so that a cumulative time period during which the first forming voltage is applied exceeds a first predetermined time period, first forming occurs to change the resistance state of the variable resistance nonvolatile memory element from the initial state to a first operable state where the resistance state is changeable between the high resistance state and the resistance state according to application of a normal operation voltage, and the first predetermined time period decreases as a current flowing in the variable resistance nonvolatile memory element increases in the application of the first forming voltage; and in the first operable state after the first forming, characteristics by which when a second forming voltage is applied between the first electrode and the second electrode so that a cumulative time period during which the second forming voltage is applied exceeds a second predetermined time period, second forming occurs to change the resistance state of the variable resistance nonvolatile memory element from the first operable state to a second operable state where the resistance state is changeable to a low resistance state having a resistance value lower than a resistance value of the low resistance state in the first operable state, and the variable resistance nonvolatile memory device including: a memory cell array including the memory cells in each of which the variable resistance nonvolatile memory element is connected in series to the switch element; a selection unit configured to select at least one memory cell from the memory cell array; a forming power source which generates a forming voltage to cause forming in the variable resistance nonvolatile memory element included in the at least one memory cell selected by the selection unit; a writing power source which generates the positive voltage having the first writing voltage pulse and the positive voltage having the second writing voltage pulse to be applied to the variable resistance nonvolatile memory element included in the at least one memory cell selected by the selection unit; a variable-pulse-width writing voltage pulse generation unit configured to generate a variable-pulse-width writing voltage pulse to change the resistance state of the variable resistance nonvolatile memory element included in the at least one memory cell selected by the selection unit to a desired state, when one of the forming and writing is to be performed on the variable resistance nonvolatile memory element, the variable-pulse width writing voltage pulse having a variable pulse width; a first forming determination unit configured to determine whether or not the variable resistance nonvolatile memory element included in the at least one memory cell selected by the selection unit is in the resistance state achieved by success of the first forming to have a resistance value lower than a resistance value in the initial state; a second forming determination unit configured to determine whether or not the variable resistance nonvolatile memory element included in the at least one memory cell selected by the selection unit is in the low resistance state changeable only in the second operable state; and a sense amplifier which determines whether the variable resistance nonvolatile memory element included in the at least one memory cell selected by the selection unit is in a high resistance state or in a low resistance state, wherein the variable-pulse-width writing voltage pulse generation unit configured to: (i-1) apply a first voltage having a first voltage pulse between the first electrode and the second electrode to cause the first forming in the variable resistance nonvolatile memory element, the first voltage pulse having an amplitude equal to or greater than the first absolute value and having a first pulse width, and (i-2) when the first forming determination unit determines that the variable resistance nonvolatile memory element after the application of the first voltage having the first voltage pulse is not in the resistance state achieved by success of the first forming, apply a second voltage having a second voltage pulse between the first electrode and the second electrode, the second voltage pulse having an amplitude equal to or greater than the first absolute value and having a pulse width longer than the first pulse width; and (ii-1) apply an additional voltage having an additional voltage pulse with a third voltage width between the first electrode and the second electrode to cause the second forming in the variable resistance nonvolatile memory element, and (i-2) when the second forming determination unit determines that the variable resistance nonvolatile memory element is not in the low resistance state changeable only in the second operable state after the application of the additional voltage having the additional voltage pulse, further apply the additional voltage having the additional voltage pulse with the third pulse width between the first electrode and the second electrode.

Advantageous Effects of Invention (a) The forming method of performing forming on a variable resistance nonvolatile memory element and (b) the variable resistance nonvolatile memory device according to the present disclosure can set a forming voltage to be lower than a conventional one and prevent variations of the forming voltage depending on each of variable resistance elements. As a result, it is possible to perform forming on all memory cells having various forming characteristics, within a practical voltage range and without increasing an array area. As a result, high reliability and a smaller area can be achieved. In addition, it is possible to eliminate (enlarge) a filament path formed inadequately in the forming process, and increase a cell current in a low resistance state. As a result, an operation window is increased and a high-speed readout is possible. Moreover, it is possible to apply additional voltage pulse only to memory cells for which forming is necessary. As a result, high-speed forming can be achieved for a memory cell array.

BRIEF DESCRIPTION OF DRAWINGS

FIG. 29 is a table for explaining a setting voltage for each mode according to Embodiment 3 of the present disclosure.

DESCRIPTION OF EMBODIMENTS

Prior to the present disclosure, the inventors have made the relevant disclosure related to (a) a forming method of performing forming on a variable resistance nonvolatile memory element and (b) a variable resistance nonvolatile memory device performing the method, in order to set a forming voltage to be lower than a conventional one and prevent variations of the forming voltage depending on each of variable resistance elements. The relevant disclosure is described in detail in the specification of Japanese unexamined patent application publication No. 2010-79478 that is the relevant application not yet published at the time of making the present disclosure.

In the description of the present disclosure, first, main parts of the specification of the relevant application will be described and supplemental explanation will be given to clarify the details of the relevant disclosure, and then a new problem occurred in the relevant disclosure will be explained. After that, the present disclosure conceived to solve the new problem will be described in detail.

(Memory Cell to which Forming Methods of the Relevant Disclosure and the Present Disclosure are Applied)

First, the description is given for an example of a structure and processing of a typical memory cell to which the relevant disclosure and the present disclosure are applied.

Figure 39:
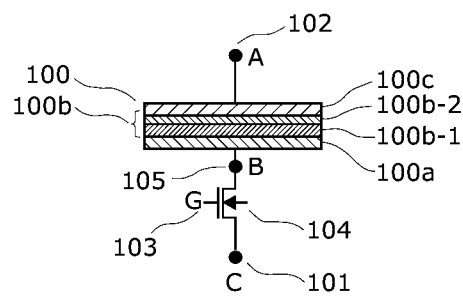
FIG. 39 is a schematic diagram showing a structure of a 1T1R memory cell using a conventional variable resistance element.

Forming characteristics in the case where the upper electrode 100c in a 1T1R memory cell comprises platinum (Pt) and forming characteristics in the case where the upper electrode 100c comprises iridium (Ir) are explained. Here, as shown in FIG. 39, the 1T1R memory cell includes variable resistance elements each of which includes a variable resistance layer. The variable resistance layer includes a first tantalum oxide layer 100b-1 ($TaO_x$, 0<x<2.5) and a second tantalum oxide layer 100b-2 ($TaO_y$, x<y).

In a sample used in this experiment, the variable resistance layer 100b has an area of 0.25 μm² (=0.5 μm×0.5 μm), and includes: the first tantalum oxide layer 100b-1 ($TaO_x$: x=1.54, thickness: 44.5 nm) in contact with the lower electrode 100a; and the second tantalum oxide layer 100b-2 ($TaO_y$: y=2.47, thickness: 5.5 nm) in contact with the upper electrode 100c. An NMOS transistor serving as a switch element has a gate width W of 0.44 μm, a gate length L of 0.18 μm, and a gate insulating film thickness Tox of 3.5 nm.

The second tantalum oxide layer 100b-2 is formed by performing, prior to a process for manufacturing the upper electrode 100c, a plasma oxidation process on a surface of the first tantalum oxide layer 100b-1 formed by sputtering. Therefore, the second tantalum oxide layer 100b-2 has an oxygen deficient degree smaller than that of the first tantalum oxide layer 100b-1. In other words, it is necessary to form a conducting path in the second tantalum oxide layer 100b-2 by first applying a certain forming voltage to the second tantalum oxide layer 100b-2 to cause resistance change in a structure having an considerably high resistance value (almost insulation).

Here, for example, the forming is performed on the 1T1R memory cell shown in FIG. 39 in the manner as described below.

At the beginning, at the first step, while a voltage of 0 V is applied to the lower electrode side terminal C and a gate voltage VG1 for forming is applied to the gate terminal G, a forming voltage VPA having a pulse width Tp0 is applied once to the upper electrode terminal A in a direction of changing the variable resistance element 100 to a high resistance state. Here, the gate voltage VG1 for forming is higher than a gate voltage VGw for normal writing, and the forming voltage VPA has the pulse width Tp0 that is the same pulse width as used for normal writing.

Next, at the second step, while a voltage of 0 V is applied to the upper electrode terminal A and the voltage VG1 is applied to the gate terminal G, the forming voltage VPA having a pulse width Tn0 (Tn0=Tp0) is applied once to the lower electrode side terminal C in a direction of changing the variable resistance element 100 to a low resistance state.

Then, at the third step, a voltage of 0 V is applied to the lower electrode side terminal C and the voltage VGr (VGr<VGw<VG1) for normal reading is applied to the gate terminal G, a read voltage Vread (voltage equal to or lower than a writing threshold voltage for the variable resistance element 100) is applied to the upper electrode terminal A. Thereby, it is determined whether a current flowing in the 1T1R memory cell is equal to or more than a predetermined current (in other words, in a low resistance state). As a result, it is possible to determine whether or not forming successfully occurs (hereinafter, expressed also as "is completed").

If it is determined that forming does not successfully occur, then the forming voltage VPA is increased by a predetermined step value, and the same processing is repeated until the forming voltage VPA reaches the voltage VG1 at maximum.

As described above, after performing the forming by applying the voltage VPA in high resistance writing direction, the voltage VPA in low resistance writing direction is applied to change the variable resistance element 100 to a low resistance state. Therefore, a memory cell current in reading is increased to allow the forming success (completion) determination to be easily made.

Then, the flow of the forming is performed in a nonvolatile memory device in which a plurality of 1T1R memory cells are arrayed in a matrix.

It should be noted that this nonvolatile memory device is implemented as a known circuit performing the above processing. The main part of the nonvolatile memory device is not described in detail below but described later.

(Forming Characteristics of a Memory Cell Having an Electrode Made of Pt)

First, explanation is given for forming characteristics in the case where the upper electrode 100c in a 1T1R memory cell is made of an electrode material most of which is platinum (Pt) having a high standard electrode potential (in other words, the upper electrode 100c is formed to be likely to change resistance near an interface between the upper electrode and the variable resistance layer) and the lower electrode 100a is made of a tantalum nitride (TaN) having a low standard electrode potential (in other words, the lower electrode 100a is formed to be unlikely to change resistance near an interface between the lower electrode and the variable resistance layer).

Figure 40:
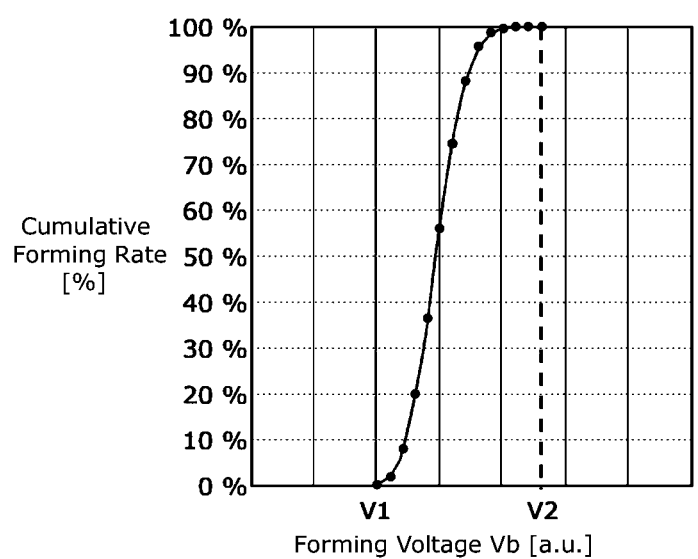
FIG. 40 is a graph plotting cumulative probability distribution of a forming voltage Vb of a conventional variable resistance element (upper electrode Pt).

FIG. 40 shows a graph plotting cumulative probability distribution of a voltage Vb by which forming for forming a conducting path in each memory cell is performed by applying voltages from a low voltage to a high voltage and forming is successful, in a nonvolatile memory device in which 1T1R memory cells, each of which has the variable resistance element 100 that includes the upper electrode 100c made of Pt and the variable resistance layer 100b made of oxygen-deficient tantalum oxide as shown in FIG. 39, are arranged. A horizontal axis indicates a forming voltage Vb (voltage determined as forming completion) of each memory cell in the case where a positive voltage pulse (with a pulse width Tp0) for applying a voltage higher than the lower electrode side terminal C is applied from a voltage V1 to a voltage V2 into the upper electrode terminal A with reference to the lower electrode side terminal C, between the upper electrode terminal A and the lower electrode side terminal C of the memory cell shown in FIG. 39 (here, a forming gate voltage VG1 is applied to the gate terminal, V1<V2<VG1). A vertical axis indicates a cumulative probability of forming success of a variable resistance element by the forming voltage Vb (here, a ratio of the variable resistance element for which forming has been completed to all variable resistance elements).

As described above, if the upper electrode 100c of the 1T1R memory cell is made of platinum (Pt), the voltage is varied from V1 to V2 for each memory cell, but application of a predetermined forming voltage Vb (for example, a voltage higher than the voltage V2) to a memory cell enables determination as to whether or not forming is possible for all bits of the array.

It is desirable that the platinum (Pt) layer included in the upper electrode 100c desirably has a thickness ranging from 1 nm to 23 nm, and is in physically contact with the variable resistance layer. It is more desirable that the platinum (Pt) layer has a thickness ranging from 1 nm to 10 nm. If the platinum (Pt) layer is not thin, migration occurs from platinum grain boundary, and protrusion is formed on a platinum electrode surface (interface between the platinum electrode and the variable resistance layer). If a voltage pulse is repeatedly applied to the variable resistance element having an electrode having such protrusion, electric field concentration would occur around the protrusion to destroy the variable resistance layer, which prohibits resistance change.

(Forming Characteristics of a Memory Cell Having an Electrode Made of Ir)

Next, explanation is given for forming characteristics in the case where the upper electrode 100c in a 1T1R memory cell is made of an electrode material most of which is iridium (Ir) having a high standard electrode potential (in other words, the upper electrode 100c is formed to be likely to change resistance near an interface between the upper electrode and the variable resistance layer) and the lower electrode 100a is made of a tantalum nitride (TaN) having a low standard electrode potential (in other words, the lower electrode 100a is formed to be unlikely to change resistance near an interface between the lower electrode and the variable resistance layer).

Figure 41:
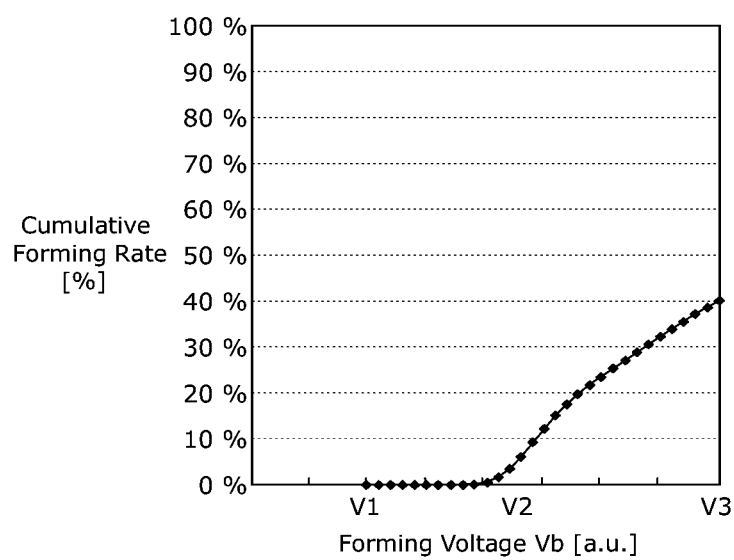
FIG. 41 is a graph plotting cumulative probability distribution of a forming voltage Vb of a conventional variable resistance element (upper electrode Ir).

FIG. 41 shows a graph plotting cumulative probability distribution of a voltage Vb by which forming for forming a conducting path in each memory cell is performed by applying voltages from a low voltage to a high voltage and forming is successful, in a 1T1R memory cell array having variable resistance elements 100 each of which has the upper electrode 100c made of Ir and the variable resistance layer 100b made of oxygen-deficient tantalum oxide as shown in FIG. 39. The horizontal axis and the vertical axis are the same as described with reference to FIG. 40, so that the axises are not described in detail.

As shown in FIG. 41, in the above-described conventional forming method, even if the voltage is increased to the voltage V3 at maximum over the voltage V2, forming has been performed only for approximately 40% of the array. Therefore, there is a problem, in the 1T1R memory cell using the upper electrode 100c made of Ir, that the array operation for recording data by resistance change ca be performed only for approximately 40% of bits. However, in the case of using the Ir electrode, there are advantages of less variation of characteristics after the forming and a high reliability. It should be noted that, as seen in FIG. 41, a cumulative forming ratio is gradually increased with respect to the forming voltage, and it is expected that application of higher voltage can provide forming to all memory cells. However, the above conventional method needs a design corresponding to a structure for which forming with a considerably high voltage is possible. For example, a transistor having a high pressure resistance makes it difficult to reduce a cell area, which prevents decrease of a cost.

In addition, depending on an electrode material of the upper electrode 100c, it is considered that the conventional forming method sometimes cannot perform forming completely, and cannot steadily change resistance for all of bits.

However, if the upper electrode 100c is made of Ir, variation of initial resistance prior to forming is considerably less than that in the case where the upper electrode 100c is made of Pt. If forming can be appropriately performed on a memory cell using Ir, it would be possible to reduce the variation of resistance change characteristics and improve a reliability for the memory cell.

In general, in semiconductor memory devices, if a yield or reliability is to be improved, processing is to be refined, or a memory capacity is to be increased, an approach is applied to select an optimum by comprehensively experimenting more appropriate materials. However, the approach also results in a problem of limiting a flexibility of material selection due to the above-described reason.

In view of the above situations, the inventors of the present disclosure have conceived the forming method according to the relevant disclosure, while examining a new forming method for variable resistance elements and a variable resistance nonvolatile memory device performing the method, which allows all bits in a memory cell array to be formed by using practical voltage pulse.

(Basic Data Regarding the Forming Method According to the Relevant Disclosure)

The forming method according to the relevant disclosure has been conceived based on some of basic data, such as a forming method focused on one bit in a 1T1R memory cell using Ir electrodes as a basic part of a variable resistance nonvolatile memory device. For the sake of simple explanation, first, the basic data is described.

The 1T1R memory cell used in the present disclosure and the relevant disclosure has the same structure as described with reference to FIG. 39. In particular, the upper electrode 100c in the 1T1R memory cell is mainly made of iridium (Ir). It should be noted that each of the lower electrode 100a, the variable resistance layer 100b, the first tantalum oxide layer 100b-1, the second tantalum oxide layer 100b-2, and the upper electrode 100c in the variable resistance element 100 correspond to a first electrode, a transition metal oxide layer, a first transition metal oxide layer, a second transition metal oxide layer, and a second electrode, respectively, of the variable resistance element in the forming method according to the present disclosure.

In the case of the above structure, after forming, in a state where resistance changing is possible, as described earlier, if a voltage (a low resistance writing voltage pulse) equal to or higher than a predetermined voltage (for example, the first threshold voltage) is applied to the lower electrode terminal 105 with reference to the upper electrode terminal 102 of the variable resistance element 100, the variable resistance element 100 is changed to a low resistance state. On the other hand, if a value (a high resistance writing voltage pulse) equal to or higher than a different predetermined voltage (for example, the second threshold voltage) is applied to the upper electrode terminal 102 with reference to the lower electrode terminal 105, the variable resistance element 100 is changed to a high resistance state.

(Resistance Transition According to a Polarity of a Voltage Pulse Applied in Forming)

Figure 1A:
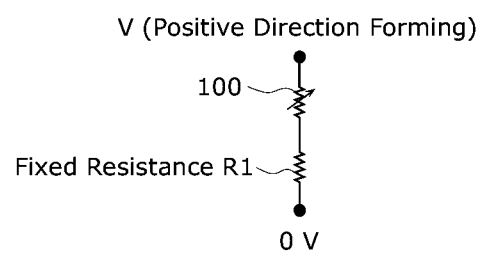
FIG. 1A is a circuit diagram of a memory cell for measuring a relationship between a cumulative pulse application time period and a resistance value of a variable resistance element for each bit in the case where forming is performed by continuous application of a positive voltage pulse.
Figure 1B:
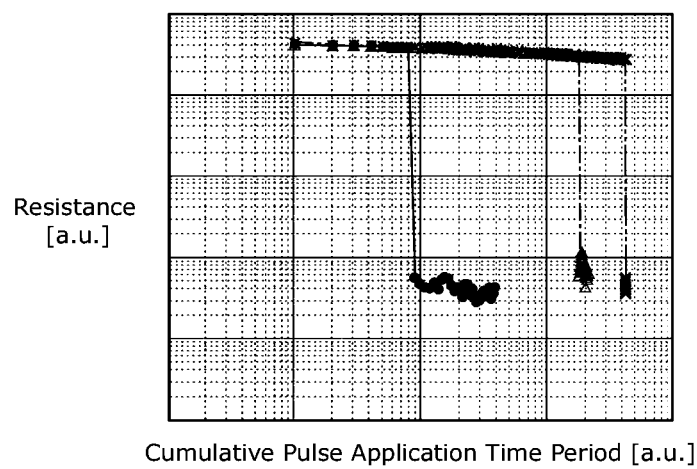
FIG. 1B is a graph plotting a result of the measurement of FIG. 1A.

FIG. 1A is a circuit diagram of a memory cell that is manufactured as a trial for measuring a relationship between a cumulative pulse application time period and a resistance value of the variable resistance element 100 for each bit in the case where forming is performed by continuously applying a positive voltage pulse to the upper electrode with reference to the lower electrode. FIG. 1B shows a result of the measurement. Here, for three memory circuits, each of which is a circuit where the variable resistance element 100 is connected in series with a fixed resistance R1 that corresponds to an ON-resistance of a transistor in the 1T1R memory cell, a positive voltage pulse for forming is applied to the upper electrode to try forming. Under the situation, a relationship between a resistance value of the variable resistance element 100 and a cumulative pulse application time period is plotted for each of the three memory circuits. It should be noted that a cumulative pulse application time period indicated by a horizontal axis is a cumulative time duration (a total time duration of a pulse width) of application of the forming positive voltage pulse to the variable resistance element 100. Each of the vertical and horizontal axises of the graph is expressed by a log scale.

Here, a success of forming is determined by detecting a change of the variable resistance element 100 from an initial state (almost insulating state) to a high resistance state, by comparing (a) a current flowing in the variable resistance element due to application of a read voltage Vread to (b) a reference value Ith. Furthermore, for the sake of convenience in the measurement, a positive voltage pulse is kept being applied to the upper electrode with reference to the lower electrode, even after detecting the forming success. As shown in FIG. 1B, a cumulative pulse application time period required for forming is varied to 10 times or more, depending on respective variable resistance elements 100.

Figure 2A:
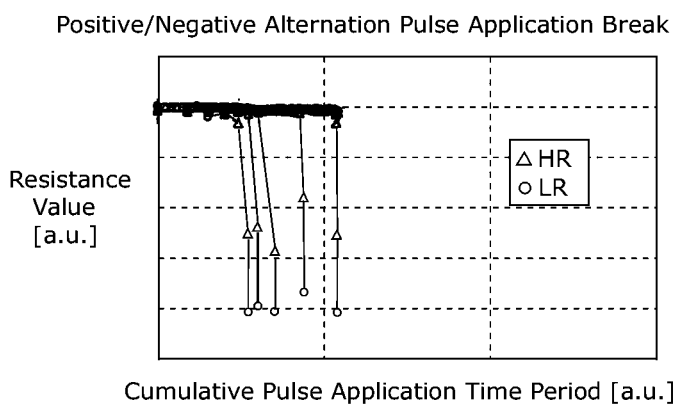
FIG. 2A is a graph plotting a result of measuring a relationship between a cumulative pulse application time period and a resistance value of a variable resistance element for each bit in the case where forming is performed by positive/negative alternation pulse application.

FIG. 2A is a graph plotting a result of measuring a relationship between a cumulative pulse application time period and a resistance value of the variable resistance element for each bit in the case where forming is performed by alternately applying a positive voltage pulse and a negative voltage pulse to the upper electrode with reference to the lower electrode.

Figure 2B:
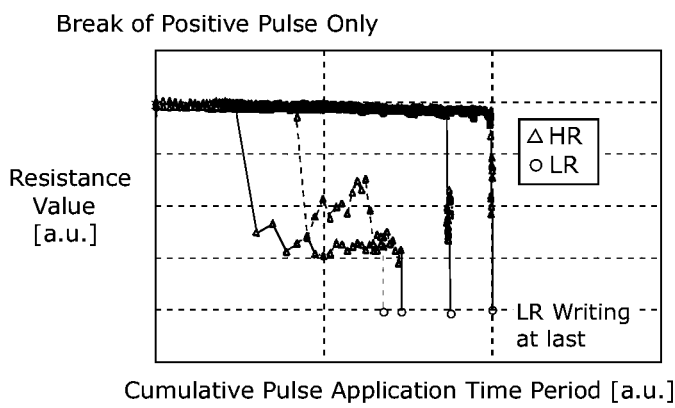
FIG. 2B is a graph plotting a result of measuring a relationship between a cumulative pulse application time period and a resistance value of a variable resistance element for each bit in the case where forming is performed by continuous application of a positive voltage pulse.

FIG. 2B is a graph plotting a result of measuring a relationship between a cumulative pulse application time period and a resistance value of a variable resistance element for each bit in the case where forming is performed by continuous application of a positive voltage pulse.

FIG. 2A shows a result of measurement in which a voltage pulse is applied to five memory circuits until forming is completed (becomes successful), and FIG. 2B shows a result of measurement in which a voltage pulse is applied to four memory circuits until forming is completed. Each of the four or five circuits is a circuit where the variable resistance element 100 is connected in series with a fixed resistance R2 that corresponds to an ON-resistance of a transistor in the 1T1R memory cell. A resistance value of the fixed resistance R2 is different from a resistance value of the fixed resistance 1 in FIG. 1A. Each of vertical and horizontal axises of the graphs is expressed by a log scale. The scale for the vertical axis is the same between FIG. 2A and FIG. 2B, and the scale for the horizontal axis is also the same between FIG. 2A and FIG. 2B.

In comparing FIG. 2A to FIG. 2B, if forming is performed by alternately applying a positive voltage pulse and a negative voltage pulse, a cumulative pulse application time period required for forming and its variation are reduced to approximately one tenth in comparison to the case where forming is performed only by a positive voltage pulse. In other words, the alternate application of positive and negative voltage pulses can facilitate forming more than the application of only a positive voltage pulse. Furthermore, if forming is performed only by a positive voltage pulse, it is likely to form unstable filament path (described later).

From the above, it is learned that forming is desirably performed by alternate application of positive and negative voltage pulses.

(Easiness of Forming Success Detection Depending on a Polarity of an Applied Voltage Pulse)

Figure 3:
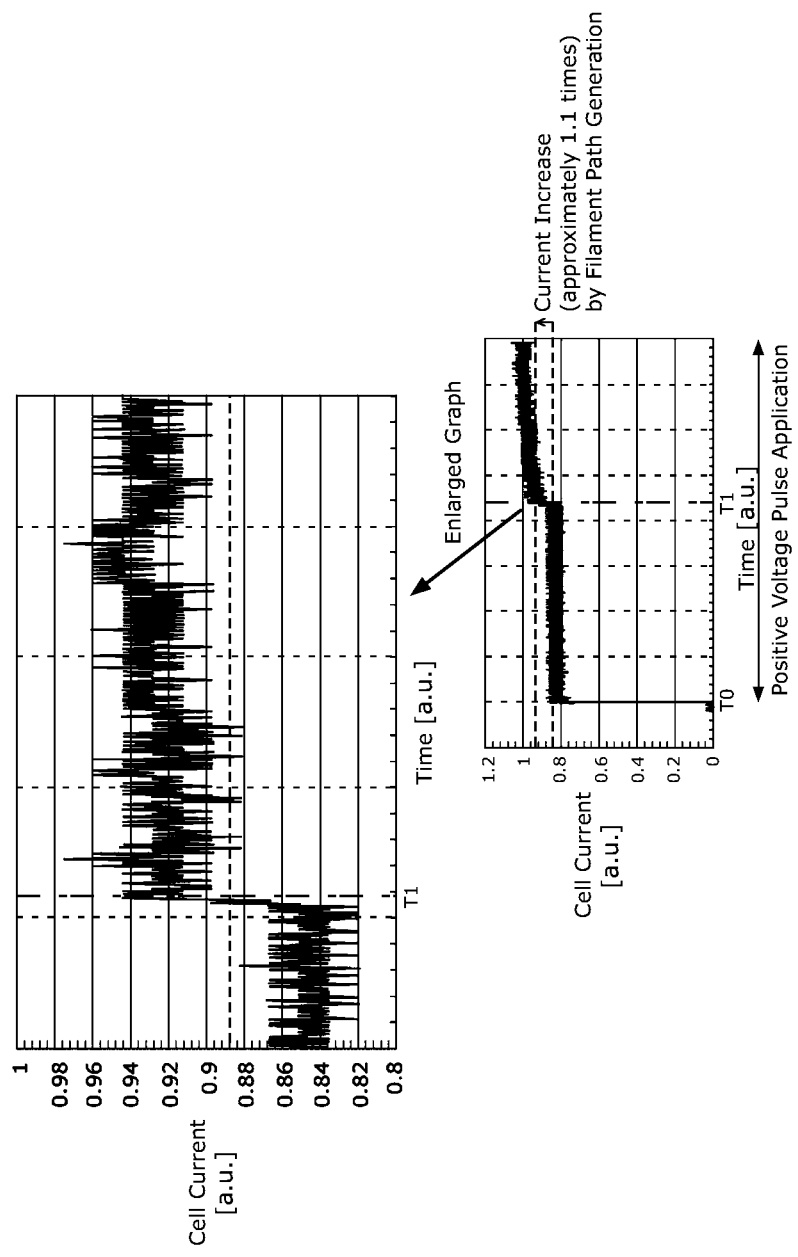
FIG. 3 is a graph plotting a waveform of a current flowing in the memory cell circuit shown in FIG. 1A in the case where forming is performed in HR writing direction by positive voltage pulse application.

FIG. 3 is a graph plotting a waveform of a cell current flowing in the memory cell circuit shown in FIG. 1A in the case where forming is performed in HR writing direction by positive voltage pulse application. The vertical axis indicates the cell current flowing in the memory circuit shown in FIG. 1A, while the horizontal axis indicates a cumulative application time period of a positive voltage pulse. Here, a direction of a current flowing in the variable resistance element 100 when the positive voltage pulse is applied is a high resistance writing direction, which is defined as a positive direction. Each of the vertical and horizontal axises of the graph is expressed by a linear scale.

As shown in FIG. 3, after starting positive voltage pulse application at a time T0, strong current voltage nonlinear characteristics in an initial, considerably high resistance state of the variable resistance element 100 cause a cell current with a certain amount to flow even before forming. However, if a filament path is formed by the forming at a time T1, the resistance value of the variable resistance element 100 is decreased, and the cell current flowing in the variable resistance element 100 is increased to approximately 1.1 times. Here, since the positive-direction forming is performed, a current difference before and after the forming is not considerably significant because the variable resistance element 100 is changed to a high resistance state after the forming.

Figure 4A:
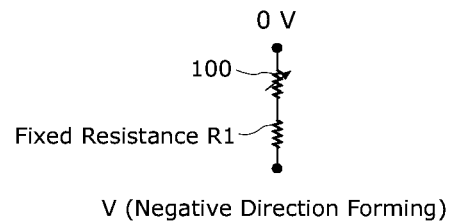
FIG. 4A is a circuit diagram of a memory cell for measuring a relationship between a negative voltage pulse application time period and a current flowing in a variable resistance element 100 in the case where forming is performed in LR writing direction by negative voltage pulse application.
Figure 4B:
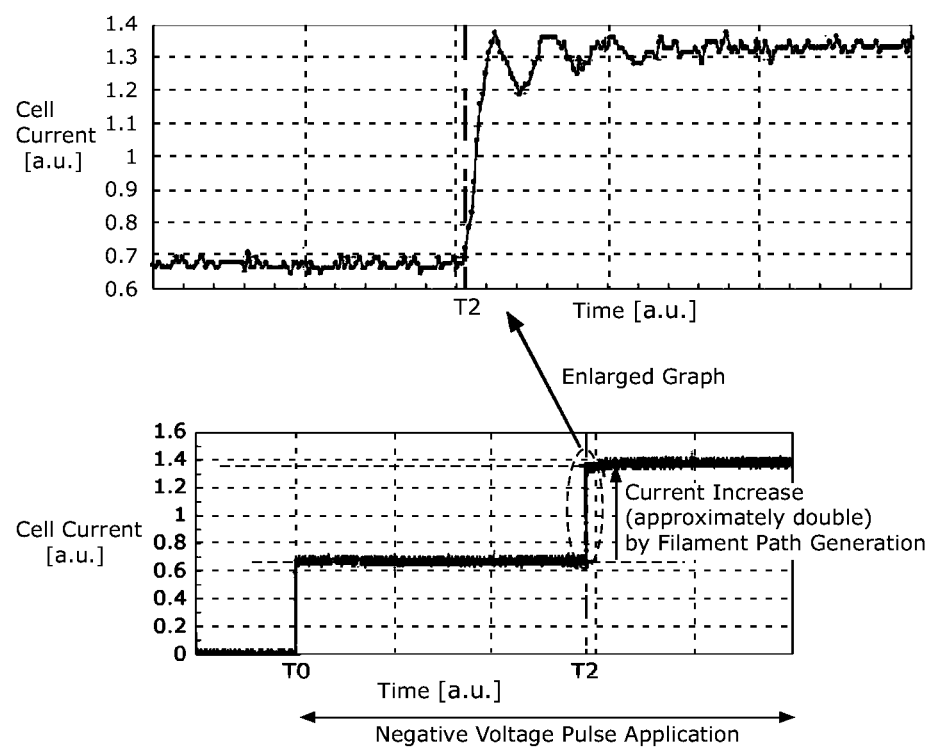
FIG. 4B is a graph plotting a result of the measurement of FIG. 4A.

FIG. 4A is a circuit diagram of a circuit for measuring a relationship between a negative voltage pulse application time period and a cell current flowing in the variable resistance element 100 in the case where forming is performed in LR writing direction by negative voltage pulse application. FIG. 4B shows a result of the measurement.

In FIG. 4A, the circuit has a structure in which the fixed resistance R1 is connected in series with the variable resistance element 100, a terminal, which is not connected to the fixed resistance R2, of the variable resistance element 100 is set to have a voltage of 0 V, and a terminal, which is not connected to the variable resistance element 100, of the fixed resistance R2 can be applied with a positive voltage pulse having an amplitude V (in other words, a negative voltage pulse can be applied to the variable resistance element 100). Here, a direction of a cell current flowing to the variable resistance element 100 when the positive voltage pulse with the amplitude V is applied to a terminal, which is not connected to the variable resistance element 100, of the fixed resistance 110 is a low resistance writing direction, which is defined as a negative direction.

FIG. 4B is a graph showing a waveform of a cell current flowing in the memory circuit shown in FIG. 4A in the case where forming is performed in a negative direction by applying a positive voltage pulse to a terminal, which is not connected to the variable resistance element 100, of the fixed resistance 110 in the memory circuit. The vertical axis indicates a cell current flowing in the memory cell circuit shown in FIG. 4A, and the horizontal axis indicates a time duration of applying a positive voltage pulse (a negative voltage pulse for the variable resistance element 100). Each of the vertical and horizontal axises of the graph is expressed by a linear scale.

As shown in FIG. 4B, after starting positive voltage pulse application at a time T0, strong current voltage nonlinear characteristics in an initial, considerably high resistance state of the variable resistance element 100 cause a cell current with a small amount to flow even before forming. However, if a filament path is formed by the forming at a time T2, the resistance value of the variable resistance element 100 is considerably decreased, and the cell current flowing in the variable resistance element 100 is increased to approximately double. Here, since the forming is performed in LR writing direction, the variable resistance element 100 is changed to the low resistance state after the forming, and a current amount difference before and after the forming in the LR writing direction is increased to approximately 8.6 times as much as the current difference before and after the forming in the HR writing direction shown in FIG. 3. This shows that forming success detection in a circuit is easier by the forming in LR writing direction. However, the forming in LR writing direction causes a problem of varying the resistance value after the forming.

(Forming Method of Performing Forming on a Variable Resistance Element According to the Relevant Disclosure)

The inventors of the present disclosure have conceived the following forming method as disclosed in the specification of Japanese unexamined patent application publication No.

2010-79478 that is the relevant application, in consideration of the above-described basic data.

Figure 5:
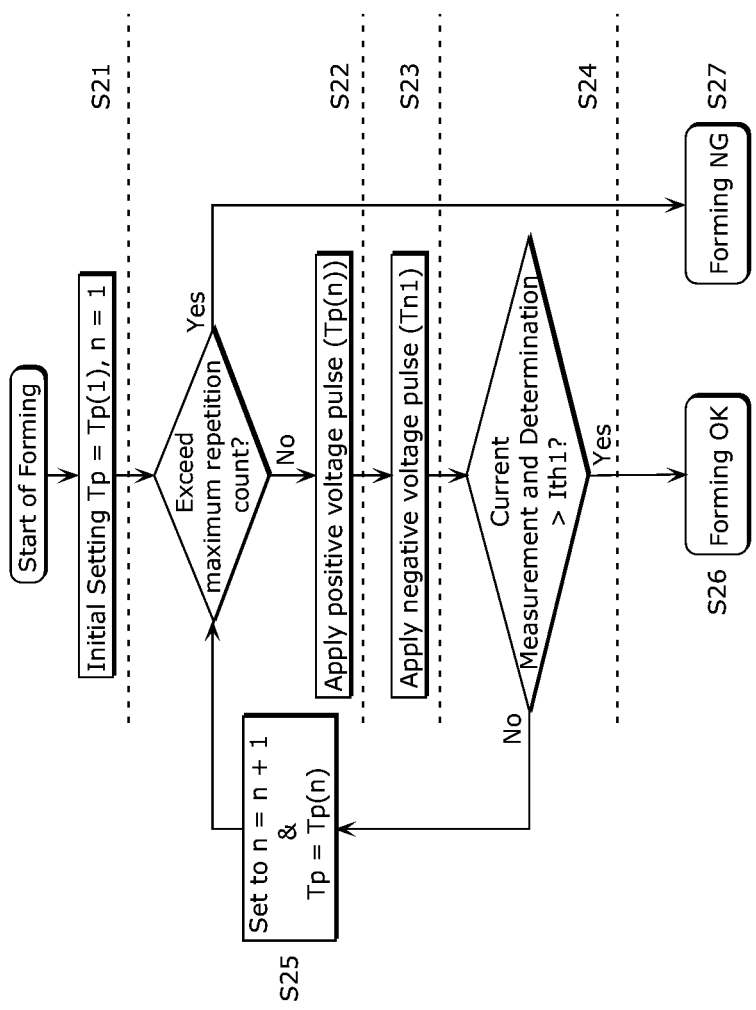
FIG. 5 is a flowchart of a forming flow for a 1T1R memory cell according to an embodiment of the present disclosure.

FIG. 5 is a flowchart of the forming for the 1T1R memory cell which is disclosed in the specification of Japanese unexamined patent application publication No. 2010-79478, and includes Steps S21 to S27

At Step S21, initial setting is performed. At this Step S21, the variable resistance element 100 is in an initial state (almost insulating and considerably high resistance state) after completion of manufacturing the 1T1R memory cell, where application of a normal resistance change pulse cannot cause resistance change. Furthermore, as the initial setting, a forming pulse width Tp is set to Tp(1), and the number of repetitions of the forming (forming repetition count) n is set to 1.

Step S22 is a first voltage application step. When Step 22 is performed for the n-th time, a voltage pulse (positive forming pulse in a high resistance (HR) writing direction, namely, the first positive voltage pulse) is applied once to the upper electrode terminal 102 of the memory cell with reference to the lower electrode terminal 101 of the memory cell. The certain voltage pulse has a pulse width Tp(n) and a voltage Vp (=VG1). The pulse width Tp(n) has a variable value increased according to the number of performing Step S22, and the Tp(1) for the first time may be the same as a pulse width for normal writing. Here, a voltage at the gate terminal 103 is the gate voltage VG1 (voltage for causing a transistor to be an ON-state) that is higher than the gate voltage VGw for normal writing.

Step S23 is the first half of the determination step. Here, a voltage pulse (a voltage pulse in LR writing direction, namely, a negative voltage pulse) is applied once to the lower electrode terminal 101 with reference to the upper electrode terminal 102. The voltage pulse has a pulse width Tn1 (fixed value) that is the same as a pulse width for normal writing, and has a voltage Vp (=VG1). Here, a voltage at the gate terminal 103 is VG1 (a voltage for causing a transistor to be an ON-state). Of course, the negative voltage pulse may be any voltage pulse that is capable of changing the variable resistance element to a low resistance state. The pulse width Tn1 may be different from the pulse width for normal writing.

Step S24 is the second half of the determination step. Here, a current measurement source is connected to the lower electrode terminal 101 (or the upper electrode terminal 102) with reference to the upper electrode terminal 102 (or the lower electrode terminal 101), and a current flowing from the lower electrode terminal 101 (or the upper electrode terminal 102) to the upper electrode terminal 102 (or the lower electrode terminal 101) by application of the read voltage Vread (a voltage equal to or lower than a writing threshold voltage of the variable resistance element 100) is measured. Here, a voltage at the gate terminal 103 is VG1. Then, if the read current has a value greater than the reference value Ith1 (in other words, if it is determined that the variable resistance element 100 is in a low resistance state), it is determined that the forming is successful and the forming flow is ended (S26).

On the other hand, if the read current has a value smaller than the reference value, it is determined that the forming has not yet been completed (not successful), and the processing proceeds to Step S25 to change the applied pulse width to Tp(2) and the forming repetition count is incremented, and the processing returns to Step S22 again. Then, until it is determined at Step S24 that forming is successful, the pulse width is gradually increased to a predetermined pulse width Tp(n) according to the forming repetition count n, and such increasing is repeated.

As one example, Tp(n) can be set as shown in the following Table 1.

TABLE 1

| Tp(n) | Pulse Width |
|---|---|
| Tp(1) | 50 ns |
| Tp(2) | 100 ns |
| Tp(3) | 200 ns |
| Tp(4) | 500 ns |
| Tp(5) | 1 µs |
| Tp(6) | 5 µs |
| Tp(7) | 10 µs |
| Tp(8) | 50 µs |
| Tp(9) | 100 µs |
| Tp(10) | 500 µs |
| Tp(11) | 1 ms |
| Tp(12) | 5 ms |
| Tp(13) | 10 ms |

Moreover, if it is not determined at Step S24 that forming is successful although a pulse with the setting maximum pulse width (10 ms, for example) is applied (here, if the forming repetition count reaches a maximum (a forming repetition count corresponding to the case where a pulse width is the maximum pulse width)), then it is determined that a target memory cell is a defective cell for which forming, namely, resistance changing, cannot be performed (S27).

It should be noted that at Step S22, the predetermined positive voltage (in HR writing direction) is applied to the upper electrode terminal 102. The HR writing direction is used because it corresponds to a direction of producing smaller substrate bias effects of the NMOS transistor 104, so that a driving current of the transistor in the forming is increased. More specifically, by applying a positive voltage to the upper electrode terminal 102, the source of the NMOS transistor 104 has almost the same potential as that of the lower electrode side terminal C as the reference potential, so that the substrate bias effects can be prevented. Therefore, in the NMOS transistor 104, the current driving performance in applying a positive voltage to the upper electrode terminal 102 is greater than the current driving performance in applying a negative voltage to the upper electrode terminal 102.

Here, changing of a variable resistance element to a high resistance state is referred to also as "HR writing", and changing of a variable resistance element to a low resistance state is referred to also as "LR writing".

For the same reasons, a voltage to the gate terminal 103 is also set to be higher than a voltage in normal use.

Furthermore, at Step S23, on the contrary, a predetermined positive voltage is applied to the lower electrode terminal 101 (in LR writing direction). It is determined at Step S24 whether or not the forming is successful, and the forming completion state at Step S22 is set to a high resistance state. A resistance value in the high resistance state is approximately one tenth or less of a resistance value in an initial state. However, for easier and speedier determination, it is desirable that the variable resistance element 100 is in a lower resistance state. Therefore, at Step S23, the variable resistance element 100 is temporarily changed to a low resistance state. If the forming is not successful at Step S22, then the variable resistance element 100 is kept in the initial state that is a considerably high resistance state even at Step S23.

It should be noted that the voltage at the gate terminal 103 is set to the voltage VG1 that is the same voltage at Step S22, in order to reduce a time loss for voltage switching. If there is no specific problem, it is also possible to switch the gate voltage for normal resistance changing to the gate voltage VGw (<VG1) for normal writing. Moreover, Step S23 facilitates the forming success determination. As long as it is possible to determine the initial state and the state after forming completion of the variable resistance element (a difference of approximately one tenth between their resistance values) as described previously, Step S23 is not essential in the forming method according to the present disclosure.

It should also be noted that at Step S22, forming is performed by applying a HR writing direction pulse to the variable resistance element 100. However, if a bi-directional diode is used as a switch element, it is not necessary to perform the forming in a direction (HR writing direction) that increases the current driving performance of the NMOS transistor. Therefore, it is possible to perform forming with a variable pulse in LR writing direction as needed. In this case, Step S23 may be eliminated.

It should also be noted that at Step S24, the current measurement is performed at the read voltage Vread that is equal or lower than a writing threshold voltage of the variable resistance element 100. This is to prevent influent of disturbing a writing state (in other words, prevent that the resistance state of the variable resistance element 100 is changed). Furthermore, the resistance change characteristics of the variable resistance element 100 immediately after forming has a tendency of a small change width. Therefore, as the reference value Ith1 of the read current, a current value corresponding to a memory cell current closer to a high resistance state than an intermediate value between a high resistance state and a low resistance state in normal resistance changing.

It should also be noted that the measurement of the memory cell current is performed in the same direction as that at Step S23 by setting a ground voltage for the upper electrode terminal 102, in order to reduce a time loss for voltage switching. If there is no specific problem, it is also possible to make the determination in an opposite direction. It should also be noted that also at Step S24, the voltage at the gate terminal 103 is set to be the voltage VG1 that is the same as that at Step S23, in order also to reduce a time loss for voltage switching. If there is no specific problem, it is also possible to change the voltage to the gate voltage VGr (<VG1) for normal reading.

It should also be noted that for the applied pulse at Step S22 as shown in the above-presented Table 1, it is possible to appropriately determine a pulse width in starting the pulse application, a pulse width in ending the pulse application, and an interval between them. More specifically, for incrementing the forming repetition count n, it is possible to set a pulse width so that the pulse width is increased in an exponential manner, in a proportional manner, or in a mixed manner of the exponential and proportional manners.

By increasing a pulse width as shown in the example of Table 1, a cumulative pulse application time period is increased at an accelerated rate according to forming repetitions, which can complete forming by less repetitions than repetitions of positive voltage pulse application with the same pulse width. If a pulse width is set so that the pulse width is increased proportionally when the forming repetition count n is small (the pulse width is short) as shown in Table 1, and the pulse width is increased in the exponential manner when the forming repetition count n is large, it is possible to prevent that excess forming pulse application to a memory cell that is likely to be formed, and to complete forming by less repetitions than repetitions of positive voltage pulse application with the same pulse width.

(Resistance Transition by the Forming Method According to the Relevant Disclosure)

Figure 6:
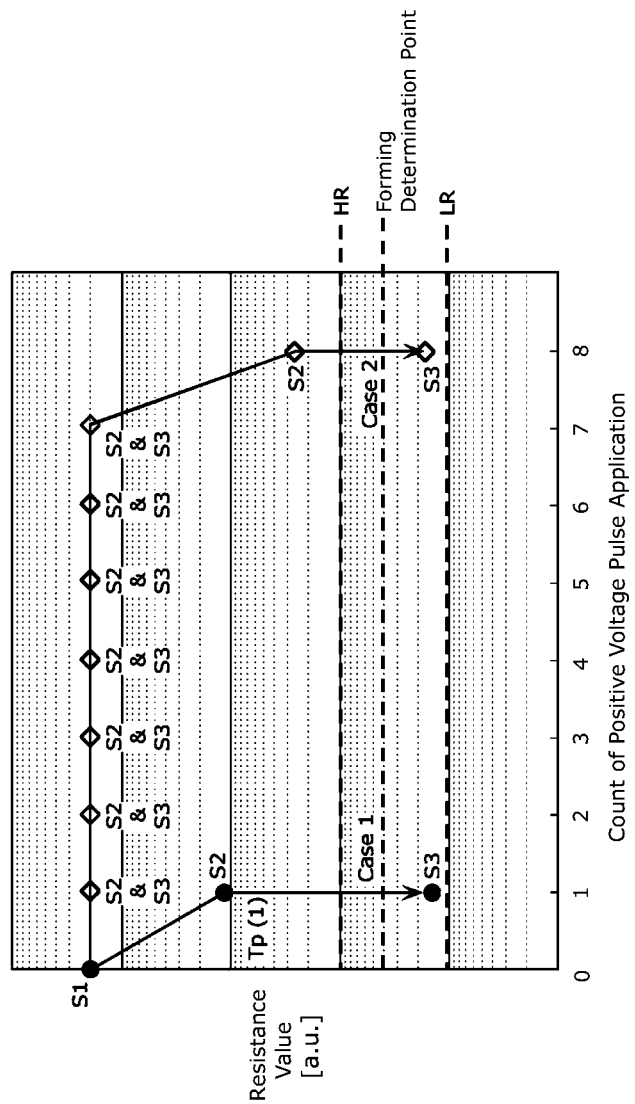
FIG. 6 is a graph plotting resistance transition in the case where forming of a 1T1R memory cell is performed by the 1T1R memory forming flow according to the embodiment of the present disclosure.

FIG. 6 is a graph plotting resistance transition of the variable resistance element 100 in the case where forming of a 1T1R memory cell is performed by the 1T1R memory forming flow of FIG. 5. The vertical axis of the graph indicates a resistance value by a log scale, and the horizontal axis indicates the count of pulse applications. It is assumed in the following description that in the n-th pulse application, a positive voltage pulse having the pulse width Tp(n) shown in Table 1 is applied.

The description is given for two example cases which are a case 1 where it is determined that forming is completed (successful) with the first pulse width Tp(1) of 50 nm, and a case 2 where it is determined that forming is completed with the eighth pulse width Tp(8) of 50 μm.

Here, at Step S21 which is performed in the initial state after manufacturing, the variable resistance element 100 is in a resistance state S1 having a resistance value higher than a resistance value as a measurement limit of a measurement device.

In the case 1, at first step S22, forming with the pulse width Tp(1) of 50 ns is performed on the variable resistance element 100. That is, the variable resistance element 100 is changed from the state S1 to a state S2 (black circle).

Since Step S22 is pulse application in HR writing direction, the variable resistance element 100 is changed at the forming to a high resistance state (the state S2 (black circle) having a resistance value lower than that in the state S1).

On the other hand, Step S23 is pulse application in LR writing direction. If forming is completed at Step S22, the variable resistance element 100 is changed to a low resistance state S3 (black circle).

Finally, at Step S24, the current measurement source for supplying the voltage Vread is connected to measure a current flowing from the lower electrode terminal 101 to the upper electrode terminal 102 of the 1T1R memory cell. However, the variable resistance element 100 is changed to the low resistance state S3 (black circle) at Step S23, a large current corresponding to the low resistance state is detected. This means that forming has been performed with the pulse width of 50 ns at Step S22.

Next, the case 2 is described.

At step S22, forming fails by pulse application from the first pulse application to the seventh pulse application using Tp(1) of 50 ns, Tp(2) of 100 ns, Tp(3) of 200 ns, Tp(4) of 500 ns, Tp(5) of 1 μs, Tp(6) of 5 μs, and Tp(7) of 10 μs. Therefore, with any pulse width, the variable resistance element 100 is in a considerably high resistance state (S2 (white squares) from Tp(1) to Tp(7)) exceeding the measurement limit, which is the same state as the initial state.

Although pulse application in LR writing direction is performed at Step S23, forming has not yet been completed at Step S23. Therefore, resistance change is not performed and the variable resistance element 100 is in a considerably high resistance state (S3 (white squares) from Tp(1) to Tp(7)) exceeding the measurement limit, which is the same state as the initial state.

Therefore, in the current measurement at Step S24, a current hardly flows.

On the other hand, at Step S22 in the eighth pulse application, forming with a pulse width Tp(8) of 50 μs is performed on the variable resistance element 100 and the variable resistance element 100 is changed to a high resistance state (S2 (white square) at Tp(8)).

Since forming is completed by the eighth pulse application at Step S22, then at Step S23, the variable resistance element 100 is changed to a low resistance state (S3 (white square) at Tp(8)).

Since the variable resistance element 100 is changed to the low resistance state at Step S23, then at Step S24, a large current corresponding to a low resistance state is detected so as to determine that forming is performed with a pulse width of 50 μs at Step 22 in the eighth pulse application. In this case, the cumulative pulse width of approximately 67 has been applied.

As described above, as shown in the example where the upper electrode 100c is made of iridium (Ir), even if forming is not performed completely in the known method of applying a predetermined voltage, it is possible to perform forming by appropriately adjusting a cumulative pulse time of the forming.

(Application to a Memory Cell Including a Transistor and a Variable Resistance Element Having an Ir Electrode)

Here, based on some of experimental data, the description is given for basic characteristics of the 1T1R memory cell which are to be considered when the forming method according to the relevant disclosure is used for the 1T1R memory cell that includes (a) a variable resistance element having an upper electrode 100c made of iridium (Ir) and (b) an NMOS transistor.

Figure 7:
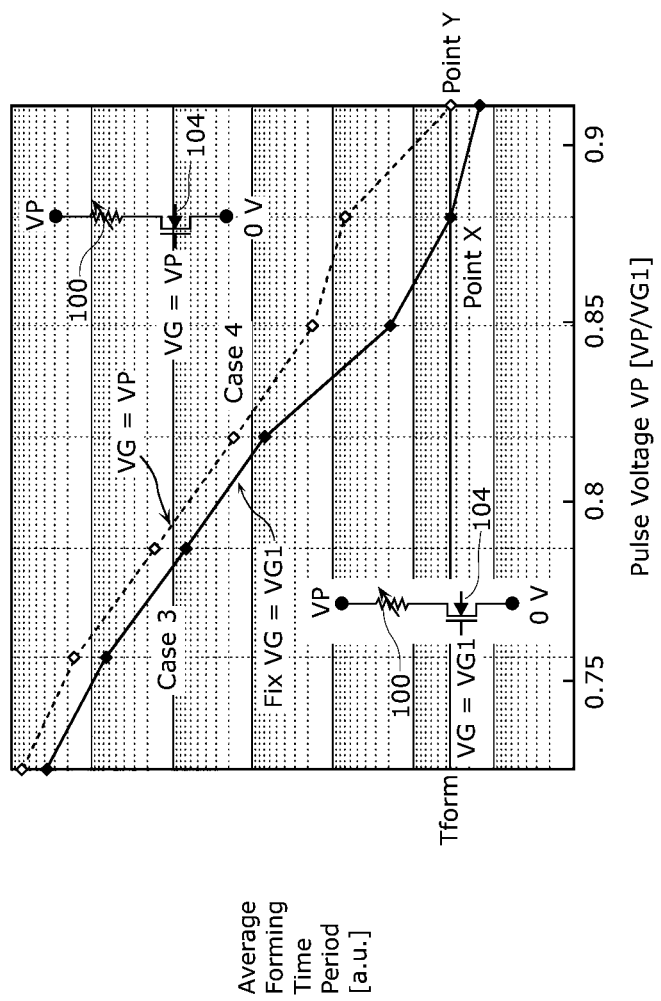
FIG. 7 is a graph showing a relationship between (a) a voltage having a voltage pulse used in forming and (b) a cumulative pulse time required to the forming regarding the 1T1R memory cell, according to the embodiment of the present disclosure.

FIG. 7 shows measurement of a relationship between (a) a voltage VP having a voltage pulse used in forming and (b) an average cumulative pulse time period (average forming time period) required for the forming regarding the 1T1R memory cell shown in FIG. 39.

The measurement is performed under two conditions for a gate voltage of the NMOS transistor 104, in order to examine a relationship between a driving current amount and the average forming time period of the NMOS transistor 104.

In the measurement, a variable resistance nonvolatile memory device including a memory cell array in which a plurality of 1T1R memory cells shown in FIG. 39 are arranged in row and column directions is used, and forming is performed by varying a voltage of a voltage pulse and a gate voltage for each region in the memory cell array according to the forming flow shown in FIG. 5. In FIG. 7, for each region, the vertical axis indicates an average value (referred to as an "average forming time period") of a cumulative pulse time required to perform forming on each bit in a target region, and the horizontal axis indicates a voltage VP with a corresponding voltage pulse. The vertical axis of the graph indicates the average forming time period by a log scale, and the horizontal axis indicates a ratio of the voltage VG1 to the pulse voltage VP.

It should be noted that a structure of the variable resistance nonvolatile memory device used in the measurement and the detailed operation method are not described below, but will be explained later in the description for the variable resistance nonvolatile memory device.

In FIG. 7, a solid line shows characteristics of the case (case 3) where the gate voltage VG at a memory cell transistor is fixed to VG1 (a voltage enough to cause the memory cell transistor to be ON), and a broken line shows characteristics of the case (case 4) where the gate voltage VG at the memory cell transistor and the voltage VP of the voltage pulse are changed in cooperation with each other.

In any of the cases, it is seen that the average forming time period is changed in an exponential manner with respect to the voltage VP of the voltage pulse. Furthermore, the gate voltage in the case 4 is lower than that in the case 3, so that a driving current of the NMOS transistor 104 is low in the case 4. Even at the voltage VP with the same voltage pulse, a current flowing in the variable resistance element 100 in forming is small. As a result, it is shown that the average forming time period in the case 4 is longer than that in the case 3.

In the meanwhile, if points at different voltages VP of voltage pulses are observed as having the same average forming time period, it is considered that the same forming current (current flowing in forming) flows at these points.

For example, in FIG. 7, an average forming time period Tform of a point X in the case 3 (where the gate voltage VG is VG1, and the voltage VP of the voltage pulse is 0.88×VG1) is the same as an average forming time period Tform of a point Y in the case 4 (where each of the gate voltage VG and the voltage VP of the voltage pulse is 0.91×VG1). The above situation is considered that both in the forming at the point X and in the forming at the point Y, the same forming current flows in the variable resistance element 100, and the same voltage Ve is applied between the terminals A and B of the variable resistance element 100, so that the same phenomenon occurs.

Figure 8:
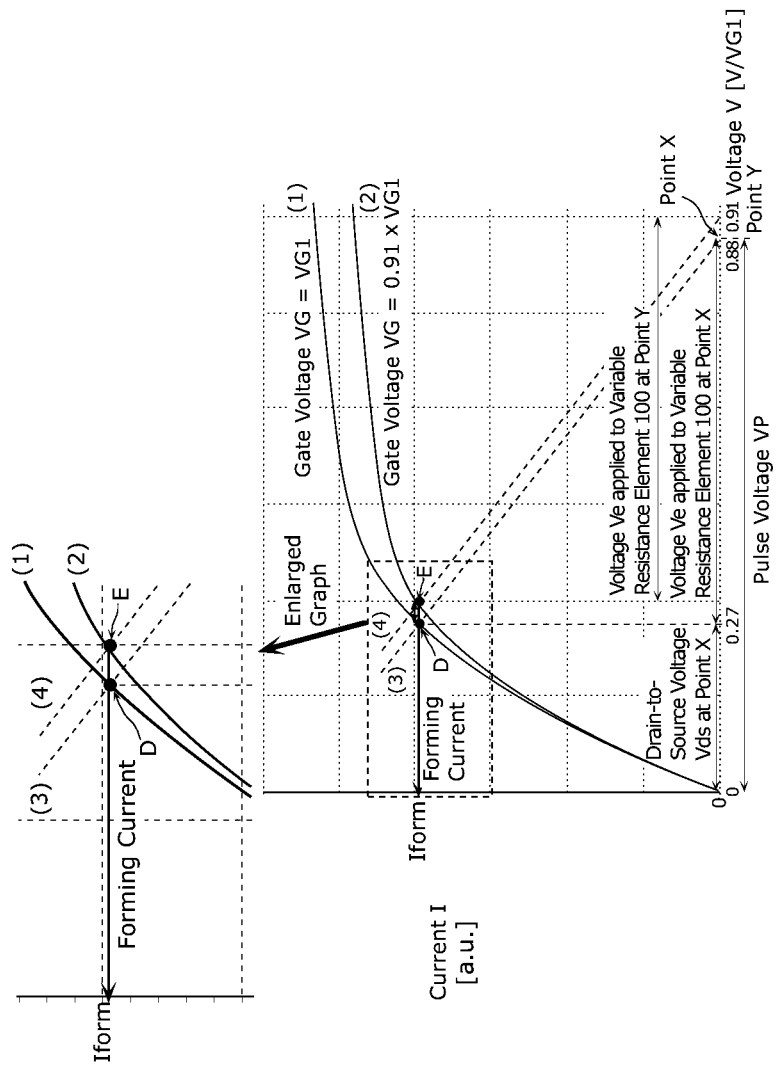
FIG. 8 is an operation point analysis graph for examining an operation point in the forming according to the embodiment of the present disclosure.

FIG. 8 is an operation point analysis graph for examining operation points in the forming at the point X and in the forming at the point Y in FIG. 7.

Here, a curve (1) shows static characteristics of the NMOS transistor 104 in the case where the gate voltage VG corresponding to the point X is VG1, and a curve (2) shows static characteristics of the NMOS transistor 104 in the case where the gate voltage VG corresponding to the point Y is 0.91×VG1. In addition, a straight line (3) shows load characteristics of the variable resistance element 100 which correspond to the point X, a straight line (4), which has the same slope as that of the straight line (3), shows load characteristics of the variable resistance element 100 which correspond to the point Y. Respective crosspoints between the static characteristics and the load characteristics of the NMOS transistor 104 and properties are shown as a D point and an E point. The D point and the E point correspond to operation points of the NMOS transistor 104 and the variable resistance element 100 in forming.

Here, the straight lines (3) and (4) are determined in the following manner. As described above, it is considered that the same voltage Ve between terminals of the variable resistance element 100 is applied at each of the points X and Y, and that the same current flows at each of the points X and Y. In other words, the graph is plotted by adjusting the slopes of the straight lines (3) and (4) so that the points D and E have the same current value.

It is shown in FIG. 8 that forming operations at the points X and Y have the same forming current Iform, and the same voltage Ve between terminals of the variable resistance element 100. That is, it is leaned that in order to perform forming in an average forming time period Tform, the forming current Iform is necessary and a voltage between terminals A and B of the variable resistance element 100 is Ve.

Figure 9:
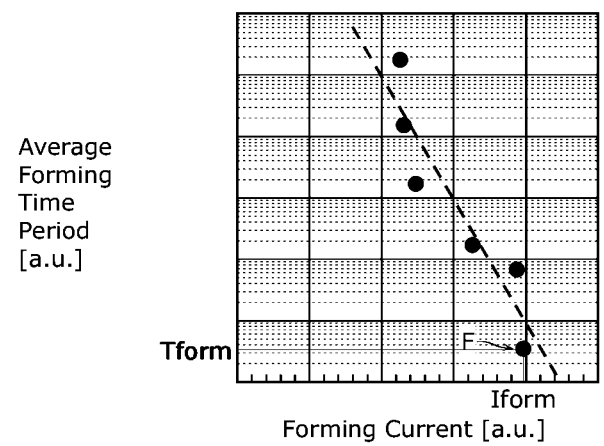
FIG. 9 is a graph plotting a relationship between an average forming time period and a forming current regarding a variable resistance nonvolatile memory device according to the embodiment of the present disclosure.

FIG. 9 is a graph plotting a relationship between a forming current and an average forming time period from an average forming time period corresponding to a voltage VP of each voltage pulse shown in FIG. 7 by the above-described technique. The vertical axis indicates the average forming time period (log scale), and the horizontal axis indicates the forming current. A point F in FIG. 9 corresponds to a point with the forming current Iform and the average forming time period Tform which are determined above.

As shown in FIG. 9, the following characteristics of the average forming time period of the variable resistance element 100 including the upper electrode 100c that is made mainly of Ir are newly observed. When a forming current is greatly driven, the average forming time period is decreased in an exponential manner. More specifically, the variable resistance element according to the present disclosure has characteristics in that if a voltage pulse having a voltage equal to or higher than a predetermined voltage having a positive polarity for the upper electrode 100c with reference to the lower electrode 100*a* in an initial state, and the voltage is kept being applied for a predetermined time duration, forming occurs. In addition, the variable resistance element according to the present disclosure has characteristics in that if a current flowing in the variable resistance element is increased, a time required to complete the forming is decreased in an exponential manner.

Figure 10:
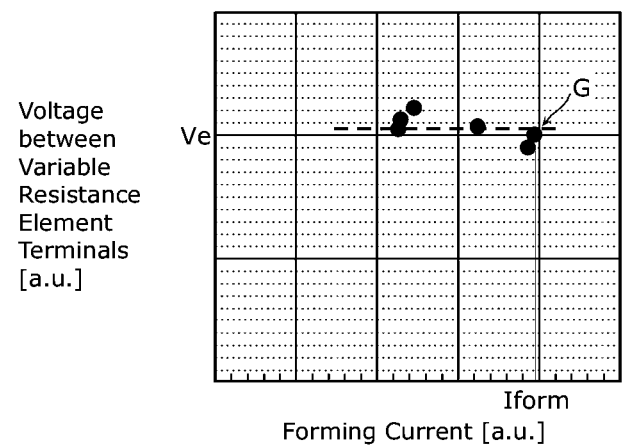
FIG. 10 is a graph plotting a relationship between a voltage Ve between variable resistance element terminals and a forming current according to the embodiment of the present disclosure.

FIG. 10 is a graph plotting a relationship between a forming current and a voltage Ve between variable resistance element terminals which are determined from an average forming time period corresponding to a voltage VP of each voltage pulse shown in FIG. 7 by the above-described technique. The vertical axis indicates the voltage Ve between variable resistance element terminals, and the horizontal axis indicates the forming current. A point G in FIG. 10 corresponds to the point F in FIG. 9 (the forming current Iform, the average forming time period Tform).

As shown in FIG. 10, the voltage between variable resistance element terminals in forming does not prominently depend on an amount of the current flowing in the variable resistance element 100, and has the almost constant voltage Ve. In other words, forming occurs when the voltage between terminals A and B of the variable resistance element 100 reaches a predetermined threshold voltage (here, Ve).

It is therefore learned that even if the voltage between terminals A and C of the 1T1R memory cell is increased, the voltage between terminals A and B of the variable resistance element 100 is kept in a state as if clamped by the voltage Ve.

Figure 11:
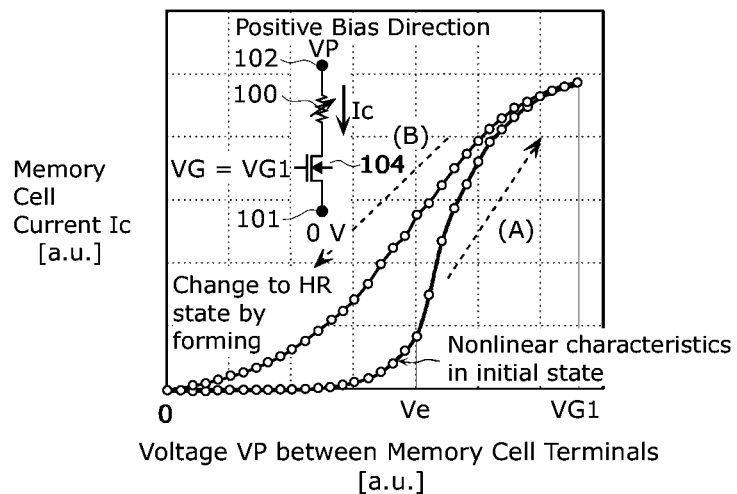
FIG. 11 is a graph plotting I-V characteristics from an initial state of a 1T1R cell according to the embodiment of the present disclosure.

FIG. 11 is a graph plotting I-V characteristics which are obtained by directly measuring currents before and after forming, by applying a voltage having an amplitude gradually increased from 0V to a voltage equal to or higher than the forming voltage, to the 1T1R memory cell shown in FIG. 39 in an initial state before the forming. The horizontal axis indicates a voltage VP applied to the 1T1R memory cell in the case of application to the upper electrode terminal 102 with reference to the lower electrode terminal 101. The vertical axis indicates a memory cell current Ic flowing in the 1T1R memory cell. Here, a gate voltage VG for forming, which is higher than the gate voltage VGw for normal writing, is applied to the gate terminal.

It should be noted that the measurement is performed by using a DC voltage source and a DC current measurement device to directly measure a forming current, and each voltage application is performed in DC state. It is considered that most of the phenomenon is the same although the forming conditions are not the same as the previously-described forming conditions in which a voltage with a predetermined pulse width is applied.

As shown in FIG. 11, if a voltage VP between memory cell terminals in a positive bias direction is increased for a memory cell in an initial state (locus A), a current hardly flows, in a region with a low voltage VP between the memory cell terminals, into the memory cell in the considerably high resistance initial state that is an almost insulating state. Furthermore, if the voltage VP between memory cell terminals is increased, a current starts flowing precipitously at a voltage close to the threshold voltage Ve explained with reference to FIG. 10, and strong non-linear current-voltage characteristics are shown.

Subsequently, the voltage VP between memory cell terminals is increased to VG1 and then gradually decreased, characteristics which returns to the origin along another locus (locusB) are shown. The slope of the locus B close to the origin shows a resistance value corresponding to a high resistance state. This means that forming is performed along this locus. As expected from a direction of applying the voltage, it is learned that the resistance state is changed from the initial state to a high resistance state.

Although detailed explanation is not given, it is not always necessary to increase the voltage VP between memory cell terminals to VG1. Even if the voltage VP between memory cell terminals is increased to a voltage (for example, a voltage of approximately 90% of VG1) that is slightly lower than VG1 and then decreased, it is confirmed that forming is performed along a locus different from the locus A and the resistance state is set to a high resistance state.

On the other hand, if the voltage VP between memory cell terminals is increased to a voltage (for example, a voltage of approximately 110% of the threshold voltage Ve), which is slightly higher than the threshold voltage Ve at which a current precipitously flows on the locus A, and then decreased, it is confirmed that forming is performed along the locus A and the forming has not been performed completely.

This is considered as follows.

The measurement shown in FIG. 11 is executed by the DC voltage application-current measurement device. In the case of a general DC voltage application-current measurement device, each measurement requires 1 ms to 10 ms. Based on the relationship described with reference to FIG. 9, a forming current, which can cause forming in an average forming time period ranging from 1 ms to 10 ms, is determined. If such forming current is assumed to be Iform0, based on the measurement result in FIG. 11, it is expected that forming occurs by increasing the voltage VP between memory cell terminals to a voltage, which exceeds the threshold voltage Ve and also exceeds a voltage that causes the forming current Iform0 to flow in the memory cell.

More specifically, in FIG. 11, since a voltage of approximately 110% of the threshold voltage Ve does not exceed the voltage causing the forming current Iform to flow in the memory cell, the voltage is not enough to cause forming.

Moreover, in the explanation with reference to FIG. 8, it is assumed for simple description that current-voltage characteristics of the variable resistance element are linear characteristics (ohmic characteristics). However, in practice, the current-voltage characteristics are nonlinear characteristics as shown in FIG. 11. However, in the consideration with reference to FIG. 8, the characteristics of the variable resistance element 100 are the same, and they are shifted in a horizontal direction to calculate operation points of the NMOS transistor 104 so that the crosspoints D and E have the same current. It is therefore considered that whether the characteristics of the variable resistance element are linear or nonlinear does not affect the results.

Thus, the characteristics to be considered in using the forming method of the relevant disclosure in a 1T1R memory cell are summarized as blow.

In a memory cell using the NMOS transistor 104 having the structure as shown in FIG. 39 as an example of a switch element, it is considered that a predetermined voltage is applied to the high-resistance second tantalum oxide layer 100*b*-2 in contact with the upper electrode 100*c*, which is made of an electrode material that easily causes resistance changing, so as to perform forming, and that a refine filament path (namely, a conducting path) is thereby formed in the second tantalum oxide layer 100*b*-2 and resistance is changed.

Even in the case where the upper electrode 100*c* is made of Ir, the variable resistance element 100 in an initial state is in a considerably high resistance state. However, the variable resistance element 100 has characteristics by which a current suddenly flows in the variable resistance element 100 at application of a voltage equal to or higher than a predetermined voltage. However, forming is not completed only by applying a voltage equal to or higher than the predetermined voltage. By keeping causing a forming current to flow over a predetermined time, a filament path is generated and forming is completed.

Moreover, a relationship between this forming current and the forming time period has a great dependency so that, for example, if the forming current is doubled, the forming time period is decreased to approximately 1/10000.

If the above-described characteristics are used, designing of a memory cell including a switch element and operation of the forming can be performed more appropriately in the following manner.

The initial state is a state where the variable resistance element is in a considerably high resistance state. Therefore, a current flowing in the memory cell in the initial state is considerably small. For example, if the NMOS transistor 104 is used as a switch element, a voltage decrease is small in the NMOS transistor 104. Therefore, a direction of flowing a current does not produce a large difference.

However, in the variable resistance element 100, which includes the upper electrode material in which a large current, such as Ir, flows in non-linear manner even in the initial state of the variable resistance element 100 when a voltage equal to or higher than a predetermined voltage is applied, the NMOS transistor 104 can drive more current in a direction not increasing the source voltage of the NMOS transistor 104, namely, in a direction of applying a positive voltage to the upper electrode terminal 102 with reference to the lower electrode terminal 101. As a result, a forming time period can be shortened. This is because, as described earlier, negative substrate bias effects do not occur in the NMOS transistor 104.

It should be noted that if a bi-directional diode is used as a switch element, a forming time period can be decreased by performing forming in a direction of increasing current driving performance, but it is also possible to perform forming either in high resistance writing direction or in low resistance writing direction if the current-voltage characteristics are symmetry.

Moreover, if an area of the variable resistance element 100 is designed or manufactured to be smaller, a current density of a current flowing in the variable resistance element 100 is relatively increased even if the size of the switches (for example, transistors) is not changed. As a result, a forming time period can be decreased.

In addition, forming can be controlled by a forming time period and a forming current. Therefore, it is desirable to design a switch element (transistor) in a memory cell to be as small as possible if the memory is to have more capacity and higher integration. In this case, forming is possible by application of a pulse adjusted with an appropriate pulse time for achieving forming. Here, although the forming time period is increased, the forming is necessary only once prior to data writing in a product inspection step. Therefore, it is possible to offer a low-cost memory device without affecting performance of the product. This technique will be described in detail later.

On the other hand, if the small-capacity use or the memory size does not directly effect, a size of a switch element (transistor) in a memory cell is designed to be appropriately large. Therefore, the current performance of the transistor is increased, and the forming time period can be increased.

Figure 12:
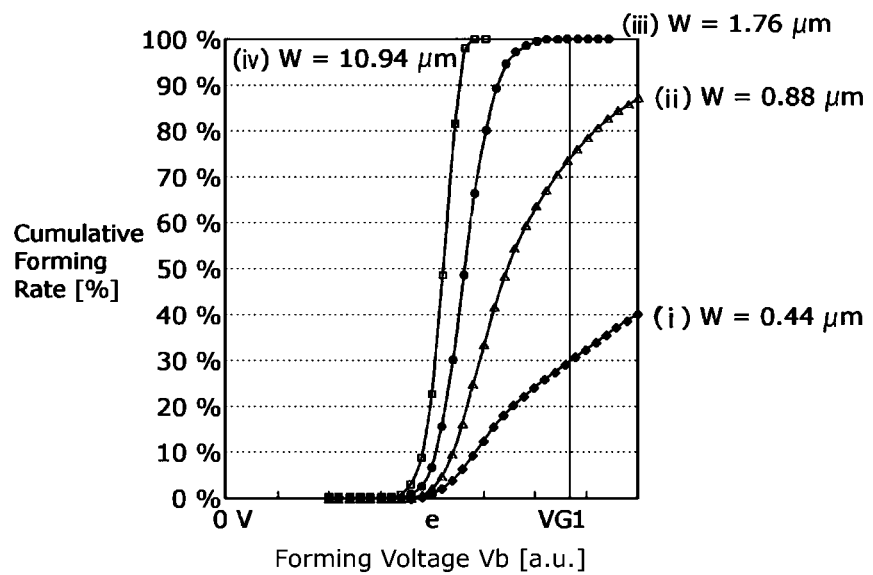
FIG. 12 is a graph plotting a dependency of a selection transistor gate width in a cumulative probability distribution of a forming voltage Vb of a variable resistance element (upper electrode Ir) according to the embodiment of the present disclosure.

FIG. 12 shows a cumulative probability distribution graph of a forming voltage Vb (with a pulse width for normal writing) in a nonvolatile memory device in which memory cells are arranged in an array. The memory cells include the respective NMOS transistors 104 as switch elements having gate widths W, such as (i) 0.44 μm, (ii) 0.88 μm, (iii) 1.76 μm, and (iv) 10.94 μm, respectively. The horizontal axis, the vertical axis, and the measurement method are the same as described with reference to FIG. 41, so that they are not described in detail.

As shown in FIG. 12, as the gate W of the NMOS transistor 104 that is a selection transistor in the 1T1R memory cell is increased, a current available for the variable resistance element 100 in forming is increased. For example, if the gate width W is (iii) 1.76 μm or more, a cumulative forming ratio can be achieved to 100% at a positive forming voltage pulse with the same pulse width as that for normal writing.

(Resistance Change Characteristics of a Memory Cell after Forming According to the Relevant Disclosure)

As described above, the forming method according to the relevant disclosure has been described, and it has been observed that the forming method relates to resistance change characteristics after the forming. The following describes (a) the above-described typical forming and (b) forming according to the present embodiment in which forming conditions are changed.

Figure 13:
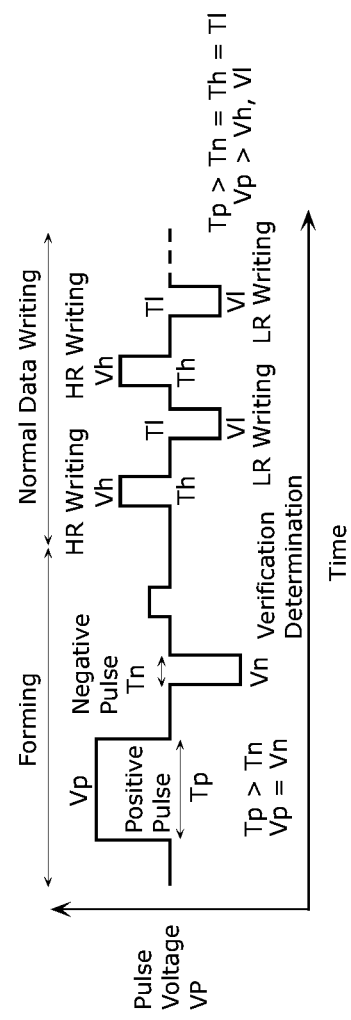
FIG. 13 is a time chart showing a voltage waveform of a voltage pulse applied to a memory cell in forming and in normal data writing for a 1T1R memory cell according to the embodiment of the present disclosure.

FIG. 13 is a time chart showing a voltage waveform of a voltage pulse applied to a memory cell in forming and in normal data writing for the 1T1R memory cell shown in FIG. 39 including the variable resistance element 100 having the upper electrode 100c made of Ir. The vertical axis indicates a voltage VP of a voltage pulse applied between the upper electrode terminal 102 and the lower electrode terminal 101 of the memory cell of FIG. 39. The horizontal axis indicates a time. In the time chart, a direction of applying a voltage pulse of a voltage higher than that of the lower electrode terminal 101 to the upper electrode terminal 102 with reference to the lower electrode terminal 101 is defined as a positive voltage pulse, while a direction of applying a voltage pulse of a voltage higher than that of the upper electrode terminal 102 to the lower electrode terminal 101 is defined as a negative voltage pulse.

In forming using the voltage pulse having the waveform shown in FIG. 13, for the memory cell in the initial state as shown in FIG. 39, first, the gate voltage VG1 (gate voltage enough to cause the transistor ON) is applied to the gate terminal of the memory cell transistor, and a voltage pulse having a voltage Vp (=VG1) and the pulse width Tp (here, the lower electrode terminal 101 has a ground potential) is applied to the upper electrode terminal 102, and the first positive voltage pulse having the amplitude VP is applied to the upper electrode terminal 102.

Next, when the gate voltage VG1 is applied to the gate terminal, and a voltage pulse having a voltage Vn (=VG1) and a pulse width Tn (<Tp) is applied to the lower electrode terminal 101 (here, the upper electrode terminal 102 has a ground potential), a negative voltage pulse having an amplitude VP is applied to change the resistance state to nearly a low resistance (LR) state which facilitates verification determination as to whether or not a cell current relatively flows to complete forming.

After that, the verification determination is made. If it is determined that the state of the variable resistance element 100 is changed to nearly LR state, then the forming is ended. On the other hand, if forming has not been completed, then the application (forming) of the positive voltage pulse (second positive voltage pulse), the application of the negative voltage pulse, and the verification determination are repeated.

The example shown in FIG. 13 shows the situation where the application of the first positive voltage pulse completes forming. After the forming success, in normal writing (alternate writing between HR writing and LR writing), (i) the gate voltage VGw (<VG1) is applied to the gate terminal 103, (ii) a voltage pulse having a voltage Vh (<Vp) and a pulse width Th, namely, a positive voltage pulse having an amplitude Vh (high resistance writing voltage pulse), is applied to the upper electrode terminal 102 (here, the lower electrode terminal 101 has a ground potential) so as to change the state of the variable resistance element 100 to a high resistance, (iii) the gate voltage VGw is applied to the gate terminal, and (iv) a voltage pulse having a voltage V1 (=VG1) and a pulse width T1, namely, a negative voltage pulse having an amplitude V1 (low resistance writing voltage pulse) is applied to the lower electrode terminal 101 (here, the upper electrode terminal 102 has a ground potential), so as to change the state of the variable resistance element 100 to a low resistance. In low resistance writing, the memory cell transistor (NMOS) is connected to a source follower and has resistance higher than that in high resistance writing, and an actual voltage applied in low resistance writing to the variable resistance element 100 is equal to or lower than the voltage in high resistance writing. After that, positive voltage pulse application and negative voltage pulse application are alternately repeated to enable data writing.

(New Problem Occurred in the Forming According to the Relevant Disclosure)

Figure 14:
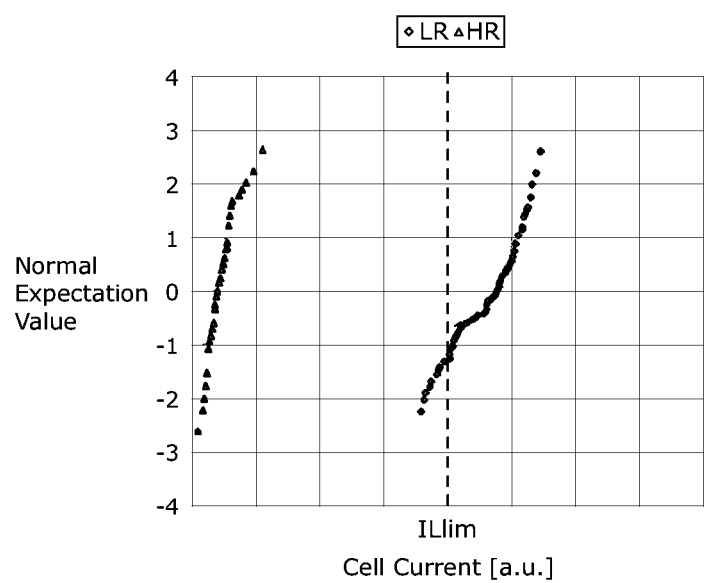
FIG. 14 is a graph plotting cell current distribution in a high resistance state (HR) and in a low resistance state (LR) of a 1T1R memory cell according to the embodiment of the present disclosure.

FIG. 14 is a normal probability distribution chart (Weibull plot) of a cell current in the case where a plurality of 1T1R memory cells, for which forming has been completed (successful) in FIG. 13, are set to in a high resistance (HR) state and a low resistance (LR) state. The vertical axis indicates a normal expectation value of Weibull plot. The horizontal axis indicates, in a linear scale, a cell current in the case where a read voltage Vread is applied to the memory cells set in HR state and in LR state. In FIG. 14, forming generates a filament path in a variable resistance layer so as to allow the resistance state to be changed between a high resistance state and a low resistance state. However, a lower limit of cell current distribution in a low resistance state is lower than a standard limit ILlim, and an operation window is narrowed. As a result, a new problem of decreasing a read speed and reliability is found.

Next, the description is given for an estimation mechanism of the above-described problem of reducing a cell current in a low resistance state.

Figure 15:
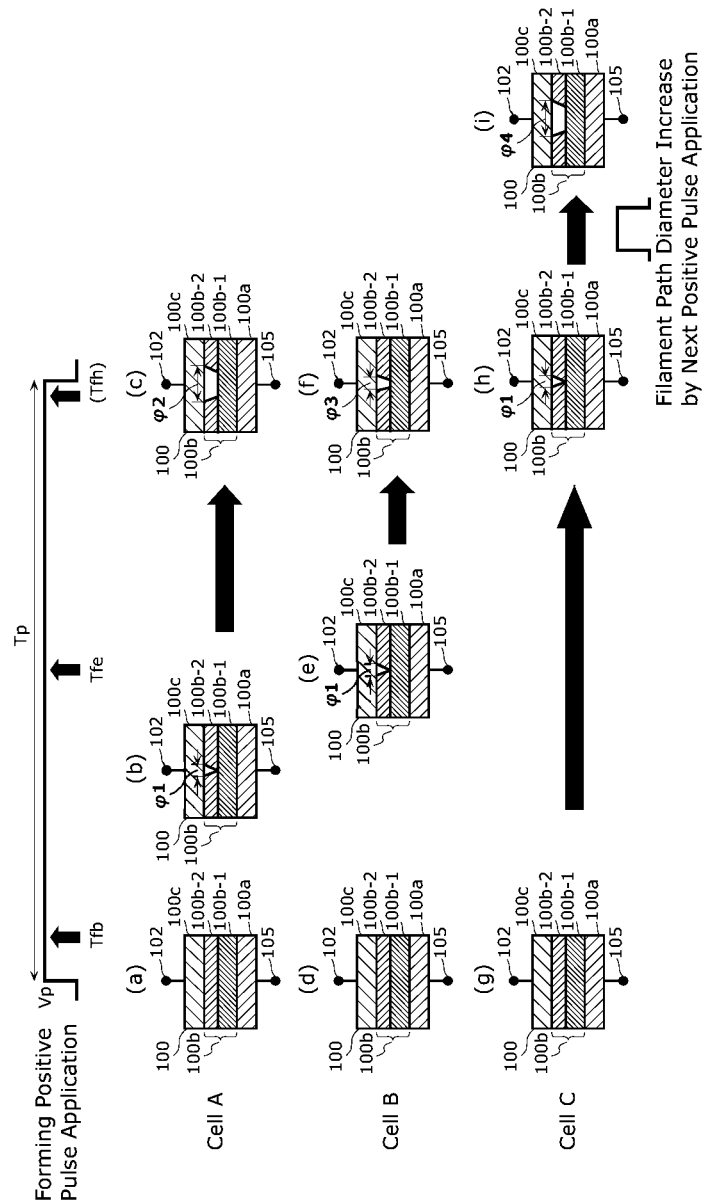
FIG. 15 is a diagram for explaining a correlation estimation mechanism between a filament path generation state and a low resistance state cell current in the forming according to the embodiment of the present disclosure.

FIG. 15 is a diagram for explaining an estimation mechanism of correlation between (i) a filament path generation state and (ii) a cell current in a low resistance state in the forming. Here, in FIG. 15, the same reference numerals of FIG. 39 are assigned to the identical units of FIG. 15, so that the identical units are not explained again below. Moreover, here, since the description is focused on a filament path generation state in a high resistance layer, the NMOS transistor 104 is not described. FIG. 15 shows a process to complete forming for each bit and a filament path generation state after the forming completion, in the case where forming is performed on certain bits (a cell A, a cell B, and a cell C) according to the forming flow shown in FIG. 5, regarding the 1T1R memory cell shown in FIG. 39.

First, the situation where forming is performed on the cell A in FIG. 15. In FIG. 15, (a) shows an initial state (namely, a state where forming has not yet been performed after manufacturing) of the variable resistance element 100 of the cell A. As shown in (b), generation of a filament path starts at a time Tfb, while a forming positive voltage pulse having a pulse width Tp and an amplitude Vp is applied. Here, a diameter of the filament path is represented as $\phi 1$. After that, the forming positive voltage pulse is kept applied, and the diameter of the filament path is increased. After the application of the positive voltage pulse, the diameter of the filament path reaches $\phi 2$ (>$\phi 1$) as shown in (c). At Step S24 of the forming flow in FIG. 5, the read current has a value grater than the reference value Ith1, and forming has been enough performed on the cell A. As a result, it is determined that the forming is completed.

Next, the situation where forming is performed on the cell B in FIG. 15. In FIG. 15, (d) shows an initial state (namely, a state where forming has not yet been performed after manufacturing) of the variable resistance element 100 of the cell B. As shown in (e), generation of a filament path starts at a time Tfe, while the forming positive voltage pulse having the pulse width Tp and the amplitude Vp is applied. Here, a diameter of the filament path is represented as $\phi 1$. After that, the forming positive voltage pulse is kept applied, and the diameter of the filament path is increased. Since a time duration from start of the filament path generation to end of the positive voltage pulse application is not enough, after the application of the positive voltage pulse, the diameter of the filament path is not enough and $\phi 3$ ($\phi 2$>$\phi 3$>$\phi 1$) as shown in (f). Here, at Step S24 of the forming flow in FIG. 5, the read current has a value slightly grater than the reference value Ith1, and forming has been performed on the cell B to the minimum. As a result, it is determined that the forming is completed.

Next, the situation where forming is performed on the cell C in FIG. 15. In FIG. 15, (g) shows an initial state (namely, a state where forming has not yet been performed after manufacturing) of the variable resistance element 100 of the cell C. As shown in (h), generation of a filament path starts at a time Tfh, nearly when the application of the forming positive voltage pulse having the pulse width Tp and the amplitude Vp is ended. Immediately after that, the application of the positive voltage pulse is ended. Here, a diameter of the filament path is represented as $\phi 1$.

Here, at Step S24 of the forming flow in FIG. 5, the read current has a value smaller than the reference value Ith1, and it is determined that forming has not yet been completed. A next positive voltage pulse having a pulse width longer than the pulse width Tp is applied to increase the diameter of the filament path. After the application of the next voltage pulse, in FIG. 15, as shown in (i), the diameter of the filament path reaches $\phi 4$ (>$\phi 2$>$\phi 1$), and at Step S24 of the forming flow in FIG. 5, the read current has a value greater than the reference value Ith1. Therefore, forming is enough performed on the cell C.

As described above, since a start time of the filament path generation is distributed temporally and continuously, as long as the forming flow shown in FIG. 5 is performed, a cell having an inadequate filament path diameter occurs stochastically as shown in (e) and (f) of FIG. 15, and it is expected that a cell current in a low resistance state is decreased in a certain memory cell in the array.

It should be noted that the estimation mechanism of correlation between a filament path generation state and a low resistance state cell current in forming in the case of an oxygen-deficient tantalum oxide as a variable resistance layer has been described above. However, it is considered that even for a variable resistance nonvolatile memory element using an oxygen-deficient transition metal oxide, there is correlation between a filament path generation state and a low resistance state cell current in forming according to the same estimation mechanism.

The present disclosure addresses the above-described situations. The present disclosure offers a variable resistance nonvolatile memory element forming method and a variable resistance nonvolatile memory device performing the forming method which are capable of offering the effects of the relevant disclosure, by which a forming voltage can be set to lower than a conventional one, and variations of the forming voltage depending on each of variable resistance elements can be reduced, and also capable of offering another effect by which a cell current in a low resistance state can be increased.

The following describes the forming method and the variable resistance nonvolatile memory device performing the forming method according to the present disclosure in detail.

(Forming Method According to Embodiment 1)

Figure 16:
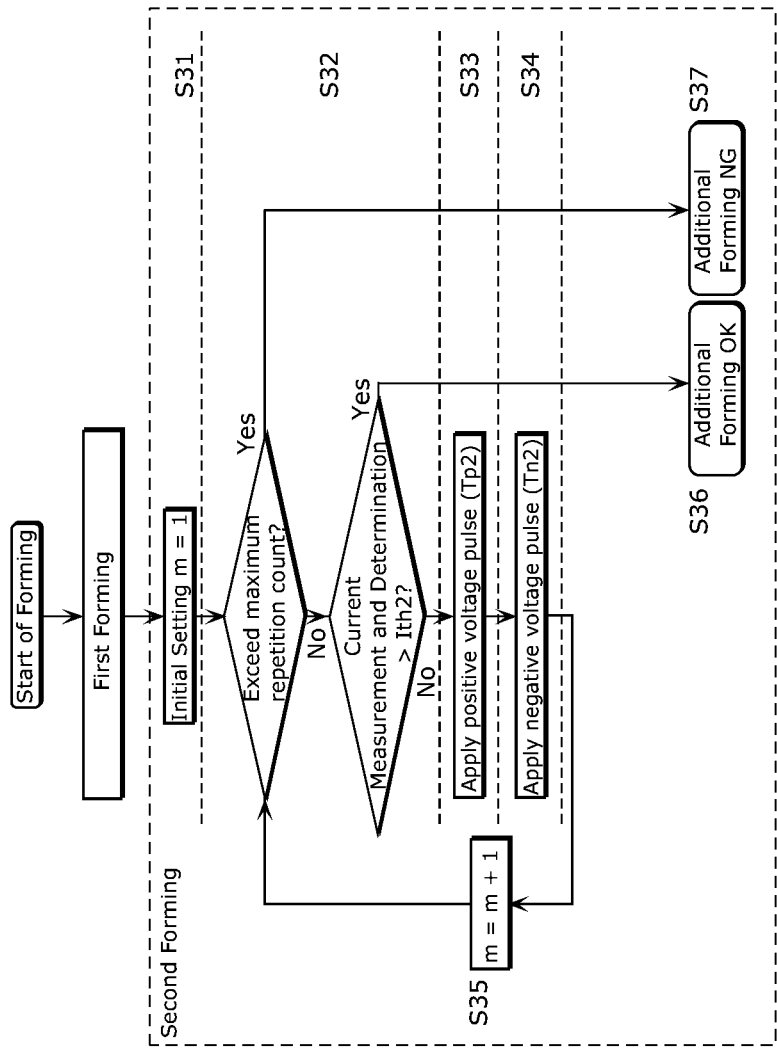
FIG. 16 is a flowchart of new forming capable of increasing a low resistance state cell current in a memory cell array according to the embodiment of the present disclosure.

FIG. 16 is a flowchart of new forming capable of increasing a low resistance state cell current in a 1T1R memory cell array according to Embodiment 1 of the present disclosure. Since the first forming processing shown in FIG. 16 is the same as the forming flow shown in FIG. 5, the first forming processing is not described again below.

The forming flow shown in FIG. 16 includes the first forming processing and the second forming processing. On the 1T1R memory cell shown in FIG. 39 for which the first forming processing shown in FIG. 5 is properly ended (S26), the second forming processing is performed. The second forming processing (additional forming) of the present disclosure includes four steps of Steps S31 to S34. The second forming processing aims to perform the additional forming on a memory cell including the variable resistance element 100 having an inadequate filament path diameter after completion of the first forming, so as to increase the filament path diameter, and thereby increasing a cell current in a low resistance state. Hereinafter, the first forming processing is referred to simply as "forming", and the second forming processing is referred to as "additional forming".

At Step S31, initial setting is performed. At Step S31, forming is completed for the variable resistance element 100 in the first forming processing, and the variable resistance element 100 is in a low resistance state where it is confirmed that a cell current has a value greater than the reference value Ith1. In addition, for the initial setting, the count m of repetitions of the additional forming (hereinafter, referred to as "additional forming repetition count m") is set to 1.

Step S32 is a determination step. At Step S32, first, it is determined whether or not the additional forming repetition count m is equal to or smaller than a repetition count maximum value. If the additional forming repetition count m is equal to or smaller than the repetition count maximum value, then it is determined whether or not a next cell current (LR current) in a low resistance state is larger than the reference value Ith2 (>Ith1).

Here, while a current measurement source is connected to the lower electrode terminal 101 (or the upper electrode terminal 102) and a read voltage Vread is applied to the lower electrode terminal 101 (or the upper electrode terminal 102) with reference to the upper electrode terminal 102 (or the lower electrode terminal 101), a current flowing from the lower electrode terminal 101 (or the upper electrode terminal 102) to the upper electrode terminal 102 (or the lower electrode terminal 101) is measured. Here, a forming gate voltage VG1, which causes a transistor to be in an ON stare, is applied to the gate terminal 103.

Then, if the read current has a value greater than the reference value Ith2 (in other words, it can be determined that the variable resistance element 100 is in an enough low resistance state), then it is determined that the additional forming is completed (successful), and the additional forming flow is ended (S36). On the other hand, if the read current has a value smaller than the reference value Ith2, then it is determined that the additional forming has not yet been competed, and the processing proceeds to Step S33.

Step S33 is an additional voltage application step. At S33, an additional positive voltage pulse is applied once between the lower electrode terminal 101 and the upper electrode terminal 102. Here, the forming gate voltage VG1 is applied to the gate terminal 103. The additional positive voltage pulse is a forming pulse in HR writing direction of applying a positive voltage to the upper electrode terminal 102 with reference to the lower electrode terminal 101. As the additional positive voltage pulse, a voltage pulse having a pulse width Tp2 (fixed value) longer than the pulse width for normal writing and a voltage Vp (=VG1) is used.

As the pulse width Tp2, for example, an intermediate value of a plurality of pulse widths prepared for the pulse width at Step S22 (in the example of Table 1, Tp(7)=10 μs) may be used.

Step S34 is preparation for the determination step. At Step S34, an additional negative voltage pulse is applied once between the upper electrode terminal 102 and the lower electrode terminal 101. Here, the forming gate voltage VG1 is applied to the gate terminal 103. The additional negative voltage pulse is a pulse in LR writing direction of applying a negative voltage to the upper electrode terminal 102 with reference to the lower electrode terminal 101. For example, as the additional negative voltage pulse, a voltage pulse having a pulse width Tn2 (fixed value) equal to the pulse width for normal writing and a voltage Vp (=VG1) is used. Of course, as long as the negative voltage pulse can change the resistance state of the variable resistance element to a low resistance state, the pulse width Tn2 and the voltage Vp may be different from the pulse width and the voltage for normal writing.

After that, the processing proceeds to Step S35 to increment the additional forming repetition count m, and the processing returns to Step S32. Then, a set of Steps S32 to S35 is repeated until it is determined at Step S32 that the additional forming is completed (successful).

On the other hand, if it is not determined at S32 that the additional forming is completed and the additional forming repetition count m exceeds the maximum value (for example, 100), then it is determined that the additional forming is NG (a memory cell with inadequate LR current) (S37).

It should be noted that at Step S33, the predetermined positive voltage required for HR writing is applied to the upper electrode terminal 102. The HR writing direction is used because it corresponds to a direction of producing smaller substrate bias effects of the NMOS transistor 104, so that a driving current of the transistor in the additional forming is increased. More specifically, by applying a positive voltage to the upper electrode terminal 102, the source of the NMOS transistor 104 has almost the same potential as that of the lower electrode side terminal C as the reference potential, so that the substrate bias effects can be prevented. Therefore, in the NMOS transistor 104, the current driving performance in applying a positive voltage to the upper electrode terminal 102 is greater than the current driving performance in applying a negative voltage to the upper electrode terminal 102.

It should also be noted that at Step S33, the additional forming is performed by applying a HR writing direction pulse to the variable resistance element 100. However, if a bi-directional diode is used instead of the transistor as a switch element (in the case of a 1D1R memory cell), it is not necessary to perform the additional forming in a direction (HR writing direction) that increases the current driving performance of the NMOS transistor. Therefore, it is possible to perform the additional forming with a pulse in LR writing direction as needed. In this case, Step S34 may be eliminated.

As described above, in the forming flow shown in FIG. 16, on the memory cell including the variable resistance element 100 having an inadequate filament path diameter for which forming is completed by the first forming processing, the additional forming is performed by setting the reference value Ith2 for the current determination at Step S32 to (i) be greater than the reference value Ith1 for the current determination at Step S24 in the first forming processing and (ii) be equal to the current value in LR state. As a result, the filament path diameter is increased.

Figure 17:
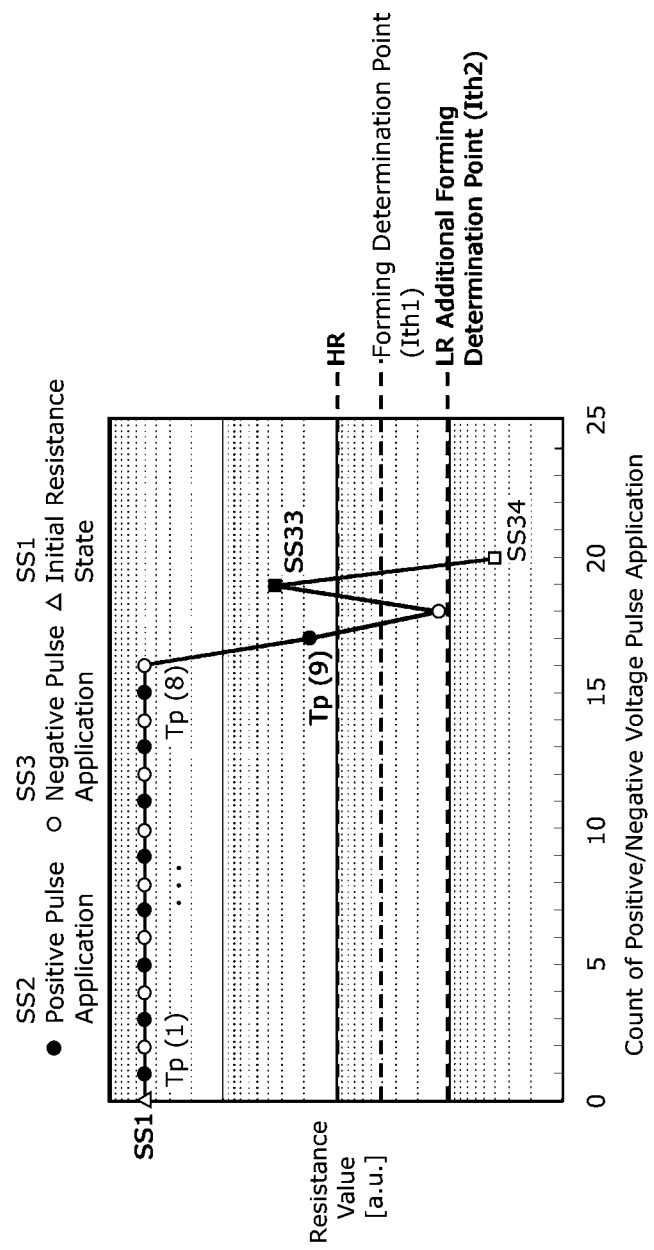
FIG. 17 is a graph plotting resistance transition in the case where forming and additional forming are performed on a 1T1R memory cell according to the forming flow according to Embodiment 1 of the present disclosure.

FIG. 17 is a graph plotting resistance transition of the variable resistance element 100 in the case where forming and additional forming are performed on a 1T1R memory cell according to the 1T1R memory cell forming flow shown in FIG. 16. The vertical axis of the graph indicates a resistance value by a log scale. The horizontal axis of the graph indicates a pulse application count. In order to clarify the resistance transition by application of a negative voltage pulse, application of the negative voltage pulse is also included in the pulse application count. However, in the first forming processing in FIG. 16, aiming to confirm effects of the additional forming, the pulse width Tp(n) of the forming positive voltage pulse is not increased according to the repetition count, which is different from the example of Table 1, and each application is fixed to 100 μs (corresponding to Tp(9) in Table 1), for example.

It should be noted that in the initial resistance state SS1 after manufacturing, the variable resistance element 100 is in a considerably high resistance state close to an insulating state.

In the first pulse application at Step S22, the first to eighth applications of pulses having pulse widths from Tp(1) to Tp(8) does not complete forming. Therefore, the variable resistance element 100 is still in a considerably high resistance state (SS2 (black circles at Tp(1) to Tp(8)) almost the same as the initial state.

At Step S23, pulse application in LR writing direction is performed. However, forming has not yet been completed at that time. Therefore, the resistance state of the variable resistance element 100 is not changed and the variable resistance element 100 is still in a considerably high resistance state (SS3 (white circles at Tp(1) to Tp(8)) almost the same as the initial state.

Therefore, in the current measurement at Step S24, a current hardly flows.

On the other hand, in the ninth pulse application at Step S22, application of a pulse having a pulse width Tp(9) of 100 μs completes forming of the variable resistance element 100, and the resistance state is changed to a high resistance state (SS2 (black circle) at Tp(9)).

Since forming is completed by the ninth pulse application (in other words, a filament path is generated) at Step S22, at Step S23, the resistance state of the variable resistance element 100 is changed close to a low resistance state (SS3 (white circle) at Tp(9)).

Since the resistance state of the variable resistance element 100 is changed close to a low resistance state at Step S23, then at Step S24, a large current corresponding to the low resistance state is detected, and it is thereby determined that the ninth pulse application at Step S22 of applying the pulse having a pulse width of 100 μs can complete forming. It should be noted that a total pulse width of 900 μs is eventually applied.

Next, in the current measurement at the first (m=1) determination step S32 in the second forming processing (additional forming), a value of a cell current in a low resistance state does not exceed the reference value Ith2 in the additional forming. Therefore, processing proceeds to Step S33.

Next, at Step S33, additional forming with a pulse having a pulse width Tp2 is performed on the variable resistance element 100. Therefore, the resistance state of the variable resistance element 100 is changed from the state SS3 to the state SS33 (black square).

Since a pulse is applied in HR writing direction at Step S33, the resistance state of the variable resistance element 100 is changed to the high resistance state (state SS33 (black square)) at the completion of the additional forming. At Step S34, on the other hand, a pulse is applied in LR writing direction. After the additional forming is performed at Step S33, a filament path is enough expanded, so that the resistance state is changed to a low resistance state SS34 (white square).

Finally at Step S32, while the current measurement source is connected to apply the read voltage Vread, a current flowing from the lower electrode terminal 101 to the upper electrode terminal 102 in the 1T1R memory cell is measured. Since the resistance state is changed to the low resistance state SS34 (white square) at Step S34, a large current corresponding to the low resistance state is detected. In this case, it is determined that the application of the positive voltage pulse having the pulse width Tp2 appropriately completes the additional forming in the first pulse application at Step S33.

Figure 18:
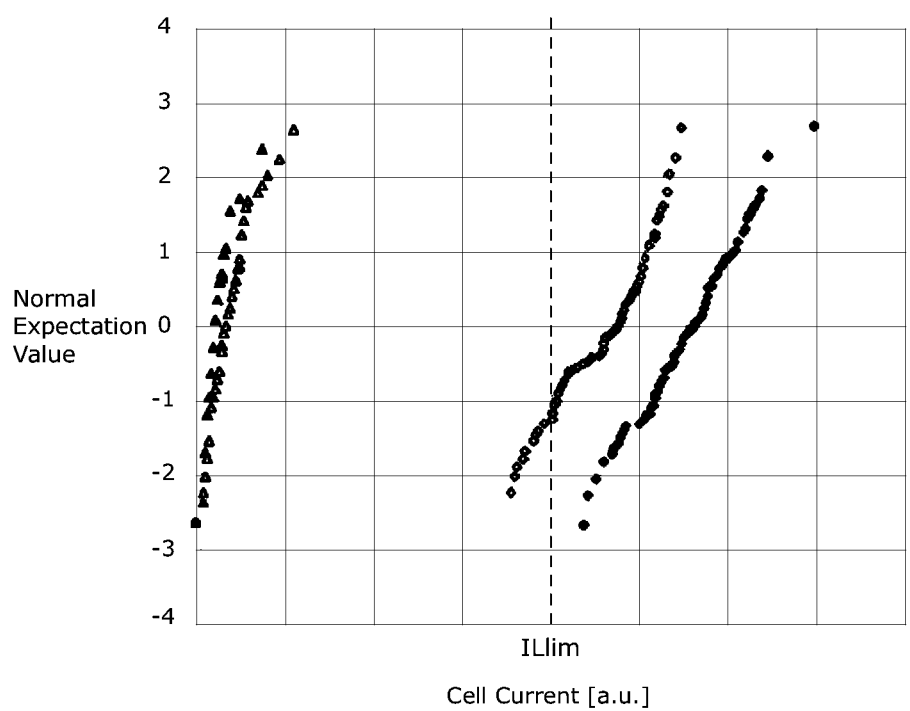
FIG. 18 is a graph plotting cell current distribution in a high resistance state (HR) and in a low resistance state (LR) of 1T1R memory cells for which forming is completed according to the embodiment of the present disclosure.

FIG. 18 is a graph plotting cell current distribution in a high resistance state (HR) and in a low resistance state (LR) of 1T1R memory cells for which forming is completed according to the forming flow in FIG. 16. FIG. 18 also shows the cell current distribution of FIG. 14 for comparison. The vertical axis and the horizontal axis of the graph are the same as those in FIG. 14.

FIG. 18 shows: LR current distribution (white rhombuses) and HR current distribution (white triangles) in the case where a filament path is generated by forming without additional forming shown in FIG. 14;

and LR current distribution (black rhombuses) and HR current distribution (black triangles) in the case where a filament path is generated by forming with additional forming shown in FIG. 16 according to the present disclosure. As seen in FIG. 18, if the additional forming is performed to eliminate memory cells having filament path with an inadequate diameter, the lower limit of the LR current distribution is increased by approximately 22% to satisfy the standard limit Minn. As a result, an operation window can be expanded. As described above, the inventors of the present disclosure have conceived the new forming technique with a high reliability.
(Embodiment 2)

Next, as Embodiment 2 of the present disclosure, the description is given for an example of the nonvolatile memory device performing the forming flow shown in FIG. 16.
(Nonvolatile Memory Device According to Embodiment 2)

Figure 19:
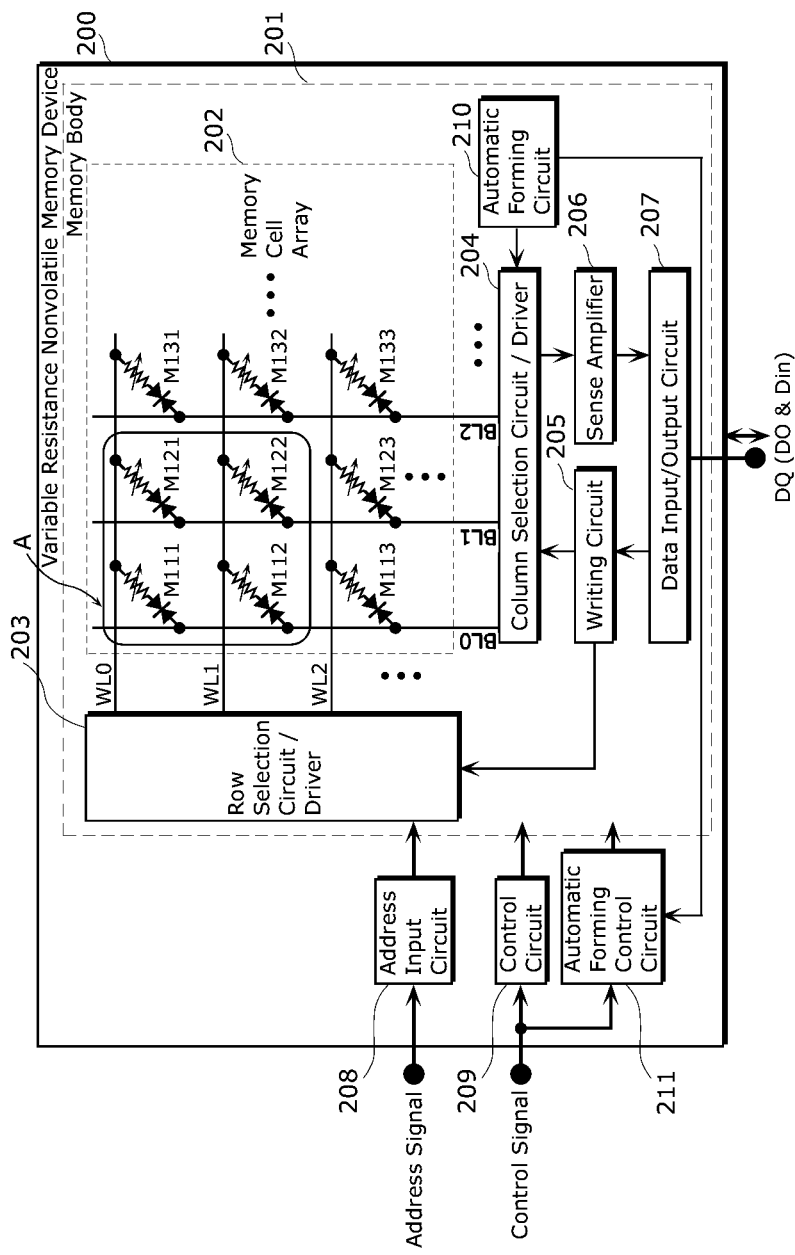
FIG. 19 is a block diagram showing a structure of a nonvolatile memory device according to Embodiment 2 of the present disclosure.
Figure 20:
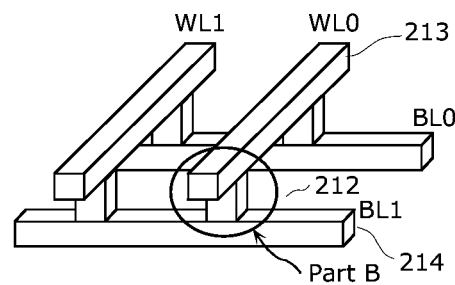
FIG. 20 is a perceptive view of a structure (structure of 4 bits) of a part A shown in FIG. 19.

FIG. 19 is a block diagram showing an example of a structure of a variable resistance nonvolatile memory device 200 (hereinafter, referred to shortly as a "nonvolatile memory device 200") according to Embodiment 2 of the present disclosure. FIG. 20 is a perceptive view of a structure (structure of 4 bits) of a part A shown in FIG. 19.

As shown in FIG. 19, the nonvolatile memory device 200 according to the present embodiment includes a memory body 201 formed on a semiconductor substrate. The memory body 201 includes: a memory cell array 202; a row selection circuit/driver 203; a column selection circuit/driver 204; a writing circuit 205 for data writing; a sense amplifier 206 that detects an amount of a current flowing in a selected bit line and thereby determines whether the data is "1" or "0"; an automatic forming circuit 210 that automatically performs forming; and a data input/output circuit 207 that receives and outputs input/output data via a terminal DQ.

The nonvolatile memory device 200 further includes: an address input circuit 208 that receives an address signal from the outside; a control circuit 209 that controls operations of the memory body 201 based on control signals provided from the outside; and an automatic forming control circuit 211 that controls operations of the memory body 201 based on control signals provided from the outside so as to perform forming on the memory cell array 202.

As shown in FIGS. 19 and 20, the memory cell array 202 includes a plurality of word lines WL0, WL1, WL2, ... and a plurality of bit lines BL0, BL1, BL2, . . . . The word lines WL0, WL1, WL2, ... are arranged in parallel to each other on the semiconductor substrate. Below the word lines WL0, WL1, WL2, ..., the bit lines BL0, BL1, BL2, ... are arranged in parallel to each other on the plane in parallel to the main plane of the semiconductor substrate, so as to cross the word lines WL0, WL1, WL2, ..., respectively.

The memory cell array 202 also includes a plurality of memory cells M111, M112, M113, M121, M122, M123, M131, M132, M133, ... (hereinafter, referred to as "memory cells M111, M112, ... ") arranged in a matrix corresponding to respective cross-points between the word lines WL0, WL1, WL2, ... and the bit lines BL0, BL1, BL2, . . . .

Here, each of the memory cells M111, M112, ... corresponds to the variable resistance element 100 shown in FIG. 39, and the upper electrode 100c of the variable resistance element 100 is made of iridium. It should be noted that in the present embodiment, each of the memory cells M111, M112, ... includes a rectifying element as a switch element as described later.

Furthermore, each of the memory cells M111, M112, ... in FIG. 19 is shown as the memory cell 212 in FIG. 20.

The address input circuit 208 receives an address signal from an external circuit (not shown). Based on the address signal, the address input circuit 208 provides a row address signal to the row selection circuit/driver 203 and a column address signal to the column selection circuit/driver 204. Here, the address signal indicates an address of a certain memory cell selected from the memory cells M111, M112, . . . . The row address signal indicates a row address of the address indicated by the address signal, and the column address signal indicates a column address of the address indicated by the address signal.

In a data writing cycle, the control circuit 209 provides the writing circuit 205 with a writing signal instructing application of a writing voltage, based on input data Din provided to the data input/output circuit 207. On the other hand, in a data reading cycle, the control circuit 209 provides the column selection circuit/driver 204 with a read signal instructing application of a read voltage.

In forming, the automatic forming control circuit 211 controls the automatic forming circuit 210, the row selection circuit/driver 203, and the column selection circuit/driver 204, so as to perform forming sequentially on the respective memory cells M111, M112, ... in the memory cell array 202.

The row selection circuit/driver 203 receives the row address signal from the address input circuit 208. Based on the row address signal, the row selection circuit/driver 203 selects one of the word lines WL0, WL1, WL2, . . . , and applies a predetermined voltage to the selected word line.

On the other hand, the column selection circuit/driver 204 receives the column address signal from the address input circuit 208. Based on the column address signal, the column selection circuit/driver 204 selects one of the bit lines BL0, BL1, BL2, ... and applies a writing voltage or a read voltage to the selected bit line, or connects the automatic forming circuit 210 to one of the bit lines BL0, BL1, BL2, . . . in forming.

When the writing circuit 205 receives the writing signal from the control circuit 209, the writing circuit 205 issues a signal instructing application of a voltage to the selected word line to the row selection circuit/driver 203, and issues a signal instructing application of the writing voltage to the selected bit line to the column selection circuit/driver 204.

In a data reading cycle, the sense amplifier 206 detects an amount of a current flowing in the selected bit line from which data is to be read, and determines whether the data is "1" or "0". The resulting output data DO is provided to an external circuit via the data input/output circuit 207.

In forming, the automatic forming circuit 210 performs forming on the memory cell selected by the automatic forming control circuit 211 from the memory cells M111, M112, . . . . After completing the forming, the automatic forming circuit 210 provides a forming success signal Vfp to the automatic forming control circuit 211.

(Structure of the Variable Resistance Element in the Nonvolatile Memory Device According to Embodiment 2)

Figure 21A:
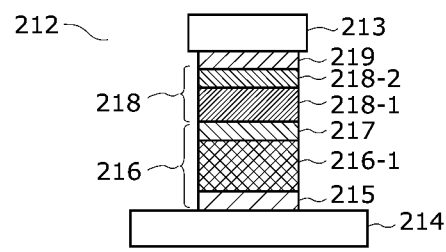
FIG. 21A is a cross-sectional view of a structure of a memory cell included in a nonvolatile memory device according to Embodiment 2 of the present disclosure.
Figure 21B:
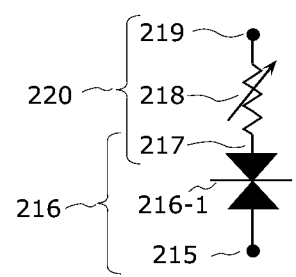
FIG. 21B is an equivalent circuit diagram of the memory cell included in the nonvolatile memory device according to Embodiment 2 of the present disclosure.

FIG. 21A is a cross-sectional view of an example of a structure of a memory cell included in the nonvolatile memory device according to Embodiment 2 of the present disclosure. FIG. 21B is an equivalent circuit diagram of the memory cell shown in FIG. 21A. FIG. 21A shows a structure of a part B shown in FIG. 20.

As shown in FIG. 21A, the memory cell 212 included in the nonvolatile memory device according to the present embodiment is provided between (a) a lower line 214 (corresponding to the bit line BL1 in FIG. 20) made of a line material such as copper and (b) an upper line 213 (corresponding to the word line WL0 in FIG. 20) also made of a line material such as copper. In the memory cell 212, there are sequentially stacked a lower electrode 215, a rectifying element 216, an internal electrode 217, a variable resistance layer 218, and an upper electrode 219. The variable resistance layer 218 includes: a low-resistance first variable resistance layer 218-1 comprising an oxygen-deficient tantalum oxide ($TaO_x$, $0<x<2.5$); and a high-resistance second variable resistance layer 218-2 comprising a tantalum oxide ($TaO_y$, $x<y$) having an oxygen deficient degree smaller than that of the first variable resistance layer 218-1 (in other words, having an oxygen content percentage higher than that of the first variable resistance layer 218-1).

The oxygen deficient degree refers to a ratio of a deficient oxygen to an amount of oxygen included in the stoichiometric composition oxygen, in each transition metal. For example, in the case where a transition metal is tantalum (Ta), since the composition of the stoichiometric oxide is $Ta_2O_5$, it can be expressed as $TaO_{2.5}$. An oxygen deficient degree of $TaO_{2.5}$ is 0%. For example, for an oxygen deficient degree of an oxygen-deficient tantalum oxide having a $TaO_{2.5}$ composition, the oxygen deficient degree=(2.5−1.5)/2.5=40%. Furthermore, an oxygen content percentage of $Ta_2O_5$, which is a ratio of oxygen to a total atom number (O/(Ta+0)), is 71.4 atm %. Therefore, the oxygen content percentage of an oxygen-deficient tantalum oxide is greater than 0 and less than 71.4 atm %.

Here, the internal electrode 217, the variable resistance layer 218, and the upper electrode 219 correspond to the lower electrode 100a, the variable resistance layer 100b, and the upper electrode 100c, respectively, in the variable resistance element 100 shown in FIG. 39.

The rectifying element 216 includes the lower electrode 215, the rectifying layer 216-1, and the internal electrode 217. The rectifying element 216 is connected in series with the variable resistance layer 218 via the internal electrode 217 comprising tantalum nitride or the like. The rectifying element 216 is a switch element represented by a diode, and has non-linear current characteristics for a voltage. Furthermore, the rectifying element 216 has bi-directional current characteristics for a voltage, and is conductive at a predetermined threshold voltage Vf (for example, ranging from +2V to −2V with reference to the other electrode).

Tantalum and tantalum oxide are materials generally used in semiconductor processes, and have very high affinity with semiconductor processes. Therefore, it is possible to easily use these materials in the existing semiconductor manufacturing processes.

The following presents desired examples where stable resistance changing characteristics are achieved by respective materials and material combinations of the internal electrode 217, the first variable resistance layer 218-1, the second variable resistance layer 218-2, and the upper electrode 219.

Assuming that the tantalum oxide composition included in the first variable resistance layer 218-1 is $TaO_x$ ($0<x<21.5$) and the tantalum oxide composition included in the second variable resistance layer 218-2 is $TaO_y$ ($x<y$), it is desirable that $0.8 \leq x \leq 1.9$, $2.1 \leq y$, and a thickness of the first tantalum oxide ranges from 1 nm to 10 nm.

The metal included in the variable resistance layer 218 may be other transition metal except tantalum. For the transition metal, tantalum (Ta), titanium (Ti), hafnium (Hf), zirconium (Zr), niobium (Nb), or tungsten (W) may be used. Since a transition metal is capable of being in various oxidation states, different resistance states can be achieved by oxidation reductive reaction.

For example, in the case of hafnium oxide, assuming that the first hafnium oxide composition included in the first variable resistance layer 218-1 is $HfO_y$, and the second hafnium oxide composition included in the second variable resistance layer 218-2 is $HfO_x$, it is desirable that $0.9 \leq x \leq 1.6$, $1.8 < y$, and a thickness of the first hafnium oxide ranges from 3 nm to 4 nm.

Furthermore, in the case of zirconium oxide, assuming that the first zirconium oxide composition included in the first variable resistance layer 218-1 is $ZrO_y$ and the second zirconium oxide composition included in the second variable resistance layer 218-2 is $ZrO_x$, it is desirable that $0.9 \leq x \leq 1.4$, $1.9 < y$, and a thickness of the first zirconium oxide ranges from 1 nm to 5 nm.

It should be noted that the first transition metal included in the first variable resistance layer 218-1 may be different from the second transition metal included in the second variable resistance layer 218-2. In this case, it is desirable that the second variable resistance layer 218-2 has an oxygen deficient degree smaller than that of the first variable resistance layer 218-1, in other words, resistance higher than that of the first variable resistance layer 218-1. With the above structure, a voltage applied between the internal electrode 217 and the upper electrode 219 in resistance changing is distributed more to the second variable resistance layer 218-2, so that oxidation reductive reaction is easily occurred in the second variable resistance layer 218-2. In addition, if the material of the first transition metal is different from the material of the second transition metal, it is desirable that a standard electrode potential of the second transition metal is lower than a standard electrode potential of the first transition metal. This is because it is considered that the resistance changing phenomenon occurs when oxidation reductive reaction occurs in a refine filament (conducting path) generated in the high-resistance second variable resistance layer 218-2 and the resistance value of the second variable resistance layer 218-2 is changed.

For example, if the first variable resistance layer 218-1 comprises an oxygen-deficient tantalum oxide and the second variable resistance layer 218-2 comprises a titanium oxide ($TiO_2$), it is possible to achieve stable resistance changing. Titanium (with a standard electrode potential=−1.63 eV) is a material having a standard electrode potential lower than that of tantalum (with a standard electrode potential=−0.6 eV). A standard electrode potential having a larger value indicates less likeliness to be oxidized. If a metal oxide having a standard electrode potential lower than that of the first variable resistance layer 218-1 is used in the second variable resistance layer 218-2, oxidation reductive reaction is more likely to occur in the second variable resistance layer 218-2.

With any of the above-described materials, the resistance changing phenomenon in the variable resistance layer having a multi-layered structure is considered to be occurred when oxidation reductive reaction occurs in a refine filament generated in the high-resistance second variable resistance layer 218-2 and the resistance value of the second variable resistance layer 218-2 is changed. More specifically, if a positive voltage is applied to the upper electrode 219 in contact with the second variable resistance layer 218-2 with reference to the internal electrode 217, it is considered that oxidation reaction occurs in a refine filament generated in the second variable resistance layer 218-2 when oxygen ion in the variable resistance layer 106 is attracted towards the second variable resistance layer 218-2, and then resistance of the refine filament is increased. On the other hand, when a negative voltage is applied to the upper electrode 219 in contact with the second variable resistance layer 218-2 with reference to the internal electrode 217, it is considered that oxygen ion in the second variable resistance layer 218-2 is pushed towards the first variable resistance layer 218-1, reductive reaction occurs in a refine filament generated in the second variable resistance layer 218-2, and then resistance of the refine filament is decreased.

The upper electrode 219 in contact with the second variable resistance layer 218-2 having a smaller oxygen deficient degree is made of a material, such as platinum (Pt) or iridium (Ir), which has a standard electrode potential higher than that of the transition metal included in the second variable resistance layer 218-2 and the material included in the internal electrode 217. With the above structure, in a part of the second variable resistance layer 218-2 which is close to the interface between the upper electrode 219 and the second variable resistance layer 218-2, oxidation reductive reaction occurs selectively, and stable resistance changing phenomenon is obtained.

The rectifying layer 216-1 included in the rectifying element 216 comprises a nitrogen-deficient silicon nitride, while the internal electrode 217 comprises tantalum nitride as described above. Here, the nitrogen-deficient silicon nitride is a nitride having composition y of nitrogen N which is less than that in a stoichiornetrically stable state, where the silicon nitride is represented as $SiN_y$ ($0<y$). Since $Si_3N_4$ is in a stoichiornetrically stable state, the case of $0<y<1.33$ can be considered as a nitrogen-deficient silicon nitride.

In the case of a tantalum nitride, when $0<y \leq 0.85$, $SiN_y$ has semiconductor characteristics and can be used for a Metal-Semiconductor-Metal (MSM) diode in which a current (for example, 10 $kA/cm^2$ or more) capable of turning enough voltage and current for resistance ON or OFF can flow.

Here, a work function of the tantalum nitride is 4.6 eV that is adequately higher than a silicon electron affinity of 3.8 eV. Therefore, a Schottky barrier is generated at the interface between the rectifying layer 216-1 and the internal electrode 217. Likewise, by using a tantalum nitride also for the lower electrode 215, a Schottky barrier is generated at the interface between the lower electrode 215 and the rectifying layer 216-1, so that the rectifying element 216 can serve as a bi-directional MSM diode.

Furthermore, in resistance change of the variable resistance element, a current having a large current density of 10 kA/cm$^2$ or more flows. A high melting point material such as tantalum and a tantalum nitride or tantalum oxide have good heat resistance, and have stable characteristics even if a current with such a large current density flows. For the above-described reasons, an electrode material of the MSM diode is desirably tantalum, titanium, tungsten, tantalum nitride, titanium nitride, tungsten nitride, tantalum oxide, or the like.

Figure 22:
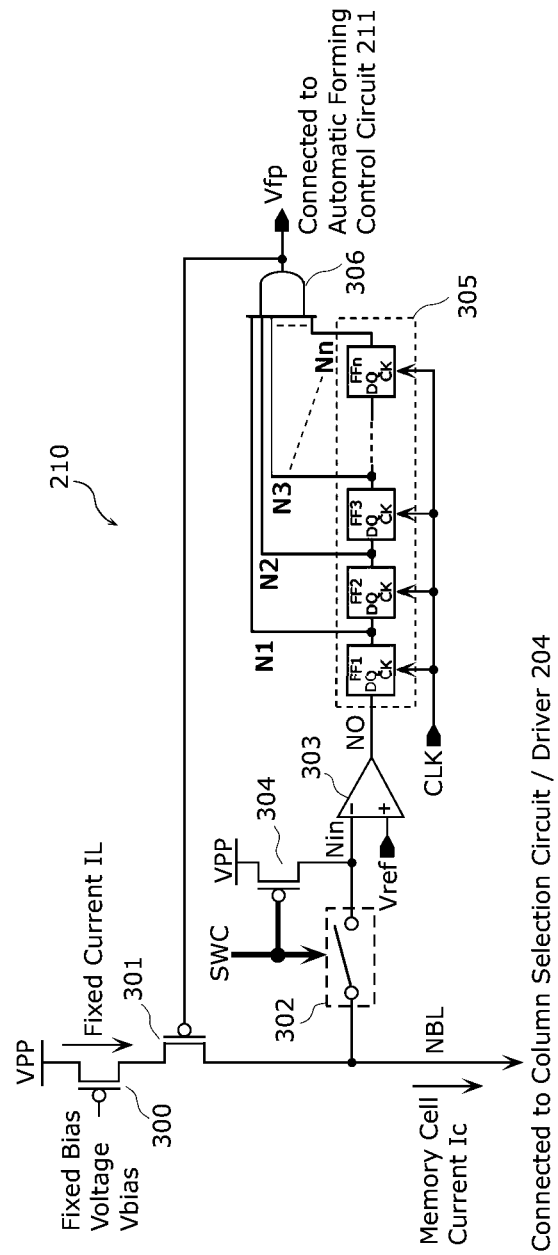
FIG. 22 is a circuit diagram showing an example of a detailed structure of an automatic forming circuit according to Embodiment 2 of the present disclosure.

FIG. 22 is a circuit diagram showing an example of a detailed structure of the automatic forming circuit 210 shown in FIG. 19. Here, there is a risk that a forming current is suddenly increased on generating a filament path by performing forming on the variable resistance element 220, which causes damages such as destroy of the memory cell 212. Therefore, the automatic forming circuit 210 should have a structure capable of performing forming while a current is limited.

Furthermore, as shown in FIGS. 3 and 4, forming in LR writing direction causes a large difference between a resistance value before the forming and a resistance value after the forming, and allows the automatic forming circuit 210 to easily detect the forming completion. Therefore, it has been described that forming is performed in LR writing direction. However, it is also possible to perform forming in HR writing direction.

The automatic forming circuit 210 includes: a PMOS transistor 300 that generates a constant current IL; a switch transistor 301 serving as a switch for connecting or disconnecting between the PMOS transistor 300 and a node NBL; a switch 302; a difference amplifier 303; a pre-charged transistor 304 for pre-charging a node Nin to a forming voltage VPP; a serial in serial out shift register circuit 305 having n stages; and an AND circuit 306. Regarding of the PMOS transistor 300, a source terminal of the PMOS transistor 300 is connected to a voltage terminal of the forming voltage VPP, a drain terminal is connected to the source terminal of the switch transistor 301, and a gate terminal receives a fixed bias voltage Vbias.

If the PMOS transistor 300 is operated in a saturated region, the PMOS transistor 300 serves as a constant current source, and supplies the constant current IL to a memory cell via the switch transistor 301, the column selection circuit/driver 204, and the bit line. A drain terminal of the switch transistor 301 is connected to the column selection circuit/driver 204 and the switch 302. A gate terminal of the switch transistor 301 receives a forming success signal Vfp that is an output of the AND circuit 306. According to the forming success signal Vfp, the switch transistor 301 can switch between a conduction state and a non-conduction state.

One terminal of the switch transistor 301 is connected to the node NBL that is connected to the drain terminal of the switch transistor 301. The other terminal of the switch transistor 301 is connected to an inverting input terminal of the difference amplifier 303 and a drain terminal of the pre-charged transistor 304. According to whether a forming enable signal SWC is active or inactive, the switch transistor 301 can switch between a conduction state and a non-conduction state.

Regarding the pre-charged transistor 304, a source terminal is connected to the voltage terminal of the forming voltage VPP, the drain terminal is connected to the note Nin that is connected to the inverting input terminal of the difference amplifier 303, and a gate terminal receives the forming enable signal SWC.

The difference amplifier 303, which receives the reference voltage Vref, performs inverting amplification for a potential of the node Nin, and the result is transmitted to the shift register circuit 305 as an amplifier output NO. The shift register circuit 305 has a structure of n stages, in which n flip-flops FF1 to FFn (where n is an integer of 2 or greater) are connected in series with each other. To a clock input terminal CK of each of the flip-flops FF1 to FFn, the same clock signal CLK is inputted from the automatic forming control circuit 211.

Furthermore, the input terminal D of the flip-flop FF1 is connected to the amplifier output NO of the difference amplifier 303, and each of outputs N1 to Nn of the respective flip-flops FF1 to FFn is connected to a corresponding input terminal of the AND circuit 306. The AND circuit 306 transmits the AND operation result of the outputs N1 to N2 to the gate terminal of the switch transistor 301 and the automatic forming control circuit 211, as the forming success signal Vfp.

As described above, the automatic forming circuit 210 applies, during forming, the constant current IL to the memory cell 212 in a considerably high initial resistance state that is close to an insulating state. If the forming generates a filament path which decreases a resistance value of the variable resistance element, a potential of the node NBL and a potential of the node Nin are lowered. IF the potentials are lower than the reference voltage Vref, the amplifier output NO becomes active, and the forming success signal Vfp becomes active after a delay time corresponding to the number n of the steps in the shift register circuit 305 and a cycle t of the clock signal CLK. As a result, the switch transistor 301 becomes non-conductive, and the forming is automatically ended.

Next, the description is given for a design principle of an appropriate reference voltage Vref of the automatic forming circuit 210.

Figure 23:
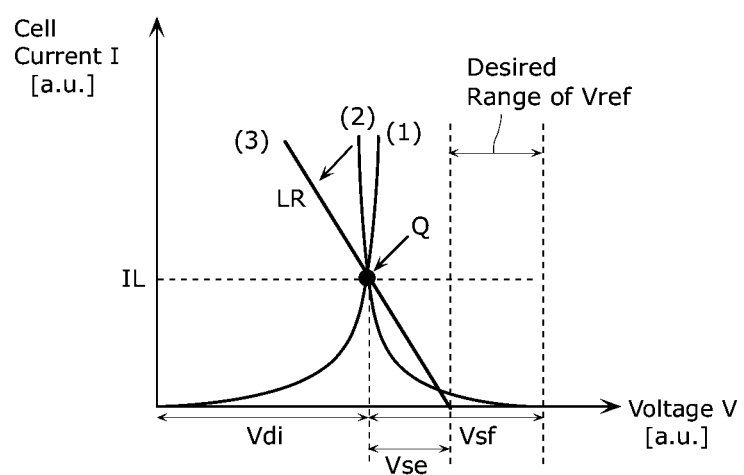
FIG. 23 is I-V characteristic schematic graph for performing operation point analysis in the case where a constant current IL is caused to flow to perform forming by using load characteristics of a rectifying element and a variable resistance element shown in FIG. 21.

FIG. 23 is an I-V characteristic schematic graph for performing operation point analysis in the case where a constant current IL is caused to flow to perform forming by using load characteristics of the variable resistance element 220 that includes the rectifying element 216 (for example, a bi-directional diode), the upper electrode 219, the variable resistance layer 218, and the lower electrode 215 shown in FIGS. 21A and 21B. The vertical axis indicates a current I (given unit), and the horizontal axis indicates a voltage V.

More specifically, FIG. 23 is the I-V characteristic schematic graph for explaining at how much degree a voltage between terminals of the variable resistance element 220 is changed before and after filament path generation, in the case where a considerably high initial resistance state, which has current non-linear characteristics and is close to an insulating state, is changed to a low resistance state, by performing forming in LR writing direction from to generate a filament path in a variable resistance layer.

In FIG. 23, a curve (1) shows load characteristics of the rectifying element 216 that is a bi-directional diode at the threshold voltage Vf. Here, the threshold voltage Vf is defined as a voltage for turning the rectifying element 216ON. For example, the bi-directional diode having symmetric voltage-current characteristics is turned ON, when a voltage ranging from +Vf to −Vf is applied to one of the electrodes with reference to the other electrode.

A curve (2) shows load characteristics in which a voltage Vsf between terminals of the variable resistance element 220 is clamped by a predetermined threshold voltage (for example, the above-described threshold voltage Ve) during the forming on the variable resistance element 220 in an initial resistance state. A straight line (3) shows load characteristics of the variable resistance element 220 in a low resistance state (LR) after completion of the forming.

Here, when the variable resistance element 220 is in an initial state close to an insulating state, if the constant current IL is applied to the memory cell 212 in the forming, an operation point of the memory cell 212 at the forming start time is a point Q (cross-point between load characteristics (1) and (2)).

Here, the voltage between terminals of the memory cell 212 is a sum of (a) a voltage Vdi between terminals of the rectifying element 216 and (b) a voltage Vsf between terminals of the variable resistance element 220. This sum voltage is applied to the inverting input terminal of the difference amplifier 303 via the bit line, the column selection circuit/driver 204, and the switch 302.

After that, a filament path is generated, and the voltage between terminals of the variable resistance element 220 is changed from the voltage Vsf to a low-resistance voltage Vse that is approximately a half of the voltage Vsf while keeping the operation point Q. Therefore, the load characteristics of the variable resistance element 220 are changed from (2) to (3), and then the forming to the low resistance state (LR) is completed.

Here, the voltage between terminals of the memory cell 212 is a sum (approximately 3.5 V) of (a) the voltage Vdi between terminals of the rectifying element 216 and (b) the voltage Vse between terminals of the variable resistance element 220. This sum voltage is applied to the inverting input terminal of the difference amplifier 303 via the bit line, the column selection circuit/driver 204, and the switch 302.

The above-described operation point analysis shows that when the automatic forming circuit 210 performs forming on the variable resistance element 220, a voltage at the inverting input terminal of the difference amplifier 303 is changed from Vdi+Vsf to Vdi+Vse. Based on the operation point analysis, in order to detect the voltage change, the reference voltage Vref is appropriately an intermediate voltage before and after the change within the desirable range shown in FIG. 23.

(Operation Example of the Nonvolatile Memory Device According to Embodiment 2)

Figure 24:
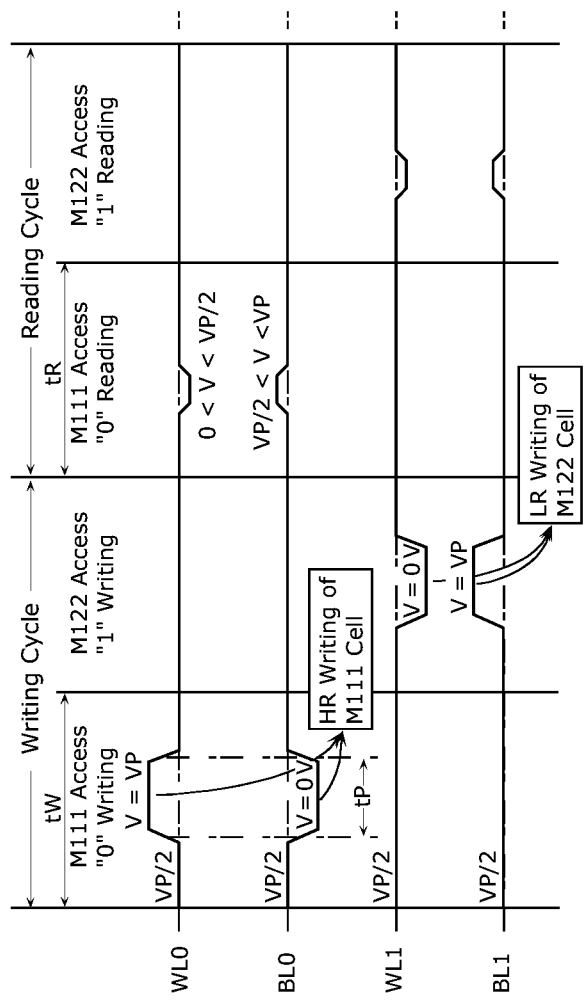
FIG. 24 is a time chart showing an operation example of the nonvolatile memory device according to Embodiment 2 of the present disclosure.

Next, with reference to a time chart of FIG. 24, the description is given for an operation example of the nonvolatile memory device according to Embodiment 2 in the case where normal operations are performed after completing the forming. The normal operations include a writing cycle during which data is written and a reading cycle during which the data is read out.

FIG. 24 is a time chart showing an example of normal writing and normal reading of the nonvolatile memory device according to Embodiment 2 of the present disclosure. Here, there is described the operation example where data "0" is assigned to the case where the variable resistance layer is in a high resistance state and data "1" is assigned to the case where the variable resistance layer is in a low resistance state. For the sake of the convenience in the description, the following describes only the situation where data is written in and read from the memory cells M111 and M122.

VP in FIG. 24 represents a voltage of a voltage pulse required to change resistance of the memory cell 212 that includes the variable resistance element 220 and the rectifying element 216. Here, it is desirable that a voltage VP/2 applied to non-selected word lines and non-selected bit lines satisfies a relationship of VP/2<Vf. Rectifying elements in the non-selected memory cells are thereby turned OFF, which can reduce a leakage current flowing around the non-selected memory cells. As a result, it is possible to suppress redundant current supplied to memory cells to which it is not necessary to write data, and therefore possible to achieve lower current consumption. There are also advantages of suppressing unintended shallow writing (generally called disturbance) to non-selected memory cells.

Furthermore, in FIG. 24, tW represents a writing cycle time required to perform the first writing cycle, and tR represents a reading cycle time required to perform the first reading cycle.

In the writing cycle for the memory cell M111, a voltage pulse VP with a pulse width tP is applied to the word line WL0, and depending on the timing, the same voltage of 0 V is applied to the bit line BL0. Therefore, a writing voltage for writing data "0" into the memory cell M111 is applied, and, as a result, the resistance state of the variable resistance layer 218 in the memory cell M111 is changed to a high resistance state. In other words, the data "0" is written to the memory cell M111.

Next, in the writing cycle for the memory cell M122, a voltage of 0 V with a pulse width tP is applied to the word line WL1, and depending on the timing, the same voltage VP is applied to the bit line BL1. Therefore, a writing voltage for writing data "1" into the memory cell M122 is applied, and, as a result, the resistance state of the variable resistance layer 218 in the memory cell M122 is changed to a low resistance state. In other words, the data "1" is written to the memory cell M122.

In the reading cycle for the memory cell M111, a reading voltage, which has a voltage pulse with an amplitude smaller than that of the writing pulse and has a value between 0 V to VP/2 is applied to the word line WL0. Furthermore, depending on the timing, a voltage, which has a voltage pulse with an amplitude smaller that of the writing pulse and has a value between VP/2 to VP is applied to the bit line BL0. As a result, a current corresponding to a resistance value of the variable resistance layer 218 in the high-resistance memory cell M111 flows. By detecting the output current value, the data "0" is read out.

Next, in the reading cycle for the memory cell M122, the same voltage as that in the reading cycle for the memory cell M111 described previously is applied to the word line WL1 and the bit line BL1. As a result, a current corresponding to a resistance value of the variable resistance layer 218 in the low-resistance memory cell M122 flows. By detecting the output current value, the data "1" is read out.

It should be noted that as shown in FIG. 24, in the case where the variable resistance layer 218 including a tantalum oxide according to the present disclosure is used, even if the electric pulse applied to between electrodes is a high-speed pulse having a pulse width of approximately 50 ns, it is possible to confirm resistance changing phenomenon. Therefore, the pulse width tP can be set to approximately 50 ns.

Since a high-speed pulse having a pulse width of approximately 50 ns can be used as described above, even in consideration of an operation time of a peripheral circuit such a control circuit of the nonvolatile memory device 200, the first writing cycle time tW can be set to approximately 80 ns. In this case, for example, if data exchange with the outside of the nonvolatile memory device 200 is performed by 16 bits via a terminal DQ of the data input/output circuit 207, a data transfer rate required to write data is 25 Mbytes per second, so that considerably high-speed writing can be achieved.

Moreover, by using a known technique such as a page mode or a burst mode, the number of parallel writing bits in the nonvolatile memory device is increased to achieve writing at a higher speed.

Regarding conventional nonvolatile memories, in the case of a NAND flash memory known as being capable of transferring data at a relatively high speed, even if the above-mentioned page mode is used, a data transfer rate required for writing is approximately 10 Mbytes per second. By this, it is possible to confirm the high-speed writing by the nonvolatile semiconductor device according to the present embodiment.

Next, the description is given for the automatic forming of the nonvolatile memory device 200 according to the present embodiment.

Figure 25:
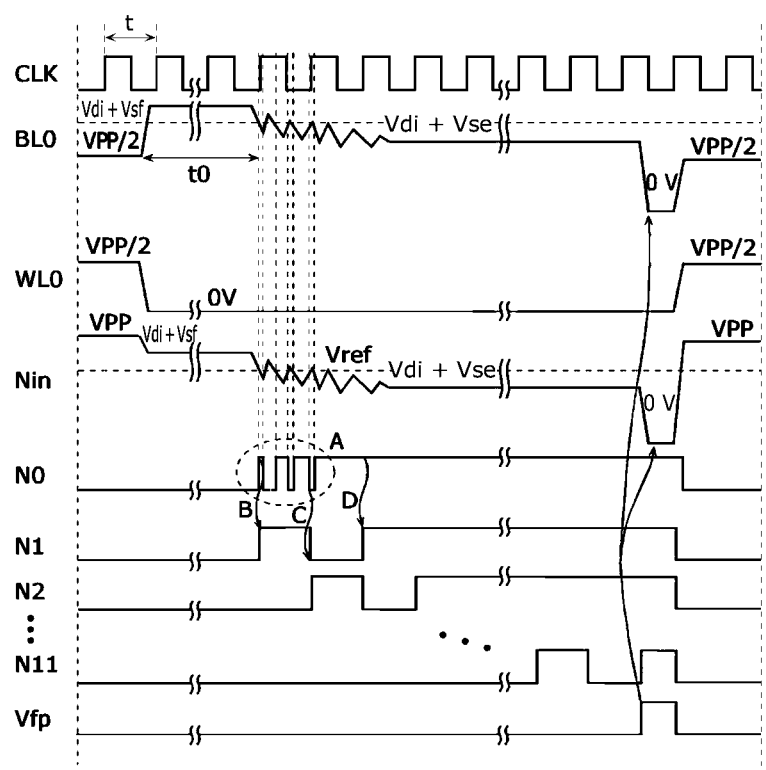
FIG. 25 is a time chart showing an automatic forming operation of the nonvolatile memory device according to Embodiment 2 of the present disclosure.

FIG. 25 is a time chart showing automatic forming of the nonvolatile memory device 200 according to Embodiment 2 of the present disclosure. The forming in FIG. 25, only one bit of the memory cell M111 selected by the automatic forming control circuit 211 is accessed, and the automatic forming circuit 210 shown in FIG. 22 is used for the bit so as to perform forming.

In FIG. 25, at the start of forming, a voltage state at the word line WL0 and the bit line BL0 of the memory cell M111 for which the forming is to be performed is VPP/2, and all of the clock signal CLK, the amplifier output NO, the outputs N1 to Nn, and the forming success signal Vfp are in L level. Furthermore, a voltage sate at the node Nin is the forming voltage VPP, and the memory cell M111 is in an initial state.

First, for the memory cell M111 in a pre-charged state, the constant current IL is applied to the bit line BL0 from the automatic forming circuit 210 via the column selection circuit/driver 204. As described with reference to FIG. 23, the voltage at the bit lint BL0 becomes Vdi+Vsf. Depending on the tinning, the voltage 0 V is applied to the word line voltage WL0. Here, regarding the node Nin, the forming enable signal SWC becomes active, and the switch 302 is in a conducting state. Therefore, the initial VPP potential is changed to Vdi+Vsf.

After that, when generation of a filament path starts after a predetermined time period t0, as shown in FIG. 4 (b), since a state is unstable immediately after the filament path generation, the diameter of the filament path is varied and getting increased (decrease of a resistance value) to be stable. Therefore, the voltage at the bit line Bl0 and the potential at the node Nin are changed from Vdi+Vsf to Vdi+Vse in a period from the start and to the end of the filament path generation. At this time, since the reference voltage Vref is set to an intermediate voltage between Vdi+Vsf and Vdi+Vse, the variation of the node Nin immediately after the filament path generation causes chattering (part A surrounded by a broken line in FIG. 25) in the amplifier output NO.

When chattering (A) occurs in the amplifier output NO, the output N1 of the flip-flop FF1 at the first stage of the shift register circuit 305 becomes in high (H) level due to the amplifier output NO in synchronization with a rising edge of a clock signal CLK, and the state of the output N1 is changed from low (L) level to H level (arrow B). After that, the flip-flop FF1 becomes in L level due to the amplifier output NO in synchronization with a rising edge of a next clock signal CLK, and the state of the output N1 is changed from H level to L level (arrow C). Furthermore, the flip-flop FF1 becomes in H level due to the amplifier output NO in synchronization with a rising edge of a next clock signal CLK, and the state of the output N1 is changed from L level to H level (arrow D).

After that, since the amplifier output NO is in H level until the forming for the memory cell M111 is completed, the output N1 is kept in H level. Furthermore, as the outputs N2 to N11 of the flip-flop FF2 to FF11, waveforms of the output N1 which are sequentially delayed by each cycle t of the clock signal CLK are propagated.

As a result, after n+1 cycle (n is the number of stages of the shift register circuit 305) immediately after the filament path generation (arrow B), all of the outputs N1 to N11 are in H level. Accordingly, the forming success signal Vfp, which is an output of the AND circuit 306, is changed from L level to H level. Therefore, the switch transistor 301 is changed in a non-conducting state, and the voltage at the bit line BL0 and the potential at the node Nin are discharged to be 0 V. As a result, the forming for the memory cell M111 is completed. After that, for forming of a next memory cell, the state is changed back to the initial pre-charged state.

It should be noted that it has been described the automatic forming focusing on the memory cell M111, but in forming on an actual array, the automatic forming control circuit 211 sequentially generates addresses by incrementing an address every time forming of a selected memory cell is completed, so as to automatically perform forming on all of the memory cells.

As described above, in the automatic forming using the automatic forming circuit 210, the constant current IL is added to the variable resistance element 220 during a time period of the n−1 times (n is the number of stages of the shift register circuit 305) as long as the cycle t of the clock signal CLK at minimum immediately after filament path generation (short filament path diameter). Therefore, the filament path diameter is increased and forming is performed enough. As a result, a cell current in a LR state in normal writing is increased.

Furthermore, even if variation (chattering) occurs during filament path generation and growing process, the use of the shift register circuit 305 in synchronization with the clock to generate the forming success signal Vfp allows adequate filament path expansion and stable path-determination without terminating forming in a state where the filament path diameter is still inadequate. Therefore, it is possible to achieve a high-speed and reliable nonvolatile memory device with the expanded operation window.

Here, chattering of the amplifier output NO does not always occur, for example, if the cycle of the clock signal CLK is long or if a time period until the filament path diameter is increased to be stable is short.

Moreover, the number n of the stages of the shift register circuit 305 and the cycle of the clock signal CLK may be adjusted appropriately depending on forming characteristics of a target variable resistance element. It should also be noted that it has been described in the present embodiment that forming is performed in LR writing direction so that a difference of the resistance value between before and after forming is large and the automatic forming circuit 210 can thereby easily detect forming completion. However, if forming completion can be detected without any problem even in forming in a positive direction, it is also possible to perform forming in a positive direction.

It should also be noted that the rectifying element 216 (for example, a bi-directional diode) serving as a switch element may be eliminated because a leakage current flowing in non-selected memory cells is small if the memory cell array size is not large.

It should also be noted that it has been described in the present embodiment that the automatic forming is performed on a cross-point memory cell array using bi-directional diodes as switch elements, but it goes without saying that the forming can be performed on a 1T1R memory cell array using MOS transistors as switch elements.

Those skilled in the art will be readily appreciated that various modifications and combinations of the structural elements in the embodiments are possible without materially departing from the scope of the present disclosure. Accordingly, all such modifications and combinations of the forming method and the variable resistance nonvolatile memory device are intended to be included within the scope of this disclosure.

(Embodiment 3)

The following describes, as Embodiment 3 of the present disclosure, the situation where the nonvolatile memory device according to Embodiment 2 does not include the automatic forming control circuit 211 and the automatic forming circuit 210 and forming is controlled from the outside of the nonvolatile memory device to be performed.

(Nonvolatile Memory Device According to Embodiment 3)

Figure 26:
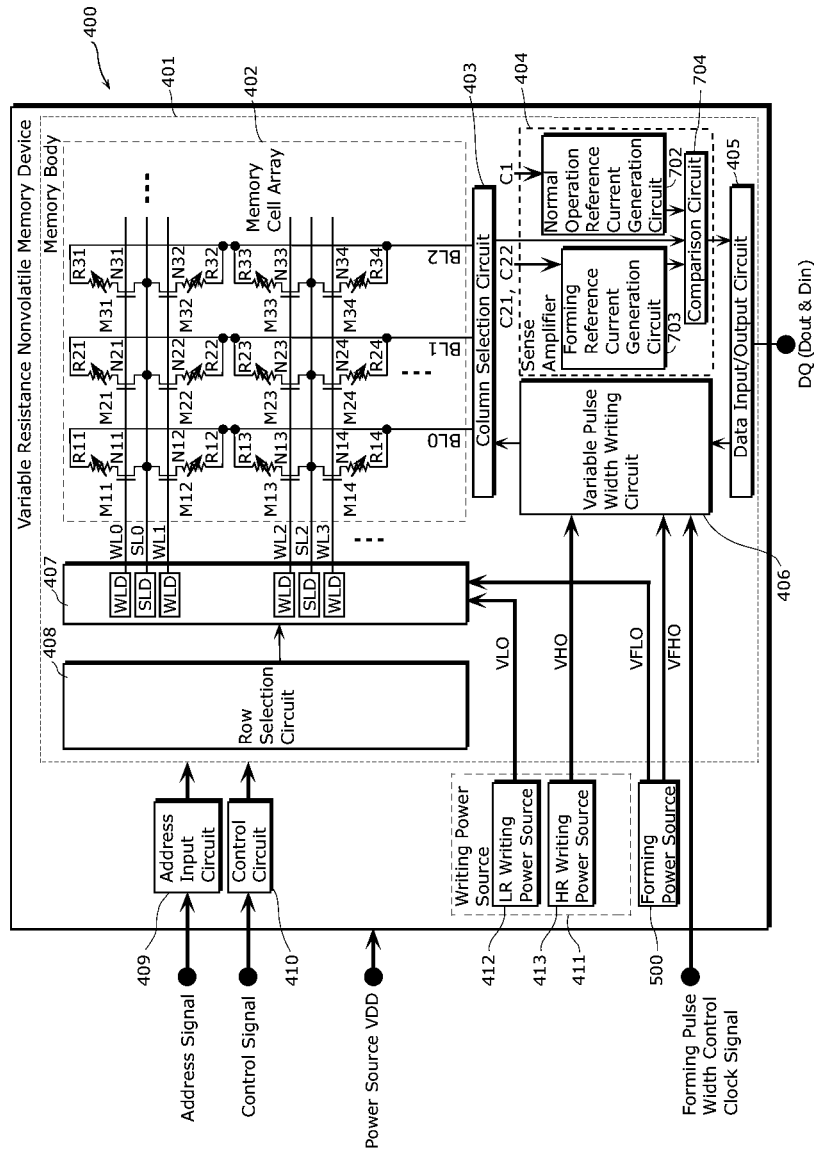
FIG. 26 is a diagram showing a structure of a variable resistance nonvolatile memory device according to Embodiment 3 of the present disclosure.

FIG. 26 is a block diagram showing an example of a structure of a variable resistance nonvolatile memory device 400 (hereinafter, referred to simply as a "nonvolatile memory device 400") according to the present embodiment.

As shown in FIG. 26, the nonvolatile memory device 400 according to Embodiment 3 includes a memory body 401 formed on a semiconductor substrate. The memory body 401 includes: a memory cell array 402 in which the 1T1R memory cells each including the upper electrode 100c made of iridium (Ir) shown in FIG. 39 are arranged in rows and columns: a row selection circuit 408; a row driver 407 including word line drivers WLD and source line drivers SLD; a column selection circuit 403; a variable pulse width writing circuit 406 that performs forming and writing; a sense amplifier 404 that detects an amount of current flowing in a selected bit line and thereby determines whether a resistance state is a high resistance state as data "0" or a low resistance state as data "1"; and a data input/output circuit 405 that receives and outputs input/output data via a terminal DQ.

The sense amplifier 404 functionally includes a forming determination unit and a normal operation determination unit. The forming determination unit determines whether or not a variable resistance nonvolatile memory element included in at least one memory cell selected from the memory cell array 402 is in a low resistance state. The normal operation determination unit determines whether the variable resistance nonvolatile memory element included in the selected memory cell is in a high resistance state or in a low resistance state. As actual circuits to implement these functions, the sense amplifier 404 includes a normal operation reference current generation circuit 702, a forming reference current generation circuit 703, and a comparison circuit 704. In other words, a set of the normal operation reference current generation circuit 702 and the comparison circuit 704 serve as the normal operation determination unit, and a set of the forming reference current generation circuit 703 and the comparison circuit 704 serve as the forming determination unit.

In addition, the nonvolatile memory device 400 includes, as the writing power source 411, a high resistance (HR) writing power source 413 and a low resistance (LR) writing power source 412, and also a forming power source 500.

The nonvolatile memory device 400 further includes: an address input circuit 409 that receives an address signal from the outside; and a control circuit 410 that controls operations of the memory body 401 based on a control signal provided from the outside.

The memory cell array 402 includes a plurality of memory cells in each of which a variable resistance nonvolatile memory element and a switch element (here, a transistor) are connected in series with each other. More specifically, the memory cell array 402 includes a plurality of word lines WL0, WL1, WL2, ... and a plurality of bit lines BL0, BL1, BL2, ..., on the semiconductor substrate. The word lines WL0, WL1, WL2, ... cross the bit lines BL0, BL1, BL2, ..., respectively. The memory cell array 402 also includes, as one example of the switch elements, a plurality of NMOS transistors N11, N12, N13, N21, N22, N23, N31, N32, N33, ... (hereinafter, referred to as "transistors N11, N12, ...") at respective cross-points between the word lines WL0, WL1, WL2, ... and the bit lines BL0, BL1, BL2, .... The memory cell array 402 further includes a plurality of variable resistance elements R11, R12, R13, R21, R22, R23, R31, R32, R33, ... (hereinafter, referred to as "variable resistance elements R11, R12, ...") each of which is connected in series with a corresponding one of the transistors N11, N12, ... to form a pair. As a result, each of the pairs serves as a corresponding one of memory cells M11, M12, M13, M21, M22, M23, M31, M32, M33, ... (hereinafter, referred to as "memory cells M11, M12, ...").

As shown in FIG. 26, gates of the transistors N11, N21, N31, ... are connected to the word line WL0, gates of the transistors N12, N22, N32, ... are connected to the word line WL1, gates of the transistors N13, N23, N33, ... are connected to the word line WL2, and gates of the transistors N14, N24, N34, ... are connected to the word line WL3.

Furthermore, all of the transistors N11, N21, N31, ... and the transistors N12, N22, N32, ... are connected to the source line SL0, and all of the transistors N13, N23, N33, ... and the transistors N14, N24, N34, ... are connected to the source line SL2.

Each of the variable resistance elements R11, R12, ... are the variable resistance element 100 shown in FIG. 39, so that they have the above-described characteristics. More specifically, each of the variable resistance elements has the following characteristics (1) to (4). (1) When a LR writing voltage pulse, which has a positive voltage equal to or higher than the first threshold voltage, is applied to the lower electrode (first electrode) 100a with reference to the upper electrode (second electrode) 100c, the resistance state of the variable resistance element is changed to a low resistance state, and when a HR writing voltage pulse, which has a positive voltage equal to or higher than the second threshold voltage, is applied to the upper electrode 100c with reference to the lower electrode 100a, the resistance state of the variable resistance element is changed to a high resistance state. (2) In an initial state where any voltage has not been applied after manufacturing, the variable resistance element has non-linear current-voltage characteristics. (3) When a voltage pulse, which has a positive potential equal to or higher than that of a predetermined voltage, is applied to the upper electrode 100c with reference to the lower electrode 100a in the initial state, and the voltage is kept being applied during a predetermined time period, forming occurs to change the initial state to a state where the resistance state can be changed between a high resistance state and a low resistance state depending on a polarity of an applied voltage pulse, and when a current flowing in the variable resistance nonvolatile memory element is increased, a time period required for the forming is decreased in an exponential manner. (4) In forming, as a cumulative pulse application time period of at least one applied voltage pulse is increased, a probability of forming completion is increased.

Furthermore, the variable resistance elements R11, R12, R13, R14, ... are connected to the bit line BL0, the variable resistance elements R21, R22, R23, R24, ... are connected to the bit line BL1, and the variable resistance elements R31, R32, R33, R34, ... are connected to the bit line BL2. As described above, the memory cell array 402 according to the present embodiment has a structure in which the variable resistance elements R11, R12, R13, ... are connected directly to corresponding one of the bit lines BL0, BL1, BL2, ..., not via the NMOS transistors N11, N12, ....

In forming, the control circuit 410 provides the forming power source 500 and the variable pulse width writing circuit 406 with a forming signal instructing application of a forming voltage. In a data writing cycle, the control circuit 410 provides the variable pulse width writing circuit 406 with a write signal instructing application of a writing voltage, based on input data Din provided to the data input/output circuit 405. On the other hand, in a data reading cycle, the control circuit 410 provides the sense amplifier 404 with a read signal instructing a reading operation.

It should be noted that the row selection circuit 408 and the column selection circuit 403 serve as a selection unit that selects at least one memory cell from the memory cell array 402.

The row selection circuit 408 receives a row address signal from the address input circuit 409. Based on the row address signal, the row selection circuit 408 causes the row driver 407 to apply a predetermined voltage to a word line selected in the row address signal, by using the word line driver circuit WLD corresponding to one of the plurality of word lines WL0, WL1, WL2, ....

At the same time, when the row selection circuit 408 receives a row address signal from the address input circuit 409, the address input circuit 409 causes, based on the row address signal, the row driver 407 to apply a predetermined voltage to a source line selected in the row address signal, by using the source line driver circuit SLD corresponding to one of the plurality of source lines SL0, SL2, ....

The variable pulse width writing circuit 406 is a circuit that generates a writing voltage pulse to change a resistance state of a variable resistance nonvolatile memory device included in a memory cell selected by the above-described selection unit to a desired state, when forming or writing is performed on the variable resistance nonvolatile memory device.

At a normal operation mode (an operation mode for changing resistance state of variable resistance elements between a high resistance state and a low resistance state), the variable pulse width writing circuit 406 generates the writing voltage pulse having a fixed pulse width when the control circuit 410 issues writing instruction.

At a forming mode (in forming), the variable pulse width writing circuit 406 generates the forming pulse having the same width as a desired width of a pulse signal provided from a forming pulse width control clock signal terminal. The writing pulse and the forming pulse generated as above are applied to the bit line selected by the column selection circuit 403.

More specifically, in order to perform forming under control of the control circuit 410 on a variable resistance nonvolatile memory element included in a selected memory cell, the variable pulse width writing circuit 406 applies the first positive voltage pulse, which has an amplitude greater than that of a predetermined voltage having a positive potential and has the first pulse width, to the upper electrode 100c with reference to the lower electrode 100a of the memory cell. If the above-described forming determination unit determines that the variable resistance nonvolatile memory element is not in a low resistance state after the application of the first positive voltage pulse, the variable pulse width writing circuit 406 applies the second positive voltage pulse, which has an amplitude equal to or greater than that of the predetermined voltage having the positive potential and has a pulse width greater than that of the first pulse width, to the upper electrode 100c with reference to the lower electrode 100a of the memory cell.

The writing power source 411 is a circuit that generates a writing voltage for changing the resistance state of the variable resistance nonvolatile memory element included in the memory cell selected by the above-described selection unit from a high resistance state to a low resistance state or from a low resistance state to a high resistance state. More specifically, the writing power source 411 includes the LR writing power source 412 for LR writing and the HR writing power source 413 for HR writing. An output VL0 of the LR writing power source 412 is provided to the row driver 407, while an output VH0 of the HR writing power source 413 is provided to the variable pulse width writing circuit 406.

Furthermore, an output VFL0 of the forming source 500 is provided to the row driver 407, while an output VFH0 is provided to the variable pulse width writing circuit 406.

The normal operation reference current generation circuit 702 is activated by a reading enable signal C1 in normal reading (reading at the above-described normal operation mode), and mirrors a read reference current to the comparison circuit 704.

Furthermore, the forming reference current generation circuit 703 is activated by a desired one of forming reference current selection signals C21 and C22 in forming (at the above-described forming mode), and mirrors, to the comparison circuit 704, one of (a) the first forming reference current to be used in the first forming shown in FIG. 16 (for first generating a rough filament path) and (b) the second forming reference current to be used in the second forming shown in FIG. 16 (for increasing an inadequate diameter of the filament path). The comparison circuit 704 compares (i) the read reference current or one of the first and second forming reference currents to (ii) the current of the memory cell selected by the column selection circuit 403 so as to make the determination, and provides the determination result to the data input/output circuit 405.

Figure 27:
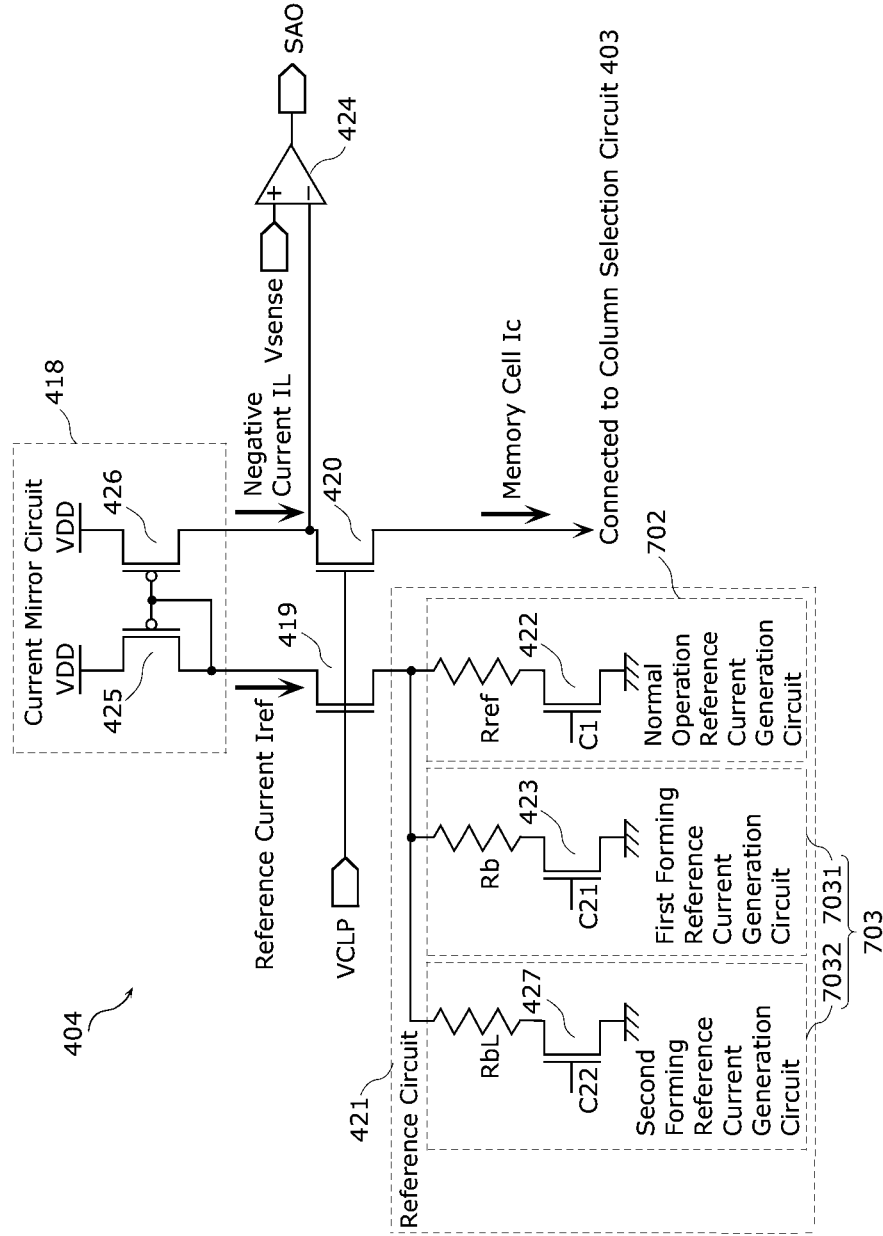
FIG. 27 is a circuit diagram showing an example of a sense amplifier according to Embodiment 3 of the present disclosure.

FIG. 27 is a circuit diagram showing an example of a detailed structure of the sense amplifier 404 shown in FIG. 26.

The sense amplifier 404 includes clamp transistors 419 and 420, a reference circuit 421, and a difference amplifier 424. The clamp transistors 419 and 420 have the same size as that of the current mirror circuit 418 having a one-to-one mirror ratio. The reference circuit 421 includes the normal operation reference current generation circuit 702 and the forming reference current generation circuit 703. The forming reference current generation circuit 703 includes: a first forming reference current generation circuit 7031 that is activated by the forming reference current selection signal C21; and a second forming reference current generation circuit 7032 that is activated by the forming reference current selection signal C22.

In the normal operation reference current generation circuit 702, one end of a branch, in which a selection transistor 422 is connected in series with a reference resistance Rref, is connected to a ground potential, and the other end of the branch is connected to a source terminal of the clamp transistor 419. Here, the reference resistance Rref is set to have a resistance value corresponding to an almost intermediate current value between HR writing cell current and LR writing cell current for normal reading. A gate terminal of the selection transistor 422 receives a reading enable signal C1. Based on the reading enable signal C1, the selection transistor 422 is switched between a conducting state and a non-conducting state.

In the similar manner, in the first forming reference current generation circuit 7031, one end of a branch, in which a selection transistor 423 is connected in series with a reference resistance Rb, is connected to a ground potential, and the other end of the branch is connected to a source terminal of the clamp transistor 419. Here, the reference resistance Rb for the first forming is set to have a resistance value slightly lower than the high-resistance resistance value written in the normal operation. A gate terminal of the selection transistor 423 receives a forming reference current selection signal C21. Based on the forming reference current selection signal C21, the selection transistor 423 is switched between a conducting state and a non-conducting state.

In the similar manner, in the second forming reference current generation circuit 7032, one end of a branch, in which a selection transistor 427 is connected in series with a reference resistance RbL, is connected to a ground potential, and the other end of the branch is connected to a source terminal of the clamp transistor 419. Here, the reference resistance RbL for the second (additional) forming is set to have a low-resistance resistance value written in the normal operation. A gate terminal of the selection transistor 427 receives a forming reference current selection signal C22. Based on the forming reference current selection signal C22, the selection transistor 427 is switched between a conducting state and a non-conducting state.

A gate terminal of each of the clamp transistors 419 and 420 receives a clamp voltage VCLP. A source terminal of the clamp transistor 420 is connected to the memory cells via the column selection circuit 403 and the bit lines. Drain terminals of the clamp transistors 419 and 420 are connected to drain terminals of transistors 425 and 426, respectively, which are included in the current mirror circuit 418. The difference amplifier 424, which receives a reference voltage Vsense, performs inverting amplification to a potential of the drain terminal of the clamp transistor 420, so as to generate a sense amplifier output SAO to be provided to the data input/output circuit 405.

Figure 28:
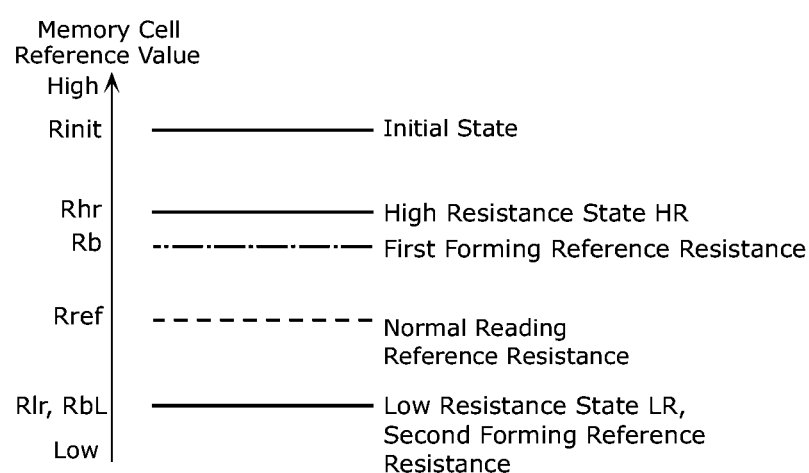
FIG. 28 is a diagram for explaining a sense amplifier determination level according to Embodiment 3 of the present disclosure.

FIG. 28 is a diagram for explaining the determination levels of the sense amplifier 404. As shown in the example of FIG. 28, the sense amplifier 404 has three determination levels which are (i) a normal reading reference resistance Rref, (ii) a first forming reference resistance Rb, and (iii) a second (additional) forming reference resistance RbL, between a resistance value Rhr in a high resistance state HR and a resistance value Rlr in a low resistance state LR.

In order to determine whether or not a filament path is generated in a variable resistance element, the first forming reference resistance Rb is set to have a resistance value slightly smaller than the resistance value Rhr in the high resistance state HR.

Furthermore, in order to determine whether or not the diameter of the filament path in the variable resistance element is adequately increased and a low-resistance cell current has a value equal to or greater than a predetermined value, the second (additional) forming reference resistance RbL is set to have the resistance value Rlr in the target low resistance state LR.

Moreover, in order to determine whether the resistance state of the variable resistance element is in a high resistance state or in a low resistance state, the normal readout reference resistance Rref is set to have a resistance value that is smaller than the resistance value Rhl in the high resistance state HR and greater than the resistance value Rlr in the low resistance state LR.

FIG. 28 also shows, as reference, a resistance value Rinit of the variable resistance element in an initial state. Here, a resistance value of the variable resistance element after the first forming is not always lower than the resistance value Rhr in the high resistance state HR. Therefore, the first forming reference resistance Rb is not necessarily to have always a resistance value as shown in FIG. 28 which is smaller than that in the high resistance state HR. If it is possible to distinguish the state where the first forming is completed from the initial state, the first forming reference resistance Rb may have a resistance value greater than the resistance value Rhr in the high resistance state HR. Thereby, completion of the first forming can be detected by examining a resistance value obtained immediately after the application of the forming positive voltage pulse, without applying the negative voltage pulse at Step S23 in FIG. 5.

Next, regarding the nonvolatile memory device 400 having the above structure, the description is first given for operation performed by the sense amplifier 404, and then given for operation in a writing cycle where data writing and forming are performed on the nonvolatile memory device 400, and in a reading cycle where normal reading and verification reading are performed on the nonvolatile memory device 400.

First, the operation performed by the sense amplifier 404 shown in FIG. 27 is described.

In the first and second forming for generating a filament path in a variable resistance element and expanding the filament path, the sense amplifier 404 applies a forming positive voltage pulse to the variable resistance element, and after applying a negative voltage pulse for low resistance writing, the sense amplifier 404 is connected to a target memory cell (including a target variable resistance element) via the column selection circuit 403 and the bit lines.

A voltage, which has an upper limit that is a voltage VCLP-Vth, is applied as a read voltage Vread to the reference circuit 421 and a target memory cell. This voltage is lower than a clamp voltage VCLP by a threshold voltage Vth of the clamp transistors 419 and 420.

In the reference circuit 421, the selection transistor 423 is activated by the forming reference current selection signal C21 to be in a conducting state, so that the first forming reference resistance Rb is selected. The other selection transistors 422 and 427 are set to be non-active by the reading enable signal C1 and the forming reference current selection signal S22, respectively, to be in a non-conducting state, so that reference current Iref=Vread/Rb flows.

The reference current Iref is transferred by the current mirror circuit 418. Thereby, a current having almost the same amount as that of the reference current Iref flows as a load current IL. The clamp transistor 420 compares the load current IL to the memory cell current Ic to determine a magnitude relation of them. Depending on the comparison result, the difference amplifier 424 detects whether a drain terminal voltage at the clamp transistor 420 is higher or lower than the reference voltage Vsense, and the difference amplifier 424 outputs the sense amplifier output SAO.

Here, if a resistance value of a memory cell immediately after application of a negative voltage pulse for low resistance writing is still the resistance value Rinit in the initial state which is higher than the first forming reference resistance Rb, memory cell current Ic=Vread/Rinit flows. Here, load current IL (Vread/Rb)>memory cell current Ic (Vread/Rinit), a drain terminal voltage at the clamp transistor 420 is higher than the reference voltage Vsense after a predetermined time period, and the sense amplifier output SAO indicates a L level "0".

In other words, if the selected memory cell is in an initial resistance state that is higher than the first forming reference resistance Rb, the sense amplifier 404 determines as "0", namely, a failure of the forming.

On the other hand, if forming has been completed on the selected memory cell in the first forming and further application of a negative voltage pulse for low resistance writing changes the resistance value of the selected memory cell to Rl1 that is lower than the first forming reference resistance Rb, memory cell current Ic=Vread/Rl1 flows. Here, load current IL (Vread/Rb)<memory cell current Ic (Vread/Rinit), a drain terminal voltage at the clamp transistor 420 is lower than the reference voltage Vsense after a predetermined time period, and the sense amplifier output SAO indicates a H level.

In other words, if the selected memory cell has a resistance value Rl1 that is lower than the first forming reference resistance Rb, an output of the sense amplifier 404 is a H level "1", thereby the forming is determined as passed, and the forming on the target memory cell is completed.

Likewise, in the second (additional) forming, in the reference circuit 421, the selection transistor 427 is activated by the forming reference current selection signal C22 to be in a conducting state, so that the second forming reference resistance RbL is selected. The other selection transistors 422 and 423 are set to be non-active by the reading enable signal C1 and the forming reference current selection signal S21, respectively, to be in a non-conducting state, so that reference current Iref=Vread/RbL flows.

The reference current Iref is transferred by the current mirror circuit 418. Thereby, a current having almost the same amount as that of the reference current Iref flows as a load current IL. The clamp transistor 420 compares the load current IL to the memory cell current Ic to determine a magnitude relation of them. Depending on the comparison result, the difference amplifier 424 detects whether a drain terminal voltage at the clamp transistor 420 is higher or lower than the reference voltage Vsense, and the difference amplifier 424 outputs the sense amplifier output SAO.

Here, if a resistance value after application of a negative voltage pulse for low resistance writing is a low resistance state Rl2 that is higher than the second forming reference resistance RbL, memory cell current Ic=Vread/Rl2 flows. Here, load current IL (Vread/RbL)>memory cell current Ic (Vread/Rl2), a drain terminal voltage at the clamp transistor 420 is higher than the reference voltage Vsense after a predetermined time period, and the sense amplifier output SAO indicates a L level "0".

In other words, if the selected memory cell has the resistance value Rl2 that is higher than the second forming reference resistance RbL, an output of the sense amplifier 404 is a L level "0", in other words, it is determined as a failure of the second (additional) forming.

On the other hand, if additional forming has been completed on the selected memory cell in the second forming, and a resistance value after application of a negative voltage pulse for low resistance writing is changed to Rl3 that is lower than the second forming reference resistance Rb, memory cell current Ic=Vread/Rl3 flows. Here, load current IL (Vread/RbL)<memory cell current Ic (Vread/Rl3), a drain terminal voltage at the clamp transistor 420 is lower than the reference voltage Vsense after a predetermined time period, and the sense amplifier output SAO indicates a H level "1".

In other words, if the resistance value of the selected memory cell is changed to the resistance value Rl3 that is lower than the second forming reference resistance RbL, an output of the sense amplifier 404 is a H level "1", thereby the additional forming is determined as passed, and the additional forming on the target memory cell is completed.

Moreover, in normal reading, in the reference circuit 421, the selection transistor 422 is activated by the reading enable signal C1 to be in a conducting state, so that the normal reading reference resistance Rref is selected. The other selection transistors 427 and 423 are set to be non-active by the forming reference current selection signals C22 and S21, respectively, to be in a non-conducting state, so that reference current Iref=Vread/Rref flows.

The reference current Iref is transferred by the current mirror circuit 418. Thereby, a current having almost the same amount as that of the reference current Iref flows as the load current IL. The clamp transistor 420 compares the load current IL to the memory cell current Ic to determine a magnitude relation of them. Depending on the comparison result, the difference amplifier 224 detects whether a drain terminal voltage at the clamp transistor 420 is higher or lower than the reference voltage Vsense, and the difference amplifier 224 outputs the sense amplifier output SAO.

Here, when Rhr represents a resistance value in a high resistance state and Rlr represents a resistance value in a low resistance state, if the selected memory cell is in a high resistance state, memory cell current Ic=Vread/Rhr flows. Here, load current IL (Vread/Rref)>memory cell current Ic (Vread/Rhr), a drain terminal voltage at the clamp transistor 420 becomes higher than the reference voltage Vsense, and the sense amplifier output SAO indicates a L level "0".

In other words, if the selected memory cell has the resistance value Rhr in the high resistance state that is higher than the normal reading reference resistance Rref, the sense amplifier 404 determines as "0" data.

On the other hand, if the selected memory cell is in a low resistance state, memory cell current Ic=Vread/Rlr flows. Here, load current IL (Vread/Rref)<memory cell current Ic (Vread/Rlr), a drain terminal voltage at the clamp transistor 420 becomes lower than the reference voltage Vsense, and the sense amplifier output SAO indicates a H level.

In other words, if the selected memory cell has the resistance value Rrl in the low resistance state that is lower than the normal reading reference resistance Rref, the sense amplifier 404 determines as "1" data.

Next, FIG. 29 shows a table of various setting voltages including a word line (WL) voltage, a source line (SL) voltage, and a bit line (BL) voltage for each of modes including forming, forming determination (verification) reading, "1" writing (LR writing), "0" writing (HR writing), and reading.

In FIG. 29, the BL voltages in forming (including the first forming (positive voltage pulse application) and the second (additional) forming (negative voltage pulse application)) have respective voltage pulses with amplitude Vfh and amplitude −Vfh, respectively, and the BL voltages in the "1" writing (LR writing) and the "0" writing (HR writing) have respective writing voltage pulses with amplitude VH and amplitude −VH, respectively. Here, Vfh in forming>VH in writing.

In the "1" writing (LR) writing, VL is a voltage generated by the LR writing power source 412, and also a word line voltage applied from the word line driver circuit WLD and the source line voltage applied from the source line driver circuit SLD. VH is a voltage generated by the HR writing power source 413 to be applied to the variable pulse width writing circuit 406.

In the "0" writing (HR) writing, VL is a voltage generated by the LR writing power source 412, and also a word line voltage applied from the word line driver circuit WLD. VH is a voltage generated by the HR writing power source 413 to be applied to the variable pulse width writing circuit 406.

In positive voltage pulse application in the first and second (additional) forming, Vfh is an amplitude of a voltage pulse which is applied from the variable pulse width writing circuit 406 and which has a pulse width Tp(n) (a variable increased according to the voltage pulse application count n) that is equal to or longer than a pulse width (Th=Tl) of a voltage pulse for normal rewriting. Vfl is a voltage generated by the forming power source 500 and a word line voltage applied from the word line driver circuit WLD.

In negative voltage pulse application in the first and second (additional) forming, Vfh is an amplitude of a voltage pulse which is applied from the variable pulse width writing circuit 406 and which has a voltage width Tn that is equal to the pulse width (Th=Tl) of the voltage pulse for normal rewriting. Vfl is a voltage generated by the forming power source 500, and a word line voltage applied from the word line driver circuit WLD and a source line voltage applied from the source line driver circuit SLD.

In the first and second (additional) forming determination (verification) reading and in normal reading, Vread is a reading voltage clamped by the sense amplifier 404, and corresponds to a voltage value adjusted not to cause reading disturbance (in other words, not to change a resistance state of a variable resistance element). VDD corresponds to a power source voltage applied to the nonvolatile memory device 400.

Furthermore, in the first forming determination (verification) reading, as shown in FIG. 11, regardless of whether the forming is possible or impossible, application of a voltage equal to or higher than a positive voltage close to Ve suddenly increases a cell current due to non-linear characteristics of the variable resistance element 100, thereby causing a current, which has a value equal to or higher than a reference value Ith1 of a cell current corresponding to the first forming reference resistance Rb, to flow. Therefore, it is necessary to set the first forming determination reading voltage Vread to be enough lower than Ve. Here, the second (additional) forming determination reading voltage is also set to the same voltage as the first forming determination reading voltage Vread.

Figure 30:
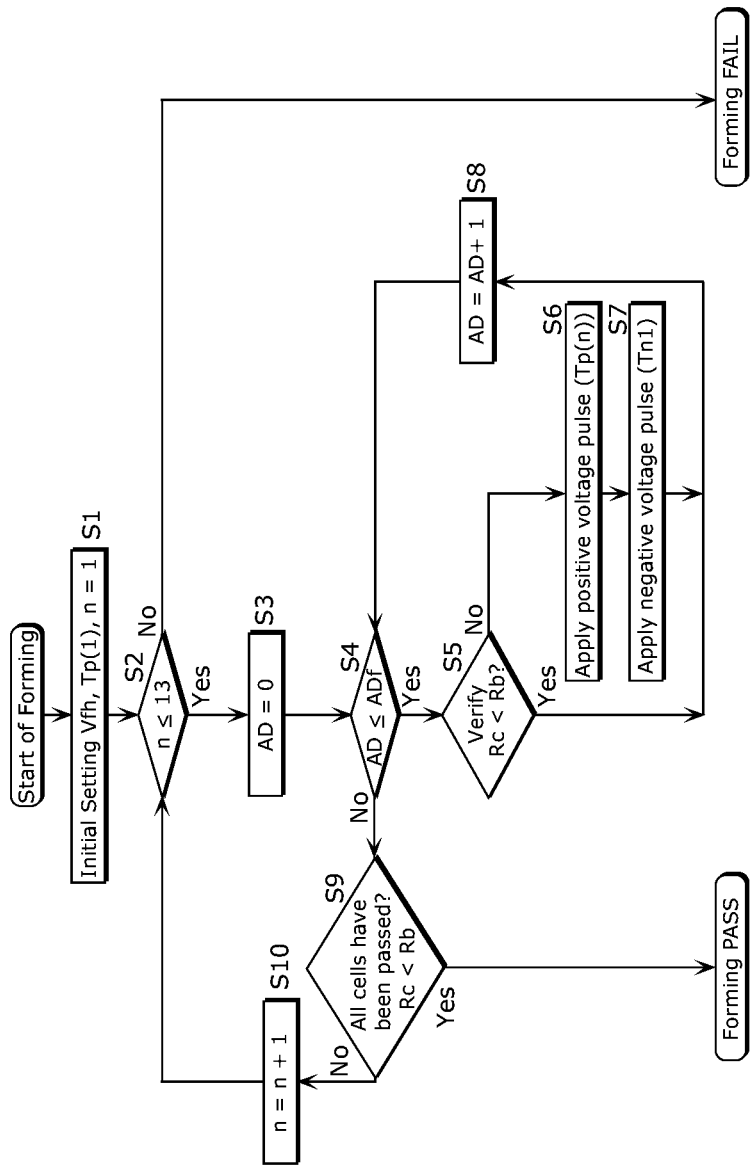
FIG. 30 is a flowchart of a pulse width step-up first forming for the variable resistance nonvolatile memory device according to Embodiment 3 of the present disclosure.

Next, the description is given for an example of forming in the first forming (see FIGS. 5 and 16) for the nonvolatile memory device 400 with reference to the forming flow shown in FIG. 30. It should be noted that practical values and count numbers shown in Table 1 are used as examples in the above description, but the examples are for the sake of simplicity of the description and the present disclosure is not limited to them.

As shown in FIG. 30, first, a pulse width of a forming positive voltage pulse VP (voltage Vfh) is set to Tp(1) (here, as one example, 50 ns so that is the same as a pulse width for normal writing), and a loop count variable n is initialized to 1 (Step S1).

Next, it is determined whether or not the loop count variable n is equal to or smaller than 13 (Step S2). If the loop count variable n is greater than 13 (No at Step S2), then it is determined as a forming failure and the forming is terminated. On the other hand, if the loop count variable n is equal to or smaller than 13 (Yes at Step S2), then an address AD of the memory cell is initialized (AD=0) (Step S3). Next, it is determined whether or not the address AD of the selected memory cell M11 is equal to or smaller than a final address ADf in the memory cell array 402 (Step S4).

As a result, if the address AD of the selected memory cell M11 is equal to or smaller than the final address ADf (Yes at Step S4), then verification reading (Step S5 (determination step)) is performed on the selected memory cell to determine whether or not a resistance value Rc of the selected memory cell is smaller than the reference resistance Rb (Rc<Rb). As a result, if the resistance value Rc of the selected memory cell is smaller than the forming reference resistance Rb (Rc<Rb) (Yes at Step 5), then it is determined that the resistance value Rc is low enough to avoid the necessity of future forming, so that the address AD of the selected memory cell is incremented (Step S8) and a memory cell of a next address AD is selected.

On the other hand, if the resistance value Rc of the selected memory cell is equal to or greater than the forming reference resistance Rb (Rc Rb) (No at Step S5), then, by using the pulse width Tp(1) of the setting forming positive voltage pulse VP (voltage VP=Vfh), a forming positive voltage pulse (+Vfh, pulse width Tp(1)) is applied to the selected memory cell (Step S6 (the first voltage application step)), and then, as preparation for a determination as to whether forming is successful, a negative voltage pulse (−Vfh, pulse width Tn1) is applied (Step S7 (a part of the determination step)).

After that, the address AD of the selected memory cell is incremented (Step S8), and a memory cell of a next address AD is selected. Subsequently, the processing Steps S4 to S8 is repeated until an address AD of a selected memory cell becomes greater than the final address ADf.

If it is determined at Step S4 that the address AD of the selected memory cell is greater than the final address ADf (AD>ADf) (No at Step S4), then an external device such as a memory tester determines whether or not a resistance value Rc of each of the memory cells in the memory cell array 402 is smaller than the forming reference resistance Rb (Rc<Rb) (Step S9). If a resistance value Rc of each of the memory cells is not smaller than the reference resistance Rb (No at Step S9), the loop count variable n is incremented by +1 so that n=2 (Step S10). Then, it is determined whether the loop count variable n is equal to or smaller than 13 (Step S2).

After that, the processing Steps S2 to S10 is repeated until the loop count variable n becomes greater than 13 or until forming for all memory cells are passed at Step S9.

Here, a value of a width Tp(n) (where n is an integer of 1 or more) of the forming positive voltage pulse is set to be shown in the above-presented Table 1, for example.

As described above, this forming flow includes: the determination step S5 for determining whether or not a resistance value of the variable resistance element 100 is smaller than the forming reference resistance Rb; the pulse application step S6 for applying, if it is determined that the resistance value is not smaller than the forming reference resistance Rb (No at Step S5), a forming positive voltage pulse (+Vfh, pulse width Tp(n)) having a pulse width that is equal to or longer than a pulse width (Th and Tl) used in normal writing; and the pulse application step S7 for applying a negative voltage pulse (−Vfh, a pulse width Tn1) as preparation for a determination as to whether or not forming is successful. Of course, as long as the negative voltage pulse can change the resistance state of the variable resistance element to a low resistance state, the pulse width Tn1 may be different from the pulse width used in normal writing.

Then, the determination step S5 and the pulse application steps S6 and 7 are repeated for each of the memory cells included in the memory cell array 402 (Steps S4 to S8). Then, if there is any cell for which forming is not yet successful after applying the same positive voltage pulse and the same negative voltage pulse for a target memory cell for which forming is to be performed, the determination step S5 and the pulse application steps S6 and 7 are repeated again on all of the memory cells (Steps S4 to S8).

It should be noted that FIG. 30 shows the flowchart example in which a target address AD is incremented at Step S8 after Step S7 to apply a positive voltage pulse with a corresponding pulse width to each of bits. However, it is also possible that the processing returns to Step 5 after performing Step S7, and an address AD is incremented to a next bit after confirming a forming success of each bit.

By performing, as described above, the first forming flow in which a pulse width of a forming positive voltage pulse steps up, it is possible to apply a positive voltage pulse and a negative voltage pulse only to a memory cell for which filament path generation is necessary. As a result, high-speed (rough) forming can be performed for the memory cell array.

Figure 31:
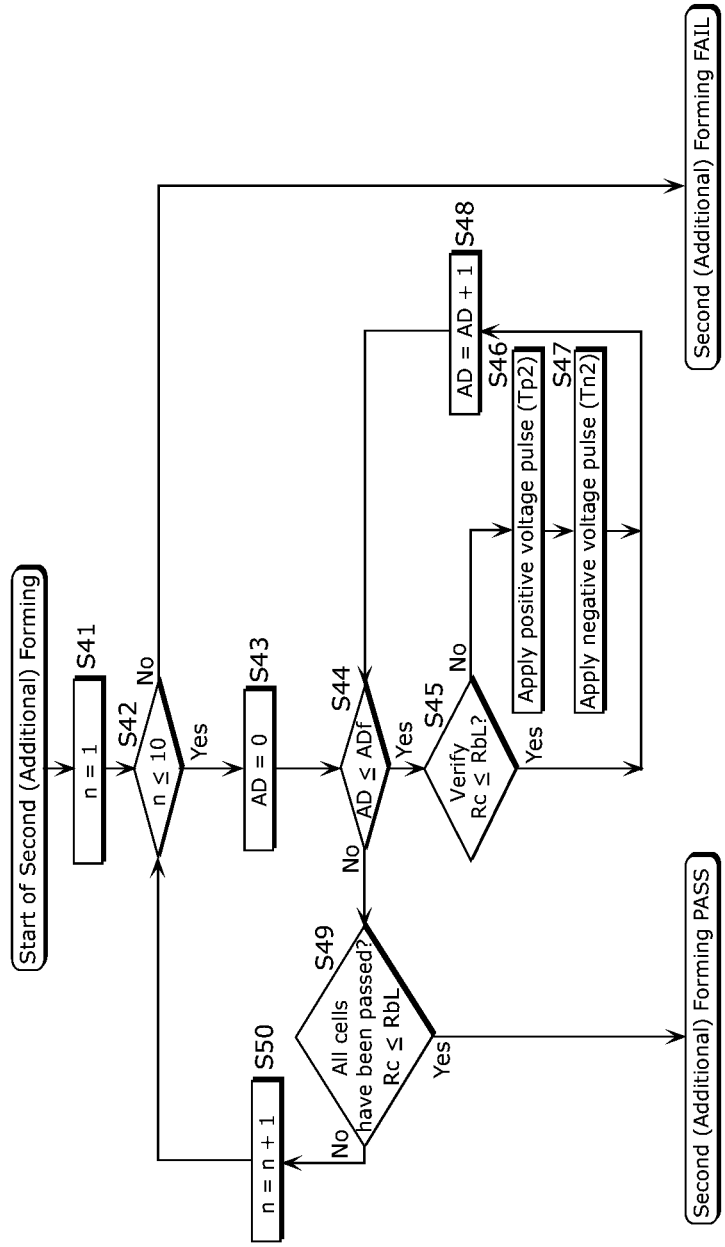
FIG. 31 is a flowchart of second (additional) forming for the variable resistance nonvolatile memory device according to Embodiment 3 of the present disclosure.

Next, the description is given for an example of forming in the second forming (see FIG. 16) for the nonvolatile memory device 400 with reference to the forming flow shown in FIG. 31.

The second (additional) forming flow shown in FIG. 31 differs from the first forming flow shown in FIG. 30 in: an initialization step S41; a step S42 for determining whether or not the loop count variable n is equal to or smaller than 10; a verification reading step S45 for determining whether or not a resistance value Rc of a selected memory cell is equal to or smaller than a reference resistance RbL (Rc≤RbL); a positive voltage pulse application step S46; and a step S49 at which an external device such as a memory tester determines whether or not a resistance value Rc of each of the memory cells in the memory cell array 402 is equal to or smaller than the second forming reference resistance RbL (Rc≤RbL).

As shown in FIG. 31, first, the loop count variable n is initialized to 1 (Step S41).

Next, it is determined whether or not the loop count variable n is equal to or smaller than 10 (Step S42). If the loop count variable n is greater than 10 (No at Step S42), then it is determined as a failure of the additional forming and the additional forming is terminated. On the other hand, if the loop count variable n is equal to or smaller than 10 (Yes at Step S42), then an address AD of the memory cell is initialized (AD=0) (Step S43). Next, it is determined whether or not the address AD of selected memory cell M11 is equal to or smaller than the final address ADf in the memory cell array 402 (Step S44).

As a result, if the address AD of selected memory cell M11 is equal to or smaller than the final address ADf (Yes at Step S44), then verification reading (Step S45 (determination step)) is performed on the selected memory cell to determine whether or not a resistance value Rc of the selected memory cell is smaller than the reference resistance RbL (Rc≤RbL). As a result, if the resistance value Rc of the selected memory cell is smaller than the second forming reference resistance RbL (Rc≤RbL) (Yes at Step 45), then it is determined that a diameter of the filament path is increased to prevent the necessity of the additional forming for further increase of the filament path diameter, so that the address AD of the selected memory cell is incremented (Step S48) and a memory cell of a next address AD is selected.

On the other hand, if the resistance value Rc of the selected memory cell is greater than the second forming reference resistance RbL (Rc>RbL) (No at Step S45), a forming positive voltage pulse (voltage Vfh, pulse width Tp2) is applied to the selected memory cell by using a pulse width Tp2 of a setting forming positive voltage pulse VP (voltage VP=Vfh) (Step S46 (additional voltage application step)). Next, as preparation for a determination as to whether or not the additional forming is successful, a negative voltage pulse (voltage Vfh, pulse width Tn2) is applied (Step S47 (a part of the determination step)).

After that, the address AD of the selected memory cell is incremented (Step S48), and a memory cell of a next address AD is selected. Subsequently, the processing Steps S44 to S48 is repeated until an address AD of a selected memory cell becomes greater than the final address ADf.

If it is determined at Step S44 that the address AD of the selected memory cell is greater than the final address ADf (AD>ADf) (No at Step S44), then an external device such as a memory tester determines whether or not a resistance value Rc of each of the memory cells in the memory cell array 402 is smaller than the second forming reference resistance RbL (Rc≤RbL) (Step S49). If a resistance value Rc of each of the memory cells is not equal to or smaller than the reference resistance RbL (No at Step S49), the loop count variable n is incremented by +1 so that n=2 (Step S50). Then, it is determined whether or not the loop count variable n is equal to or smaller than 10 (Step S42). After that, the processing Steps S42 to S50 is repeated until the loop count variable n becomes greater than 10 or until second additional forming for all memory cells are passed at Step S49.

As described above, the second additional forming flow includes: the determination step S45 for determining whether or not the resistance value of the variable resistance element 100 is equal to or smaller than the second forming reference resistance RbL; the pulse application step S46 for applying, if it is determined that the resistance value is not equal to or smaller than RbL (No at Step S45), an additional forming positive voltage pulse (voltage Vfh, pulse width Tp2) having a pulse width that is longer than the pulse width (Th and Tl) used in normal writing; and the pulse application step S47 for applying a negative voltage pulse (voltage Vfh, pulse width Tn2) as preparation for a determination as to whether or not the additional forming is successful.

Then, the determination step S45 and the pulse application steps S46 and S47 are repeated for each of the memory cells included in the memory cell array 402 (Steps S44 to S48). Then, if there is any cell for which additional forming is not yet successful after applying the same positive voltage pulse and the same negative voltage pulse for a target memory cell having an inadequate filament path diameter, the determination step S45 and the pulse application steps S46 and S47 are repeated again on all of the memory cells (Steps S44 to S48).

It should be noted that FIG. 31 shows the flowchart example in which a target address AD is incremented at Step S48 after Step S47 to apply a positive voltage pulse with a corresponding pulse width to each of bits. However, it is also possible that the processing returns to Step 45 after performing Step S47, and an address AD is incremented to a next bit after confirming a forming success of each bit.

By performing, as described above, the second (additional) forming flow, it is possible to perform additional forming on all of the memory cells to increase a filament path diameter to set a resistance value of a cell in a low resistance state to be equal to or smaller than the second forming reference resistance RbL (target LR value), and also to apply a positive voltage pulse and a negative voltage pulse only to memory cells having an inadequate filament path diameter after the first forming. As a result, high-speed second (additional) forming can be performed for the memory cell array.

As described above, first, in the first forming, a filament path is roughly generated, and then, in the second forming, additional forming is performed on memory cells having an inadequate filament path diameter which incidentally occur in the first forming, so as to increase the filament path diameter. Thereby, a cell current is increased in a LR state in normal writing, and an operation window is expanded. As a result, it is possible to implement a high-speed and reliable nonvolatile memory device.

Figure 32A:
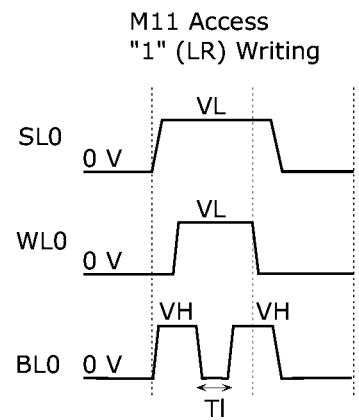
FIG. 32A is a time chart for explaining operation times of the variable resistance nonvolatile memory device according to Embodiment 3 of the present disclosure.
Figure 32B:
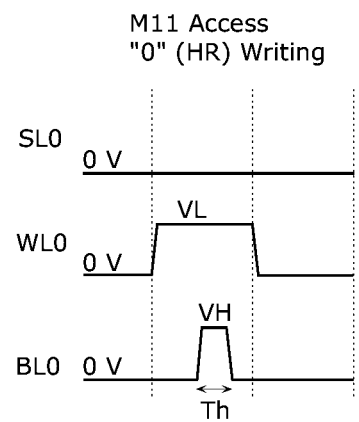
FIG. 32B is a time chart for explaining operation times of the variable resistance nonvolatile memory device according to Embodiment 3 of the present disclosure.
Figure 32C:
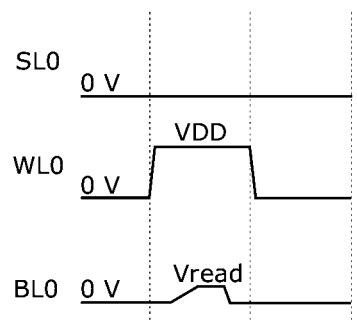
FIG. 32C is a time chart for explaining operation times of the variable resistance nonvolatile memory device according to Embodiment 3 of the present disclosure.
Figure 33:
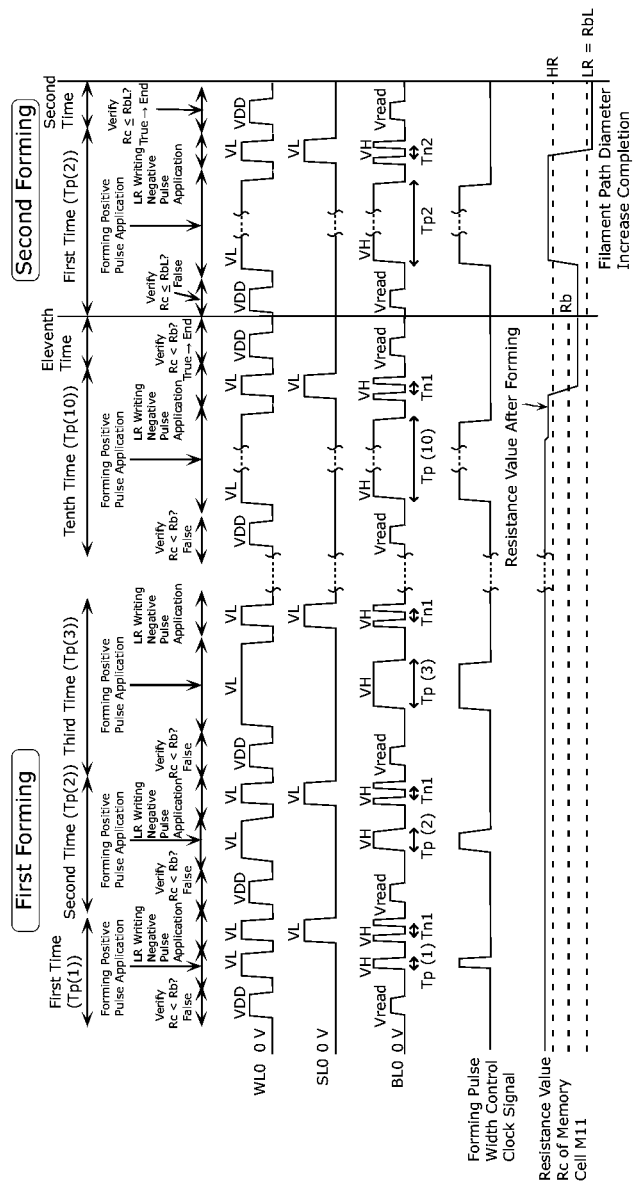
FIG. 33 is a time chart for explaining forming time periods of the variable resistance nonvolatile memory device according to Embodiment 3 of the present disclosure.

The following describes operation examples in a data writing cycle, in a reading cycle, and in forming regarding the nonvolatile memory device 400 having the above-described structure with reference to the time charts shown in FIGS. 32 (a) to (c) and FIG. 33 and the block diagram of the nonvolatile memory device 400 according to Embodiment 2 of the present disclosure shown in FIG. 26.

FIG. 32 (*a*) to (*c*) are time charts showing operation examples of the nonvolatile memory device 400 according to Embodiment 2 of the present disclosure. Here, the operation examples are described assuming that data "0" is assigned to the situation where a variable resistance layer is in a high resistance state and data "1" is assigned to the situation where a variable resistance layer is in a low resistance state. The description is given only for the case of data writing and reading for the memory cell M11.

In the data "1" writing cycle for the memory cell M11 shown in FIG. 32 (*a*), first, a selected bit line BL0 is set to have a voltage VH, and a selected source line SL0 is set to have a voltage VL (here, equal to the voltage VH). Next, a selected word line WL0 is set to have a voltage VL. Here, the NMOS transistor N11 in the selected memory cell M11 shown in FIG. 26 is still OFF. At this state, since the same voltage (VL=VH) is applied to both the drain terminal and the source terminal of the NMOS transistor N11 in FIG. 26, a current does not flow whichever the transistor is ON or OFF.

Next, the selected bit line BL0 is set to have a voltage of 0 V for a predetermined time period (Tl=50 ns), and after the predetermined time period, a pulse waveform of the voltage VH is applied again. At this state, the LR writing voltage pulse (Voltage=−VL) is applied to the memory cell M11 in FIG. 26, so as to perform writing to change from the high resistance value to a low resistance value. After that, the word line WL0 is set to have a voltage 0V, and the data "0" writing is completed.

In other words, first, memory cells are selected in a row direction by the source line and the world line, and then, a pulse waveform in a negative voltage direction is applied to a certain bit line, so that the negative voltage pulse is applied to the variable resistance element in the memory cell selected by the source line, the word line, and the bit line to change the resistance state to the low resistance state.

In the data "0" writing for the memory cell M11 shown in FIG. 32 (*b*), first, a selected bit line BL0 and a selected source line SL0 are set to have a voltage of 0 V. Next, a selected word line WL0 is set to have a voltage VL, so that the NMOS transistor N11 in the selected memory cell M11 shown in FIG. 26 is turned ON.

Next, the selected bit line BL0 is set to have the voltage VH equal to the voltage VL for a predetermined time period (Th), and after the predetermined time period, a pulse waveform is applied to achieve the voltage of 0 V again. At this state, a positive voltage pulse (in other words, a HR writing voltage pulse) is applied to the memory cell M11 in FIG. 26, so as to perform writing to change the low resistance value to a high resistance value. After that, the word line WL0 is set to have a voltage of 0 V, and the data "0" writing is completed.

In other words, first, memory cells are selected in a row direction by a source line and a world line, and then, a pulse waveform in a positive voltage direction is applied to a certain bit line, so that the positive voltage pulse is applied to the variable resistance element in the memory cell selected by the source line, the word line, and the bit line to change the resistance state to the high resistance state. However, the present disclosure is not limited to this method.

In the data reading cycle for the memory cell M11 shown in FIG. 32 (*c*), first, a selected bit line BL0 and a selected source line SL0 are set to have a voltage of 0 V. Next, a selected word line WL0 is set to have a voltage VDD lower than the voltage VH (=VL), so that the NMOS transistor N11 in the selected memory cell M11 is turned ON.

Next, a selected bit line BL0 is set to have a read voltage Vread, and the sense amplifier 404 detects a value of a current flowing in the selected memory cell M11 so as to determine whether or not the recorded data is data "0" or data "1". After that, the word line WL0 is set to have the voltage of 0 V, and the data reading is completed.

Next, the forming of the nonvolatile memory device 400 according to the present embodiment of the present disclosure is described.

FIG. 33 is a time chart of forming for the variable resistance nonvolatile memory device 400 according to Embodiment 2 of the present disclosure. In the forming shown in FIG. 33, by accessing only one bit of the memory cell M11 having the address AD of 0, the forming flows shown in FIGS. 30 and 31 are achieved for the bit, not for the array (however, Steps S4, S8, S44, and S48 are eliminated because of the one-bit access).

In FIG. 33, when the forming starts, each voltage state of the word line WL0, the bit line BL0, and the source line SL0 of the target memory cell M11 is 0 V, and each of the forming pulse width control clock signal and the terminal DQ is in a L level. The memory cell M11 is in an initial state.

At first, at Step S1 in the flowchart shown in FIG. 30, for the forming pulse width control clock signal, a voltage is set to VP (voltage VP=VH), a pulse width is set to Tp(1), and the loop count variable n is initialized to 1, so that the variable pulse width writing circuit 406 can apply a positive voltage pulse (voltage VH, pulse width Tp(1)).

Next, at Step S2, it is determined that the loop count variable n is equal or smaller than 13, then at Step S3, the address AD of the memory cell is initialized (AD=0), and the processing proceeds to Step S5.

At Step S5, in order to perform a verification reading to verify whether or not the resistance value Rc of the selected memory cell is smaller than the first forming reference resistance Rb (Rc<Rb), the selected word line WL0 is set to have a voltage VDD, thereby turning ON the NMOS transistor N11 in the selected memory cell M11.

Next, the selected bit line BL0 is set to have the read voltage Vread for a predetermined time period, and the sense amplifier 404 detects a value of the current flowing in the selected memory cell M11 to determine whether or not the reference value Rc of the selected memory cell M11 is smaller than the first forming reference resistance Rb (Rc<Rb). Here, since it is determined that the reference value Rc is equal to or greater than the first forming reference resistance Rb, the sense amplifier output (terminal) SAO outputs a L level, provides data "0" to the terminal DQ, and informs the external device (a memory tester, for example) of that the forming fails (false) (here, necessity of forming). After that, each of the word line WL0 and the bit line BL0 is set to have a voltage of 0 V, and the verification reading is completed.

Next, in order to apply the forming positive voltage pulse (voltage Vfh, pulse width Tp(n), n=1) shown in FIG. 30 is applied to the selected memory cell (Step S6), first, the selected bit line BL0 and the selected source line SL0 are set to have a voltage of 0 V. Next, the selected word line WL0 is set to have a voltage Vfl, so that the NMOS transistor N11 in the selected memory cell M11 shown in FIG. 26 is turned ON.

Next, according to the forming pulse width clock signal, the selected bit line BL0 is set to have the voltage Vfh for a predetermined time period (Tp(n)), and after the predetermined time period, a pulse waveform is applied to achieve the voltage of 0 V again. At this stage, it is assumed that the resistance value Rc of the memory cell M11 shown in FIG. 26 is still in the initial state and the forming is not successful. In short, here, the forming fails. After that, the word line WL0 is set to have the voltage of 0 V, and the application of the positive voltage pulse is completed.

Next, as preparation for the verification reading shown in FIG. 30, in order to apply a negative voltage pulse (−Vfl, pulse width Tn1) is applied to the selected memory cell (Step S7), first, the selected bit line BL0 is set to have the voltage Vfh and the selected source line SL0 is set to have the voltage Vfl equal to the voltage Vfh.

Next, the selected word line WL0 is set to have the voltage Vfl. Here, the NMOS transistor N11 in the selected memory cell M11 shown in FIG. 26 is still OFF. At this state, since the same voltage (Vfl=Vfh) is applied to both the drain terminal and the source terminal of the NMOS transistor N11 in FIG. 26, a current does not flow whichever the transistor is ON or OFF.

Next, the selected bit line BL0 is set to have a voltage of 0 V for a predetermined time period (Tn1), and after the predetermined time period, a pulse waveform of the voltage Vfh is applied again. At this state, the LR writing voltage pulse (−Vfl) is applied to the memory cell M11 in FIG. 26, but the forming is not successful for the selected memory cell M11 and the resistance state is not changed to close to a low resistance state. After that, the word line WL0 is set to have the voltage of 0 V, and the application of the negative voltage pulse is completed.

After that, at Step S9, it is confirmed that the determination at S5 is made that the forming fails (false) (not shown in FIG. 33), then the processing proceeds to Step S10, then the loop count variable n is incremented by +1, and setting is performed as n=2.

Next, at Step S2, it is determined that the loop count variable n is equal or smaller than 13, then at Step S3, the address AD of the memory cell is initialized (AD=0), and the processing proceeds to Step S5.

At Step S5 for the second time, the verification reading (Rc<Rb ?) is performed in the same manner as Step S5 for the first time. Now, the resistance value Rc of the selected memory cell M11 is still in the initial resistance state and is equal to or greater than the first forming reference resistance Rb. Therefore, the sense amplifier output SAO outputs a L level, outputs "0" data to the terminal DQ, notifies the external device (such as a memory tester) that the forming fails (false), and completes the verification reading.

Next, in order to apply the forming positive voltage pulse (voltage +Vfh, pulse width Tp(2)=100 ns) shown in FIG. 30 is applied to the selected memory cell (Step S6), first, the selected bit line BL0 and the selected source line SL0 are set to have a voltage of 0 V. Next, the selected word line WL0 is set to have a voltage Vfl equal to the voltage Vfh, so that the NMOS transistor N11 in the selected memory cell M11 shown in FIG. 26 is turned ON.

Next, according to the forming pulse width clock signal, the variable pulse width writing circuit 406 sets the selected bit line BL0 to have the voltage Vfh for a predetermined time period (Tp(2)), and after the predetermined time period, applies a pulse waveform to achieve the voltage of 0 V again. At this stage, it is assumed that the memory cell M11 shown in FIG. 26 is still in the initial state and the forming is not successful. In short, here, the forming fails. After that, the word line WL0 is set to have the voltage of 0 V, and the application of the positive voltage pulse is completed.

Next, as preparation for the verification reading shown in FIG. 30, in order to apply a negative voltage pulse (−Vfl, pulse width Tn1) is applied to the selected memory cell (Step S7), first, the selected bit line BL0 is set to have the voltage Vfh and the selected source line SL0 is set to have the voltage Vfl equal to the voltage Vfh.

Next, the selected word line WL0 is set to have the voltage Vfl. Here, the NMOS transistor N11 in the selected memory cell M11 shown in FIG. 26 is still OFF. At this state, since the same voltage (Vfl=Vfh) is applied to both the drain terminal and the source terminal of the NMOS transistor N11 in FIG. 26, a current does not flow whichever the transistor is ON or OFF.

Next, the selected bit line BL0 is set to have a voltage of 0 V for a predetermined time period (Tn1), and after the predetermined time period, a pulse waveform of the voltage Vfh is applied again. At this state, the LR writing voltage pulse (−Vfl) is applied to the memory cell M11 in FIG. 26, but the forming is not successful for the selected memory cell M11 and the resistance state is not changed to close to a low resistance state. After that, the word line WL0 is set to have the voltage of 0 V, and the application of the negative voltage pulse is completed.

After that, the loop from Step S2 to Step S10 (except Steps 4 and 8) in FIG. 30, namely, the verification reading, the positive voltage pulse application, and the negative voltage pulse application, is repeated three to nine times. However, the resistance value Rc of the memory cell M11 is still in the initial state and is still equal to or greater than the reference resistance Rb. In short, the forming fails.

After that, at Step S9, it is confirmed that the determination at S5 is made that the forming fails (false) (not shown in FIG. 33), then the processing proceeds to Step S10, then the loop count variable n is incremented by +1, and setting is performed as n=10.

Next, at Step S2, it is determined that the loop count variable n is equal or smaller than 13, then at Step S3, the address AD of the memory cell is initialized (AD=0), and the processing proceeds to Step S5.

At Step 5 for the tenth time, the verification reading (Rc<Rb ?) is performed in the same manner as Step S5 for the first time. Now, the resistance value Rc of the selected memory cell M11 is still in the initial resistance state and is equal to or greater than the forming reference resistance Rb. Therefore, the sense amplifier output SAO outputs a L level, outputs "0" data to the terminal DQ, notifies the external device (such as a memory tester) that the forming fails (false), and completes the verification reading.

Next, in order to apply the forming positive voltage pulse (+Vfh, pulse width Tp(10)) shown in FIG. 30 is applied to the selected memory cell (Step S6), first, the selected bit line BL0 and the selected source line SL0 are set to have a voltage of 0 V. Next, the selected word line WL0 is set to have a voltage Vfl, so that the NMOS transistor N11 in the selected memory cell M11 shown in FIG. 26 is turned ON. Next, according to the forming pulse width clock signal, the selected bit line BL0 is set to have the voltage Vfh for a predetermined time period (Tp(10)), and after the predetermined time period, a pulse waveform is applied to achieve the voltage of 0 V again. At this stage, the forming positive voltage pulse having the long pulse width Tp(10) is applied to the memory cell M11 shown in FIG. 26. Therefore, in the selected memory cell M11, a conducting path has been generated since the initial high resistance state, and the resistance value is changed to a resistance value close to the high resistance state HR after the forming. As a result, the forming has been performed. It means that the forming is successful. After that, the word line WL0 is set to have the voltage of 0 V, and the application of the forming positive voltage pulse is completed.

Next, as preparation for the verification reading shown in FIG. 30, in order to apply a negative voltage pulse (voltage Vfl, pulse width Tn1) is applied to the selected memory cell (Step S7), first, the selected bit line BL0 is set to have the voltage Vfh and the selected source line SL0 is set to have the voltage Vfl equal to the voltage Vfh. Next, the selected word line WL0 is set to have the voltage Vfl. Here, the NMOS transistor N11 in the selected memory cell M11 shown in FIG. 26 is still OFF. At this state, since the same voltage (Vfl=Vfh) is applied to both the drain terminal and the source terminal of the NMOS transistor N11 in FIG. 26, a current does not flow whichever the transistor is ON or OFF.

Next, the selected bit line BL0 is set to have a voltage of 0 V for a predetermined time period (Tn1), and after the predetermined time period, a pulse waveform of the voltage Vfh is applied again. At this state, the LR writing voltage pulse (voltage Vfl) is applied to the memory cell M11 in FIG. 26, and the forming (filament path generation) is successful for the selected memory cell M11. Therefore, the resistance state is changed from the high resistance state (HR) to the low resistance state (LR). After that, the word line WL0 is set to have the voltage of 0 V, and the application of the negative voltage pulse is completed.

After that, at Step S9, it is confirmed that the determination at S5 is made that the forming fails (false), then the processing proceeds to Step S10, then the loop count variable n is incremented by +1, and setting is performed as n=11.

Next, at Step S2, it is determined that the loop count variable n is equal or smaller than 13, then at Step S3, the address AD of the memory cell is initialized (AD=0), and the processing proceeds to Step S5.

At Step 5 for the eleventh time, the verification reading (Rc<Rb ?) is performed. Now, the resistance value Rc of the selected memory cell M11 is smaller than the first forming reference resistance Rb. Therefore, the sense amplifier output SAO outputs a H level, outputs "1" data to the terminal DQ, notifies the external device (such as a memory tester) that the forming is passed (true), and completes the verification reading.

After that, at Step S9, it is confirmed that the determination at the immediately-prior Step 5 is made that the forming is passed (true), and the first forming is completed.

Next, in FIG. 33, at the start of the second forming, each voltage state at the word line WL0, the bit line BL0, and the source line SL0 of the memory cell M111 for which the additional forming is to be performed is 0 V, and each of the forming pulse width control clock signal and the terminal DQ is in a L level. Furthermore, since the first forming is completed on the memory cell M11, the resistance value is smaller than the reference resistance Rb.

First, at Step S41 in the flowchart of FIG. 31, the loop count variable n is initialized to 1.

Next, at Step S42, it is determined that the loop count variable n is equal or smaller than 10, then at Step S43, the address AD of the memory cell is initialized (AD=0), and the processing proceeds to Step S45.

At Step S45, in order to perform a verification reading to verify whether or not the resistance value Rc of the selected memory cell is equal to or smaller than the second (additional) forming reference resistance RbL (Rc≤RbL), the selected word line WL0 is set to have a voltage VDD, thereby turning ON the NMOS transistor N11 in the selected memory cell M11.

Next, the selected bit line BL0 is set to have the reading voltage Vread for a predetermined time period, and the sense amplifier 404 detects a value of the current flowing in the selected memory cell M11 to determine whether or not the reference value Rc of the selected memory cell M11 is equal to or smaller than the second (additional) forming reference resistance RbL (Rc≤RbL). Here, since it is determined that the reference value Rc is greater than the second (additional) forming reference resistance RbL, the sense amplifier output (terminal) SAO outputs a L level, provides data "0" to the terminal DQ, and informs the external device (a memory tester, for example) of that the second (additional) forming fails (false) (here, necessity of the additional forming). After that, each of the word line WL0 and the bit line BL0 is set to have a voltage of 0 V, and the verification reading is completed.

Next, in order to apply the second (additional) forming positive voltage pulse (+3.3 V, pulse width Tp2) shown in FIG. 31 is applied to the selected memory cell (Step S46), first, the selected bit line BL0 and the selected source line SL0 are set to have a voltage of 0 V. Next, the selected word line WL0 is set to have a voltage Vfl, so that the NMOS transistor N11 in the selected memory cell M11 shown in FIG. 26 is turned ON. Next, according to the forming pulse width clock signal, the selected bit line BL0 is set to have the voltage Vfh for a predetermined time period (Tp2), and after the predetermined time period, a pulse waveform is applied to achieve the voltage of 0 V again. At this state, since a filament path has been generated, the resistance value Rc of the memory cell M11 in FIG. 26 is in a high resistance state. After that, the word line WL0 is set to have the voltage of 0 V, and the application of the positive voltage pulse is completed.

Next, as preparation for the verification reading shown in FIG. 31, in order to apply a negative voltage pulse (−Vfl, pulse width Tn2) is applied to the selected memory cell (Step S47), first, the selected bit line BL0 is set to have the voltage Vfh and the selected source line SL0 is set to have the voltage Vfl equal to the voltage Vfh. Next, the selected word line WL0 is set to have the voltage Vfl. Here, the NMOS transistor N11 in the selected memory cell M11 shown in FIG. 26 is still OFF. At this state, since the same voltage (Vfl=Vfh) is applied to both the drain terminal and the source terminal of the NMOS transistor N11 in FIG. 26, a current does not flow whichever the transistor is ON or OFF.

Next, the selected bit line BL0 is set to have a voltage of 0 V for a predetermined time period (Tn2), and after the predetermined time period, a pulse waveform of the voltage Vfh is applied again. At this stage, the LR writing negative voltage pulse (voltage Vfl) is applied to the memory cell M11 in FIG. 26, and the resistance state of the selected memory cell M11 is changed to a low resistance state. After that, the word line WL0 is set to have the voltage of 0 V, and the application of the negative voltage pulse is completed.

After that, at Step S49, it is confirmed that the determination at S45 is made that the forming fails (false) (not shown in FIG. 33), then the processing proceeds to Step S50, then the loop count variable n is incremented by +1, and setting is performed as n=2. Next, at Step S42, it is determined that the loop count variable n is equal or smaller than 10, then at Step S43, the address AD of the memory cell is initialized (AD=0), and the processing proceeds to Step S45.

At Step S45 for the second time, the verification reading (Rc≤RbL ?) is performed. Now, the resistance value Rc of the selected memory cell M11 is equal to or smaller than the second (additional) forming reference resistance RbL. Therefore, the sense amplifier output SAO outputs a H level, outputs "1" data to the terminal DQ, notifies the external device (such as a memory tester) that the forming is passed (true), and completes the verification reading.

After that, at Step S49, it is confirmed that the determination at the immediately-prior Step 45 is made that the forming is passed (true), and the second forming is completed.

After the forming, as shown in FIG. 32, a voltage of a HR writing voltage pulse is set to +VH, a voltage of a LR writing voltage pulse is set to −VL, and a pulse width is set to Th=Tl. Therefore, normal "0" data writing (HR writing) and normal "1" data writing (LR writing) are allowed. At the same time, the additional forming flow (the second forming) shown in FIG. 18 is performed. As a result, memory cells having inadequate filament path can be prevented and LR current can be improved.

Figure 34A:
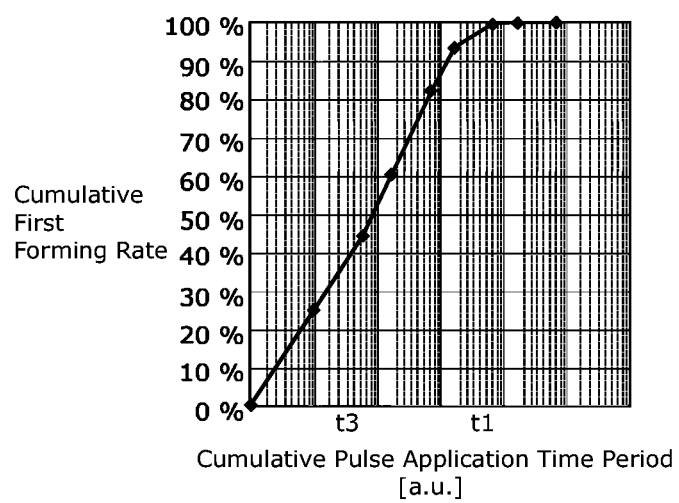
FIG. 34A is a graph plotting cumulative first forming rate distribution with respect to a cumulative pulse application time period regarding an array of the variable resistance nonvolatile memory device according to Embodiment 3 of the present disclosure.
Figure 34B:
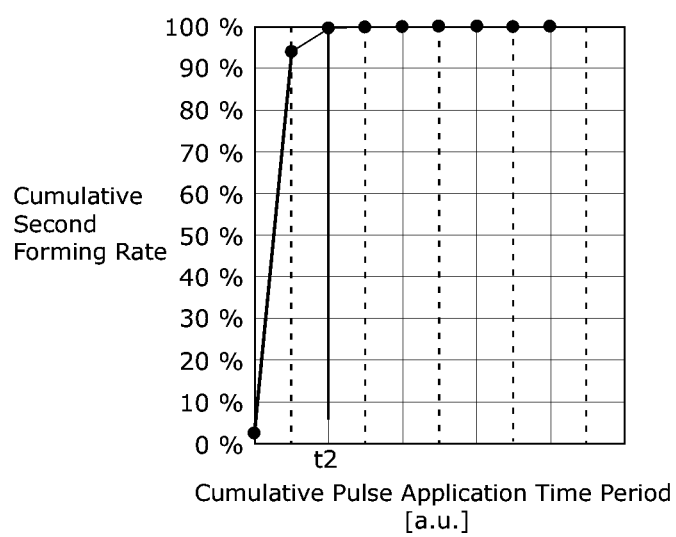
FIG. 34B is a graph plotting cumulative second forming rate distribution with respect to a cumulative pulse application time period regarding the array of the variable resistance nonvolatile memory device according to Embodiment 3 of the present disclosure.
Figure 35:
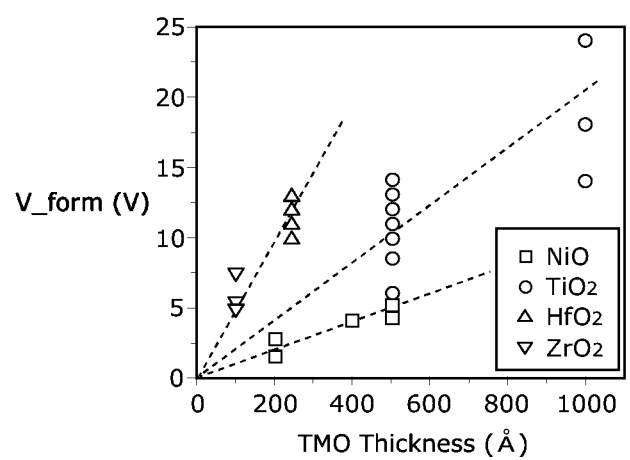
FIG. 35 is a characteristic graph plotting a transition metal oxide thickness dependency of a forming voltage for a conventional variable resistance nonvolatile memory.
Figure 36:
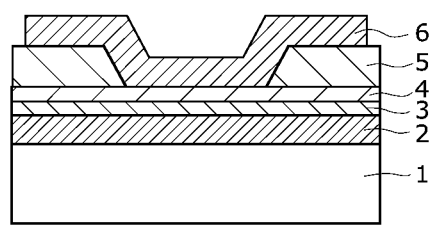
FIG. 36 is a cross-sectional view of a memory cell of a conventional variable resistance nonvolatile memory element.
Figure 37:
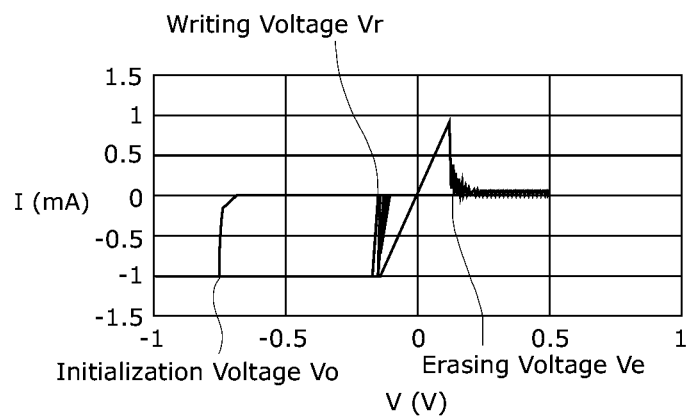
FIG. 37 is a graph plotting I-V characteristics from an initial state of a conventional variable resistance nonvolatile memory element.
Figure 38:
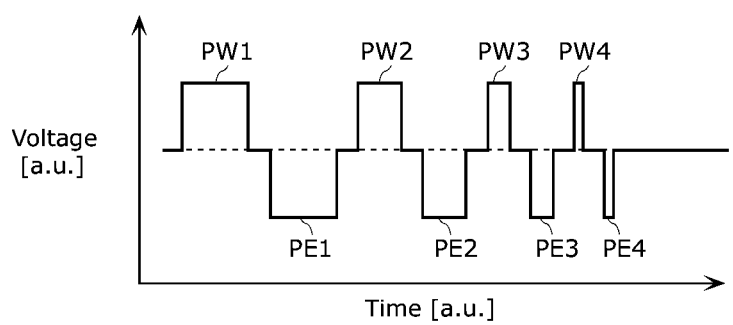
FIG. 38 is a graph plotting an initialized pulse waveform of a conventional variable resistance nonvolatile memory element.

FIGS. 34A and 34B show a relationship between a cumulative pulse application time period and a cumulative forming ratio in the case where, as described above, based on the forming flows shown in FIGS. 30 and 31, a filament path is generated in each of the memory cells in the 1T1R memory cell array shown in FIG. 26 and then the additional forming is performed to increase a filament path diameter. A horizontal axis in FIG. 34A indicates a cumulative pulse application time period of each of the memory cells in the case where a positive voltage pulse (voltage +Vfh) with a pulse width Tp(n) (where n is an integer from 1 to 13) is applied to the memory cell shown in FIG. 39. A vertical axis in FIG. 34A indicates a cumulative first forming ratio in the array. A horizontal axis in FIG. 34B indicates a cumulative pulse application time period of each of the memory cells in the case where a positive voltage pulse (voltage +Vfh) with a pulse width Tp2 (fixed) is applied to the memory cell shown in FIG. 39. A vertical axis in FIG. 34B indicates a cumulative second forming ratio in the array.

As shown in FIG. 34A, when the positive voltage pulse width is gradually increased in the first forming, the forming is progressed and a filament path is generated in almost every memory cell in the array, for example, by application of a positive voltage pulse of a voltage +Vfh for a cumulative pulse application time period t1 (=ΣTp(n), n=1 to 6).

Furthermore, as shown in FIG. 34B, in the second (additional) forming, when an additional positive voltage pulse with a pulse width Tp2 (fixed) for the first time is applied, approximately 94% of the memory cells in the array are passed. Furthermore, when an additional positive voltage pulse with the same pulse width for the second time is applied (for a cumulative pulse application time period t2), the additional forming is successful for almost all of the memory cells in the array (LR state cell current≥Ith2).

Therefore, in the conventional method, in the case where a pulse width of a forming positive voltage pulse is t3, as also seen in FIG. 34A, the filament path generation (the first forming) is not successful for all of the memory cells. However, by using the forming flow for performing forming to gradually increase the positive voltage pulse width as shown in FIG. 30, it is possible to perform the first forming (rough filament path generation) for all of the cells within a practical voltage range and without array area increase (here, a gate width W of the NMOS transistor is 0.44 μm).

Furthermore, if the second forming is added after the successful first forming, it is possible to increase an inadequate filament path diameter, and improve a cell current in a LR state.

Furthermore, application of a positive voltage pulse and application of a negative voltage pulse can be additionally performed only for memory cells for which forming is necessary. Therefore, it is possible to efficiently perform the forming for the memory cell array.

Although the forming method and the variable resistance nonvolatile memory device according to the present disclosure have been described with reference to the embodiments and variations as above, the present disclosure is not limited to these embodiments. Those skilled in the art will be readily appreciated that various modifications and desirable combinations of the steps and structural elements in the embodiments and variations are possible without materially departing from the novel teachings and advantages of the present disclosure. Accordingly, all such modifications and combinations of the forming method and the variable resistance nonvolatile memory device are intended to be included within the scope of the present disclosure.

It should also be noted that an NMOS transistor is used as the selection transistor in the 1T1R memory cell in the embodiments, but a PMOS transistor may also be used as the selection transistor. In this case, it is desirable that a source of the PMOS transistor is connected to a positive potential (in other words, a drain of the PMOS transistor is connected to the variable resistance element). As a result, it is possible to ensure higher current driving performance.

It should also be noted in the embodiments that the pulse width Tp(1) of the positive voltage pulse and the pulse width Tn of the negative voltage pulse for the first time in the forming are set to the same as the pulse width Th of the high resistance writing voltage pulse and the pulse width Tl of the low resistance voltage pulse in normal data writing, respectively, (for example, 50 ns), but the pulse widths Tn, Th, and Tl are not necessarily the same.

It should also be noted in the embodiments that in normal "0" and "1" data writing, the word line WL0 voltage (=+VL), the low resistance writing voltage pulse voltage VP (=−VL), and the high resistance writing voltage pulse voltage VP (=+VL) are set to have the same absolute value, but they are not necessarily the same.

It should also be noted in the embodiments that the forming is necessary once prior to the first data writing. Therefore, it is possible that a forming voltage is applied directly from the outside, without providing the forming power source 500.

It should also be noted in the embodiments that the present disclosure can be implemented not only as (a) the forming method of performing forming on a variable resistance nonvolatile memory element and (b) the variable resistance nonvolatile memory device, but also as a variable resistance nonvolatile memory element.

More specifically, the present disclosure can be implemented as the variable resistance nonvolatile memory element that has the same structure as that of the variable resistance element 100 shown in FIG. 39, with the following characteristics (1) to (5). (1) When a LR writing voltage pulse, which has a positive potential and a voltage equal to or higher than the first threshold voltage, is applied to the first electrode (the lower electrode 100a in the above-described embodiments) with reference to the second electrode (the upper electrode 100c in the above-described embodiments), the resistance state of the variable resistance element is changed to a low resistance state, and when a HR writing voltage pulse, which has a positive potential and a voltage equal to or higher than the second threshold voltage, is applied to the second electrode with reference to the first electrode, the resistance state of the variable resistance element is changed to a high resistance state. (2) In an initial state, the variable resistance element has non-linear current-voltage characteristics. (3) When a voltage pulse, which has a positive potential and a voltage equal to or higher than a predetermined voltage, is applied to the second electrode with reference to the first electrode in the initial state, or a voltage pulse, which has a positive potential and a voltage equal to or higher than a predetermined voltage, is applied to the first electrode with reference to the second electrode in the initial state, and at the same time, the voltage is kept being applied during a predetermined time period, a filament path is generated and a time required to complete the forming is determined in an exponential manner depending on a current flowing in the variable resistance nonvolatile memory element. (4) In the filament path generation (the first forming), as a cumulative pulse application time period of at least one applied voltage pulse is increased, a probability of forming success (completion) is increased. (5) In the additional forming (the second forming), a diameter of a filament path is increased, and thereby a cell current in a LR state is increased.

[Industrial Applicability]

The present disclosure, as (a) the forming method of performing forming on a variable resistance nonvolatile memory element and (b) the variable resistance nonvolatile memory device, can perform forming on the variable resistance nonvolatile memory device, which has memory cells each of which includes a variable resistance element with a variable resistance value varying depending on electrical signals and a switch element such as a transistor or a bi-directional diode, to expand an operation window within a practical voltage range and without increasing an array area. Therefore, the present disclosure is useful to implement a memory which is high-speed, reliable, and with a small area to be used in electronic devices such as mobile phones and notebook computers.

[Reference Signs List]
100 variable resistance element
100a lower electrode
100b variable resistance layer
100b-1 first variable resistance layer (first tantalum oxide layer)
100b-2 second variable resistance layer (second tantalum oxide layer)
100c upper electrode
101 lower electrode
102 upper electrode terminal
103 gate terminal
104 NMOS transistor
105 lower electrode terminal
106 variable resistance layer
110 fixed resistance
200 nonvolatile memory device
201 memory body
202 memory cell array
203 row selection circuit/driver
204 column selection circuit/driver
205 writing circuit
206 sense amplifier
207 data input/output circuit
208 address input circuit
209 control circuit
210 automatic forming circuit
211 automatic forming control circuit
212 memory cell
213 upper line
214 lower line
215 lower electrode
216 rectifying element
216-1 rectifying layer
217 internal electrode
218 variable resistance layer
218-1 first variable resistance layer
218-2 second variable resistance layer
219 upper electrode
220 variable resistance element
224 difference amplifier
300 PMOS transistor
301 switch transistor
302 switch
303 difference amplifier
304 pre-charged transistor
305 shift register circuit
306 AND circuit
400 nonvolatile memory device
401 memory body
402 memory cell array
403 column selection circuit/driver
404 sense amplifier
405 data input/output circuit
406 variable pulse width writing circuit
407 row driver
408 row selection circuit
409 address input circuit
410 control circuit
411 writing power source
412 low resistance (LR) writing power source
413 high resistance (HR) writing power source
418 current mirror circuit
419, 420 clamp transistor
421 reference circuit
422, 423, 427 selection transistor
424 difference amplifier
425, 426 transistor
500 forming power source
702 normal operation reference current generation circuit
703 forming reference current generation circuit
704 comparison circuit
7031 first forming reference current generation circuit
7032 second forming reference current generation circuit

The invention claimed is:

1. A forming method of performing forming on a variable resistance nonvolatile memory element, by applying a forming voltage pulse to memory cells in each of which a variable resistance nonvolatile memory element is connected in series with a switch element, so as to change a resistance state of the variable resistance nonvolatile memory element from an initial state to an operable state, the initial state being a state where no voltage has yet been applied after manufacturing, and the operable state being a state where a resistance value of the variable resistance nonvolatile memory element is smaller than a resistance value of the variable resistance nonvolatile memory element in the initial state and the resistance state is changeable between a high resistance state and a low resistance state according to a polarity of a voltage pulse which is applied in a normal operation, the variable resistance nonvolatile memory element including: a first electrode; a second electrode; and a transition metal oxide layer provided between the first electrode and the second electrode, the transition metal oxide layer including: a first oxygen-deficient transition metal oxide layer connected to the first electrode; and a second oxygen-deficient transition metal oxide layer in contact with the second electrode, the second oxygen-deficient transition metal oxide layer having an oxygen deficient degree smaller than an oxygen deficient degree of the first oxygen-deficient transition metal oxide layer, the variable resistance nonvolatile memory element having:

in the normal operation, characteristics by which the resistance state is changed to the low resistance state when a positive voltage having a first writing voltage pulse which is equal to or higher than a first threshold voltage is applied to the first electrode with reference to the second electrode, and the resistance state is changed to the high resistance state when a positive voltage having a second writing voltage pulse which is equal to or higher than a second threshold voltage is applied to the second electrode with reference to the first electrode;

in the initial state, characteristics by which when a first forming voltage having an amplitude equal to or greater than a first absolute value is applied between the first electrode and the second electrode so that a cumulative time period during which the first forming voltage is applied exceeds a first predetermined time period, first forming occurs to change the resistance state of the variable resistance nonvolatile memory element from the initial state to a first operable state where the resistance state is changeable between the high resistance state and the low resistance state according to application of a normal operation voltage, and the first predetermined time period decreases as a current flowing in the variable resistance nonvolatile memory element increases in the application of the first forming voltage; and in the first operable state after the first forming, characteristics by which when a second forming voltage is applied between the first electrode and the second electrode so that a cumulative time period during which the second forming voltage is applied exceeds a second predetermined time period, second forming occurs to change the resistance state of the variable resistance nonvolatile memory element from the first operable state to a second operable state where the resistance state is changeable to a low resistance state having a resistance value lower than a resistance value of the low resistance state in the first operable state, and said forming method comprising:

applying the first forming voltage between the first electrode and the second electrode in the initial state, until the first forming occurs; and applying the second forming voltage between the first electrode and the second electrode in the first operable state after the first forming, until the second forming occurs.

2. The forming method according to claim 1, wherein said applying of the first forming voltage includes:

applying a first voltage having a first voltage pulse as the first forming voltage between the first electrode and the second electrode so as to change the resistance state of the variable resistance nonvolatile memory element from the initial state to the first operable state, the first voltage pulse having an amplitude equal to or greater than the first absolute value and having a first pulse width; and determining whether or not the first forming successfully occurs by said applying of the first voltage having the first voltage pulse, wherein said applying of the first voltage is further performed, when it is determined in said determining that the first forming does not successfully occur, and in said further applying of the first voltage, the first voltage applied between the first electrode and the second electrode has a new first voltage pulse, the new first voltage pulse having an amplitude equal to or greater than the first absolute value, and the new first voltage pulse having a pulse width longer than a pulse width of the first voltage pulse in said applying of the first voltage which is performed immediately prior to said further applying of the first voltage, and said applying of the second forming voltage includes:

applying a second voltage having a second voltage pulse as the second forming voltage between the first electrode and the second electrode so as to change the resistance state of the variable resistance nonvolatile memory element from the first operable state achieved by the first forming to the second operable state; and determining whether or not the second forming successfully occurs by said applying of the second voltage having the second voltage pulse, wherein said applying of the second voltage is further performed, when it is determined in said determining that the second forming does not successfully occur.

3. The forming method according to claim 2, wherein, in said determining whether or not the first forming successfully occurs, it is determined whether or not the first forming successfully occurs, by (i) applying a positive voltage having a third writing voltage pulse which is equal to or higher than the first threshold voltage to the first electrode with reference to the second electrode, and (ii) determining, after said applying of the positive voltage having the third writing voltage pulse, whether or not the variable resistance nonvolatile memory element is in the low resistance state having the resistance value lower than the resistance value in the initial state.

4. The forming method according to claim 2, wherein, in said determining whether or not the second forming successfully occurs, it is determined whether or not the second forming successfully occurs, by (i) applying a positive voltage having a fourth writing voltage pulse which is equal to or higher than the first threshold voltage to the first electrode with reference to the second electrode and (ii) determining, after said applying of the positive voltage having the fourth writing voltage pulse, whether or not the variable resistance nonvolatile memory element is in the low resistance state to which the resistance state of the variable resistance nonvolatile memory element is changeable only from the second operable state.

5. The forming method according to claim 2, wherein said determining whether or not the first forming successfully occurs and said applying of the first voltage having the first voltage pulse are repeated, until it is determined in said determining that the first forming successfully occurs.

6. The forming method according to claim 2, wherein said determining whether or not the second forming successfully occurs and said applying of the second voltage having the second voltage pulse are repeated, until it is determined in said determining that the second forming successfully occurs.

7. The forming method according to claim 4, wherein a pulse width of one of the third writing voltage pulse and the fourth writing voltage pulse is equal to the pulse width of the first writing voltage pulse.

8. The forming method according to claim 1, wherein a material of the first electrode is different from a material of the second electrode, and the second electrode comprises one of: iridium (Ir); and an alloy of Ir and platinum (Pt).

9. The forming method according to claim 1, wherein the first oxygen-deficient transition metal oxide layer comprises a composition expressed by $TaO_x$, and the second oxygen-deficient transition metal oxide layer comprises a composition expressed by $TaO_y$, where x<y.

10. A variable resistance nonvolatile memory device including memory cells in each of which a variable resistance nonvolatile memory element is connected in series to a switch element, said variable resistance nonvolatile memory element including: a first electrode; a second electrode; and a transition metal oxide layer provided between said first electrode and said second electrode, said transition metal oxide layer including: a first oxygen-deficient transition metal oxide layer connected to said first electrode; and a second oxygen-deficient transition metal oxide layer in contact with said second electrode, said second oxygen-deficient transition metal oxide layer having a oxygen deficient degree smaller than an oxygen deficient degree of said first oxygen-deficient transition metal oxide layer, said variable resistance nonvolatile memory element having:

characteristics by which the resistance state is changed to a low resistance state when a positive voltage having a first writing voltage pulse which is equal to or higher than a first threshold voltage is applied to said first electrode with reference to said second electrode, and the resistance state is changed to a high resistance state when a positive voltage having a second writing voltage pulse which is equal to or higher than a second threshold voltage is applied to said second electrode with reference to said first electrode;

in the initial state, characteristics by which when a first forming voltage having an amplitude equal to or greater than a first absolute value is applied between said first electrode and said second electrode so that a cumulative time period during which the first forming voltage is applied exceeds a first predetermined time period, first forming occurs to change the resistance state of said variable resistance nonvolatile memory element from the initial state to a first operable state where the resistance state is changeable between the high resistance state and the low resistance state according to application of a normal operation voltage, and the first predetermined time period decreases as a current flowing in said variable resistance nonvolatile memory element increases in the application of the first forming voltage; and in the first operable state after the first forming, characteristics by which when a second forming voltage is applied between said first electrode and said second electrode so that a cumulative time period during which the second forming voltage is applied exceeds a second predetermined time period, second forming occurs to change the resistance state of said variable resistance nonvolatile memory element from the first operable state to a second operable state where the resistance state is changeable to a low resistance state having a resistance value lower than a resistance value of the low resistance state in the first operable state, said variable resistance nonvolatile memory device comprising:

a memory cell array including said memory cells in each of which said variable resistance nonvolatile memory element is connected in series to said switch element;

a selection unit configured to select at least one memory cell from said memory cell array;

a sense amplifier which determines whether said variable resistance nonvolatile memory element included in the at least one memory cell selected by said selection unit is in the high resistance state or in the low resistance state;

an automatic forming unit including: a forming voltage pulse generation unit configured to generate a forming voltage having a forming voltage pulse so as to be applied to said variable resistance nonvolatile memory element included in the at least one memory cell selected by said selection unit, the forming voltage pulse having an amplitude equal to or higher than the first absolute value; a forming success detection unit configured to detect whether or not said variable resistance nonvolatile memory element is in a resistance state that is a state achieved by success of the first forming to have a resistance value lower than a resistance value in the initial state;

and a forming success signal generation unit configured to eventually generate a forming success signal when a predetermined time period has passed since the detection of the success of the first forming by said forming success detection unit; and an automatic forming control unit configured to (i) automatically and sequentially generate address signals, and (ii) control, according to the address signals, said automatic forming unit to cause the first forming and the second forming in said variable resistance nonvolatile memory element included in the at least one memory cell selected by said selection unit;

wherein said automatic forming unit is configured to (i) apply the forming voltage of the forming voltage pulse as the first forming pulse between said first electrode and said second electrode to cause one pulse application to occur the first forming and the second forming in said variable resistance nonvolatile memory element included in the at least one memory cell selected by said selection unit, the forming voltage pulse having an amplitude greater than an amplitude of a predetermined voltage, (ii) when said forming success detection unit detects that said variable resistance nonvolatile memory element is changed to the resistance state achieved by the success of the first forming, (ii-1) generate the forming success signal after the predetermined time period has passed since the detection, while applying the forming voltage having the forming voltage pulse as the second forming pulse, (ii-2) stop the application of the forming voltage having the forming voltage pulse, and (ii-3) terminate the forming on the at least one memory cell selected by said selection unit.

11. The variable resistance nonvolatile memory device according to claim 10, wherein in the application of the forming voltage having the forming voltage pulse, a flow-able amount of a current is limited not to exceed a predetermined current amount.

12. The variable resistance nonvolatile memory device according to claim 10, wherein said forming success signal generation unit includes: a shift register circuit having n stages, where n is an integer of 2 or more; and an AND circuit which receives all outputs of said shift register circuit at the n stages.

13. A variable resistance nonvolatile memory device including memory cells in each of which a variable resistance nonvolatile memory element is connected in series to a switch element, said variable resistance nonvolatile memory element including: a first electrode; a second electrode; and a transition metal oxide layer provided between said first electrode and said second electrode, said transition metal oxide layer including: a first oxygen-deficient transition metal oxide layer connected to said first electrode; and a second oxygen-deficient transition metal oxide layer in contact with said second electrode, said second oxygen-deficient transition metal oxide layer having a oxygen deficient degree smaller than an oxygen deficient degree of said first oxygen-deficient transition metal oxide layer, said variable resistance nonvolatile memory element having:

characteristics by which the resistance state is changed to a low resistance state when a positive voltage having a first writing voltage pulse which is equal to or higher than a first threshold voltage is applied to said first electrode with reference to said second electrode, and the resistance state is changed to a high resistance state when a positive voltage having a second writing voltage pulse which is equal to or higher than a second threshold voltage is applied to said second electrode with reference to said first electrode;

in the initial state, characteristics by which when a first forming voltage having an amplitude equal to or greater than a first absolute value is applied between said first electrode and said second electrode so that a cumulative time period during which the first forming voltage is applied exceeds a first predetermined time period, first forming occurs to change the resistance state of said variable resistance nonvolatile memory element from the initial state to a first operable state where the resistance state is changeable between the high resistance state and the resistance state according to application of a normal operation voltage, and the first predetermined time period decreases as a current flowing in said variable resistance nonvolatile memory element increases in the application of the first forming voltage; and in the first operable state after the first forming, characteristics by which when a second forming voltage is applied between said first electrode and said second electrode so that a cumulative time period during which the second forming voltage is applied exceeds a second predetermined time period, second forming occurs to change the resistance state of said variable resistance nonvolatile memory element from the first operable state to a second operable state where the resistance state is changeable to a low resistance state having a resistance value lower than a resistance value of the low resistance state in the first operable state, and said variable resistance nonvolatile memory device comprising:

a memory cell array including said memory cells in each of which said variable resistance nonvolatile memory element is connected in series to said switch element;

a selection unit configured to select at least one memory cell from said memory cell array;

a forming power source which generates a forming voltage to cause forming in said variable resistance nonvolatile memory element included in the at least one memory cell selected by said selection unit;

a writing power source which generates the positive voltage having the first writing voltage pulse and the positive voltage having the second writing voltage pulse to be applied to said variable resistance nonvolatile memory element included in the at least one memory cell selected by said selection unit;

a variable-pulse-width writing voltage pulse generation unit configured to generate a variable-pulse-width writing voltage pulse to change the resistance state of said variable resistance nonvolatile memory element included in the at least one memory cell selected by said selection unit to a desired state, when one of the forming and writing is to be performed on the variable resistance nonvolatile memory element, the variable-pulse-width writing voltage pulse having a variable pulse width;

a first forming determination unit configured to determine whether or not said variable resistance nonvolatile memory element included in the at least one memory cell selected by said selection unit is in the resistance state achieved by success of the first forming to have a resistance value lower than a resistance value in the initial state; a second forming determination unit configured to determine whether or not said variable resistance nonvolatile memory element included in the at least one memory cell selected by said selection unit is in the low resistance state changeable only in the second operable state; and a sense amplifier which determines whether the variable resistance nonvolatile memory element included in the at least one memory cell selected by said selection unit is in a high resistance state or in a low resistance state, wherein said variable-pulse-width writing voltage pulse generation unit configured to:

(i-1) apply a first voltage having a first voltage pulse between said first electrode and said second electrode to cause the first forming in said variable resistance nonvolatile memory element, the first voltage pulse having an amplitude equal to or greater than the first absolute value and having a first pulse width, and (i-2) when said first forming determination unit determines that said variable resistance nonvolatile memory element after the application of the first voltage having the first voltage pulse is not in the resistance state achieved by success of the first forming, apply a second voltage having a second voltage pulse between said first electrode and said second electrode, the second voltage pulse having an amplitude equal to or greater than the first absolute value and having a pulse width longer than the first pulse width; and (ii-1) apply an additional voltage having an additional voltage pulse with a third voltage width between the first electrode and the second electrode to cause the second forming in said variable resistance nonvolatile memory element, and (i-2) when said second forming determination unit determines that said variable resistance nonvolatile memory element is not in the low resistance state changeable only in the second operable state after the application of the additional voltage having the additional voltage pulse, further apply the additional voltage having the additional voltage pulse with the third pulse width between said first electrode and said second electrode.

14. The variable resistance nonvolatile memory device according to claim 13, wherein said second forming determination unit is configured to determine whether or not said variable resistance nonvolatile memory element is in the low resistance state changeable only in the second operable state, after a positive voltage having a third writing voltage pulse equal to or higher than the first threshold voltage is applied to said first electrode with reference to said second electrode for the at least one memory cell.

15. The variable resistance nonvolatile memory device according to claim 13, wherein the determination by said first forming determination unit and the application of the second voltage having the second voltage pulse by said variable-pulse-width writing voltage pulse generation unit are repeated until said first forming determination unit determines that said variable resistance nonvolatile memory element is in a resistance state lower than an initial low resistance state in the initial state, and said variable-pulse-width writing voltage pulse generation unit is configured to generate a voltage having a first forming voltage pulse in the application of the second voltage having the second voltage pulse, the first forming voltage pulse having a pulse width gradually increased from a short pulse width.

16. The variable resistance nonvolatile memory device according to claim 13, wherein the determination by said second forming determination unit and the application of the additional voltage having the additional voltage pulse by said variable-pulse-width writing voltage pulse generation unit are repeated until said second forming determination unit determines that said variable resistance nonvolatile memory element is in the low resistance state changeable only in the second operable state, and said variable-pulse-width writing voltage pulse generation unit configured to generate a voltage having a second forming voltage pulse in the application of the additional voltage having the additional voltage pulse, the second forming voltage pulse having a predetermined fixed pulse width.

17. The variable resistance nonvolatile memory device according to claim 14, wherein a pulse width of the third writing voltage pulse is equal to a pulse width for a normal writing operation.

18. The variable resistance nonvolatile memory device according to claim 10, wherein a material of said first electrode is different from a material of said second electrode, and said second electrode comprises one of: iridium (Ir); and an alloy of Ir and platinum (Pt).

19. The variable resistance nonvolatile memory device according to claim 10, wherein said first oxygen-deficient transition metal oxide layer comprises a composition expressed by $TaO_x$, and said second oxygen-deficient transition metal oxide layer comprises a composition expressed by $TaO_y$, where x<y.

20. The variable resistance nonvolatile memory device according to claim 13, wherein a material of said first electrode is different from a material of said second electrode, and said second electrode comprises one of: iridium (Ir); and an alloy of Ir and platinum (Pt).

21. The variable resistance nonvolatile memory device according to claim 13, wherein said first oxygen-deficient transition metal oxide layer comprises a composition expressed by $TaO_x$, and said second oxygen-deficient transition metal oxide layer comprises a composition expressed by $TaO_y$, where x<y.

* * * * *